(12) United States Patent
Yamazaki et al.

(10) Patent No.: US 12,040,009 B2
(45) Date of Patent: Jul. 16, 2024

(54) SENSE AMPLIFIER, SEMICONDUCTOR DEVICE, OPERATION METHOD THEREOF, AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Hajime Kimura, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/485,652

(22) Filed: Sep. 27, 2021

(65) Prior Publication Data

US 2022/0084580 A1    Mar. 17, 2022

Related U.S. Application Data

(62) Division of application No. 16/636,366, filed as application No. PCT/IB2018/055988 on Aug. 9, 2018, now Pat. No. 11,164,621.

(30) Foreign Application Priority Data

Aug. 24, 2017    (JP) ................................. 2017-161320

(51) Int. Cl.
*G11C 11/00*        (2006.01)
*G11C 11/4091*     (2006.01)
(Continued)

(52) U.S. Cl.
CPC ...... *G11C 11/4091* (2013.01); *G11C 11/4094* (2013.01); *H01L 27/1225* (2013.01); *H01L 27/1255* (2013.01); *H10B 12/30* (2023.02)

(58) Field of Classification Search
CPC . G11C 11/4091; G11C 7/065; G11C 11/4094; H01L 27/1225; H01L 28/87; H01L 28/91; H01L 27/1255; H10B 12/30
See application file for complete search history.

(56) References Cited

U.S. PATENT DOCUMENTS

| 4,162,539 A | 7/1979 | Hebenstreit |
| 5,300,839 A | 4/1994 | Kawahara et al. |

(Continued)

FOREIGN PATENT DOCUMENTS

| EP | 2887395 A | 6/2015 |
| JP | 54-025641 A | 2/1979 |

(Continued)

OTHER PUBLICATIONS

International Search Report (Application No. PCT/IB2018/055988) dated Nov. 20, 2018.

(Continued)

*Primary Examiner* — Uyen Smet
(74) *Attorney, Agent, or Firm* — Fish & Richardson P.C.

(57) ABSTRACT

A sense amplifier and a semiconductor device which are less likely to be influenced by a variation in transistor characteristics and their operation methods are provided. An amplifier circuit in a sense amplifier includes a first circuit and a second circuit, each including an inverter, a first transistor, a second transistor, and a capacitor. A first terminal and a second terminal of the capacitor are electrically connected to a first bit line and an input terminal of the inverter, respectively. The first transistor and the second transistor function as a switch that switches conduction and non-conduction between the input terminal and an output terminal of the inverter, and a switch that switches conduction and non-conduction between the output terminal of the inverter and the second bit line, respectively. The first circuit and the second circuit are initialized by a potential obtained when (Continued)

conduction is established between the input terminal and the output terminal of the inverter.

7 Claims, 27 Drawing Sheets

(51) Int. Cl.
  *G11C 11/4094* (2006.01)
  *H01L 27/12* (2006.01)
  *H10B 12/00* (2023.01)

(56) References Cited

U.S. PATENT DOCUMENTS

| | | | |
|---|---|---|---|
| 5,949,270 | A | 9/1999 | Saito |
| 7,142,030 | B2 | 11/2006 | Osame et al. |
| 7,301,382 | B2 | 11/2007 | Osame et al. |
| 7,633,809 | B2 | 12/2009 | Kajiyama |
| 8,004,334 | B2 | 8/2011 | Osame et al. |
| 8,212,600 | B2 | 7/2012 | Osame et al. |
| 8,233,343 | B2 | 7/2012 | Moon |
| 8,410,838 | B2 | 4/2013 | Kato et al. |
| 8,466,886 | B2 | 6/2013 | Mizuhashi et al. |
| 8,508,967 | B2 | 8/2013 | Yamazaki et al. |
| 8,710,887 | B2 | 4/2014 | Osame et al. |
| 8,787,102 | B2 | 7/2014 | Ishizu |
| 8,860,485 | B2 | 10/2014 | Kato et al. |
| 8,902,691 | B2 | 12/2014 | Narui et al. |
| 9,202,531 | B2 | 12/2015 | Seo |
| 9,202,814 | B2 | 12/2015 | Ishizu |
| 9,350,334 | B2 | 5/2016 | Kato et al. |
| 9,355,734 | B2 | 5/2016 | Tran et al. |
| 9,478,276 | B2 | 10/2016 | Onuki |
| 9,514,816 | B1 | 12/2016 | Ashokkumar et al. |
| 9,865,325 | B2 | 1/2018 | Onuki |
| 10,505,520 | B2 | 12/2019 | Kato et al. |
| 2006/0044903 | A1 | 3/2006 | Forbes |
| 2006/0286737 | A1 | 12/2006 | Levy et al. |
| 2007/0121377 | A1 | 5/2007 | Kajiyama |
| 2010/0329056 | A1 | 12/2010 | Moon |
| 2012/0187475 | A1 | 7/2012 | Yamazaki et al. |
| 2014/0119093 | A1 | 5/2014 | Singh et al. |
| 2014/0133251 | A1 | 5/2014 | Takahashi et al. |
| 2015/0155015 | A1 | 6/2015 | Park |
| 2015/0294710 | A1* | 10/2015 | Onuki ............... G11C 11/4091 365/149 |
| 2016/0012868 | A1* | 1/2016 | Moon ................ G11C 7/065 365/189.11 |
| 2016/0211266 | A1 | 7/2016 | Kurokawa |
| 2016/0336059 | A1 | 11/2016 | Matsuzaki |
| 2017/0154909 | A1 | 6/2017 | Ishizu |
| 2020/0075065 | A1 | 3/2020 | Jeong et al. |

FOREIGN PATENT DOCUMENTS

| | | |
|---|---|---|
| JP | 05-047179 A | 2/1993 |
| JP | 05-314771 A | 11/1993 |
| JP | 10-003789 A | 1/1998 |
| JP | 2007-141399 A | 6/2007 |
| JP | 2010-097549 A | 4/2010 |
| JP | 2011-014222 A | 1/2011 |
| JP | 2012-256820 A | 12/2012 |
| JP | 2016-019091 A | 2/2016 |
| JP | 2017-511949 | 4/2017 |
| JP | 2018-195794 A | 12/2018 |
| TW | 201618109 | 5/2016 |
| TW | 201709204 | 3/2017 |
| WO | WO-2004/051852 | 6/2004 |
| WO | WO-2011/062075 | 5/2011 |
| WO | WO-2012/029638 | 3/2012 |
| WO | WO-2015/134178 | 9/2015 |
| WO | WO-2015/155635 | 10/2015 |

OTHER PUBLICATIONS

Written Opinion (Application No. PCT/IB2018/055988) dated Nov. 20, 2018.
Onuki.T et al., "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.
Cha.S et al., "DRAM Technology—History & Challenges", 2011 IEDM Short Course : Advanced Memory Technology, Dec. 4, 2011, pp. 1-73.
Lim.K et al., "A 1.2V 23nm 6F2 4Gb DDR3 SDRAM with Local-Bitline Sense Amplifier, Hybrid LIO Sense Amplifier and Dummy-Less Array Architecture", ISSCC 2012 (Digest of Technical Papers. IEEE International Solid-State Circuits Conference), Feb. 19, 2012, pp. 42-44.
Taiwanese Office Action (Application No. 107129169) dated Jun. 28, 2022.
Chinese Office Action (Application No. 201880051234.5) dated Jan. 19, 2023.
Taiwanese Office Action (Application No. 112111805) dated Nov. 16, 2023.

* cited by examiner

239

SENSE AMPLIFIER, SEMICONDUCTOR DEVICE, OPERATION METHOD THEREOF, AND ELECTRONIC DEVICE

CROSS REFERENCE TO RELATED APPLICATIONS

This application is a divisional of U.S. application Ser. No. 16/636,366, filed Feb. 4, 2020, now allowed, which is a U.S. National Phase Application under 35 U.S.C. § 371 of International Application PCT/IB2018/055988, filed on Aug. 9, 2018, which claims the benefit of a foreign priority application filed in Japan on Aug. 24, 2017, as Application No. 2017-161320, all of which are incorporated by reference.

TECHNICAL FIELD

One embodiment of the present invention relates to a sense amplifier or a semiconductor device. In particular, one embodiment of the present invention relates to a sense amplifier used when a memory device reads data from a memory cell.

In this specification and the like, a semiconductor device generally means a device that functions by utilizing the semiconductor characteristics. A memory device, a display device, a light-emitting device, an electro-optical device, a power storage device, a semiconductor circuit, and an electronic device include a semiconductor device in some cases.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

BACKGROUND ART

A dynamic random access memory (DRAM) is widely known as one of the typical memories. The DRAM has no limitation on the number of writing times in principle, can perform writing and reading at a high speed, and has capability for high integration owing to the small number of elements in a cell. For such features, the DRAM is incorporated in a number of electronic devices as a high-capacity memory.

A general memory cell in the DRAM (hereinafter also referred to as DRAM cell) is composed of one transistor (1T) and one capacitor (1C), and electrically connected to a bit line and a word line. A gate of the transistor is electrically connected to the word line and the transistor functions as a switch that switches conduction and non-conduction between the bit line and the capacitor. The DRAM stores data by holding charges in the capacitor, and the data stored in the DRAM cell is written and read through the bit line and the transistor.

When the data stored in the DRAM cell is read, the transistor is turned on so that conduction between the bit line and the capacitor is established. Although the potential of the bit line changes in accordance with the charges held in the capacitor, the potential change is slight because of the capacitance of the bit line. A sense amplifier is electrically connected to the bit line and amplifies the potential of the bit line that slightly changes, and accordingly the data stored in the DRAM cell can be read.

A DRAM in which a transistor including a metal oxide in its channel formation region (also referred to as "oxide semiconductor transistor" or "OS transistor") is used in the DRAM cell has been proposed (e.g., Patent Documents 1 and 2 and Non-Patent Document 1). The OS transistor has an extremely low leakage current in an off state (off-state current), and thus enables a memory to have low power consumption and long intervals between refresh operations. In this specification and the like, the DRAM in which the OS transistor is used in the DRAM cell is referred to as "oxide semiconductor DRAM" or "dynamic oxide semiconductor RAM (DOSRAM, registered trademark)".

Furthermore, in recent years, with reduction in the size and weight of an electronic device, there is an increasing demand for a semiconductor device in which a transistor, a capacitor, or the like are integrated with high density by miniaturizing them or forming them in different layers.

REFERENCES

Patent Documents

[Patent Document 1] Japanese Published Patent Application No. 2012-256820
[Patent Document 2] International Publication No. WO2015/155635

Non-Patent Document

[Non-Patent Document 1] T. Onuki, et al.,"DRAM with Storage Capacitance of 3.9 fF Using CAAC-OS Transistor with L of 60 nm and Having More Than 1-h Retention Characteristics," Ext. Abstr. SSDM, 2014, pp. 430-431.

DISCLOSURE OF INVENTION

In a memory device such as a DRAM or a DOSRAM, a sense amplifier used for reading data stored in the memory cell has a function of amplifying the potential of the bit line that slightly changes in accordance with the charges held in the capacitor of the memory cell. Since a variation in characteristics of the transistor in the sense amplifier influences the accuracy of the sense amplifier, when the variation in characteristics of the transistor is large, the slight change in the potential of the bit line cannot be detected, which has been a problem.

An object of one embodiment of the present invention is to provide a sense amplifier that is less likely to be influenced by a variation in characteristics of a transistor. Another object of one embodiment of the present invention is to provide a semiconductor device that is less likely to be influenced by a variation in characteristics of a transistor. Another object of one embodiment of the present invention is to provide an operation method of a sense amplifier that is less likely to be influenced by a variation in characteristics of a transistor. Another object of one embodiment of the present invention is to provide an operation method of a semiconductor device that is less likely to be influenced by a variation in characteristics of a transistor. Another object of one embodiment of the present invention is to provide a novel semiconductor device or operation method of a semiconductor device.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

One embodiment of the present invention is a semiconductor device including an inverter, a first transistor, a second transistor, a capacitor, an input portion, and an output portion. The semiconductor device is electrically connected to a first control line and a second control line. A first terminal of the capacitor is electrically connected to the input portion. A second terminal of the capacitor is electrically connected to an input terminal of the inverter. The first transistor functions as a switch that switches conduction and non-conduction between the input terminal and an output terminal of the inverter. The second transistor functions as a switch that switches conduction and non-conduction between the output terminal of the inverter and the output portion. A gate of the first transistor is electrically connected to the first control line. A gate of the second transistor is electrically connected to the second control line.

Another embodiment of the present invention is a semiconductor device including an inverter, a first transistor, a second transistor, an input portion, and an output portion. The semiconductor device is electrically connected to a first control line and a second control line. An input terminal of the inverter is electrically connected to the input portion. The first transistor functions as a switch that switches conduction and non-conduction between the input terminal and an output terminal of the inverter. The second transistor functions as a switch that switches conduction and non-conduction between the output terminal of the inverter and the output portion. A gate of the first transistor is electrically connected to the first control line. A gate of the second transistor is electrically connected to the second control line.

In the above embodiment, the semiconductor device has a function of performing an initializing operation. The initializing operation includes establishing conduction between the input terminal and the output terminal of the inverter using the first transistor.

In the above embodiment, the first transistor includes a metal oxide in its channel formation region.

Another embodiment of the present invention is a sense amplifier including an amplifier circuit and a precharge circuit. The sense amplifier is electrically connected to a first wiring and a second wiring. The precharge circuit has a function of setting potentials of the first wiring and the second wiring to a first potential. The amplifier circuit includes a first circuit and a second circuit. The first circuit includes a first inverter, a first transistor, a second transistor, and a first capacitor. The second circuit includes a second inverter, a third transistor, a fourth transistor, and a second capacitor. A first terminal of the first capacitor is electrically connected to the first wiring. A second terminal of the first capacitor is electrically connected to an input terminal of the first inverter. The first transistor functions as a switch that switches conduction and non-conduction between the input terminal and an output terminal of the first inverter. The second transistor functions as a switch that switches conduction and non-conduction between the output terminal of the first inverter and the second wiring. A first terminal of the second capacitor is electrically connected to the second wiring. A second terminal of the second capacitor is electrically connected to an input terminal of the second inverter. The third transistor functions as a switch that switches conduction and non-conduction between the input terminal and an output terminal of the second inverter. The fourth transistor functions as a switch that switches conduction and non-conduction between the output terminal of the second inverter and the first wiring.

Another embodiment of the present invention is a sense amplifier including an amplifier circuit and a precharge circuit. The sense amplifier is electrically connected to a first wiring and a second wiring. The precharge circuit has a function of setting potentials of the first wiring and the second wiring to a first potential. The amplifier circuit includes a first circuit and a second circuit. The first circuit includes a first inverter, a first transistor, a second transistor, a first capacitor, and a first conductor. The second circuit includes a second inverter, a third transistor, a fourth transistor, a second capacitor, and a second conductor. A first terminal of the first capacitor is electrically connected to the first wiring. The first inverter includes a fifth transistor and a sixth transistor. A second terminal of the first capacitor is electrically connected to a gate of one or both of the fifth transistor and the sixth transistor through the first conductor. The first conductor functions as an electrode of the first capacitor. The first transistor functions as a switch that switches conduction and non-conduction between the input terminal and an output terminal of the first inverter. The second transistor functions as a switch that switches conduction and non-conduction between the output terminal of the first inverter and the second wiring. A first terminal of the second capacitor is electrically connected to the second wiring. The second inverter includes a seventh transistor and an eighth transistor. A second terminal of the second capacitor is electrically connected to a gate of one or both of the seventh transistor and the eighth transistor through the second conductor. The second conductor functions as an electrode of the second capacitor. The third transistor functions as a switch that switches conduction and non-conduction between the input terminal and an output terminal of the second inverter. The fourth transistor functions as a switch that switches conduction and non-conduction n between the output terminal of the second inverter and the first wiring.

Another embodiment of the present invention is a sense amplifier including a first circuit and a second circuit. The sense amplifier is electrically connected to a first wiring and a second wiring. The first circuit includes a first inverter, a first transistor, and a second transistor. The second circuit includes a second inverter, a third transistor, and a fourth transistor. An input terminal of the first inverter is electrically connected to the first wiring. The first transistor functions as a switch that switches conduction and non-conduction between the input terminal and an output terminal of the first inverter. The second transistor functions as a switch that switches conduction and non-conduction between the output terminal of the first inverter and the second wiring. An input terminal of the second inverter is electrically connected to the second wiring. The third transistor functions as a switch that switches conduction and non-conduction between the input terminal and an output terminal of the second inverter. The fourth transistor functions as a switch that switches conduction and non-conduction between the output terminal of the second inverter and the first wiring.

In the above embodiment, the sense amplifier has a function of performing an initializing operation. The initializing operation includes establishing conduction between the input terminal and the output terminal of the first inverter using the first transistor and establishing conduction between the input terminal and the output terminal of the second inverter using the third transistor.

In the above embodiment, the sense amplifier has a function of performing an initializing operation including a first operation to a fourth operation. The first operation is establishing conduction between the input terminal and the output terminal of the first inverter using the first transistor. The second operation is establishing conduction between the input terminal and the output terminal of the second inverter using the third transistor. The third operation is establishing conduction between the output terminal of the first inverter and the second wiring using the second transistor. The fourth operation is establishing conduction between the output terminal of the second inverter and the first wiring using the fourth transistor.

Another embodiment of the present invention is a sense amplifier including a first circuit and a second circuit. The sense amplifier is electrically connected to a first wiring and a second wiring. The first circuit includes a first inverter, a first transistor, a second inverter, and a first capacitor. The second circuit includes a second inverter, a third transistor, a fourth transistor, and a second capacitor. A first terminal of the first capacitor is electrically connected to the first wiring. A second terminal of the first capacitor is electrically connected to an input terminal of the first inverter. The first transistor functions as a switch that switches conduction and non-conduction between the input terminal and an output terminal of the first inverter. The second transistor functions as a switch that switches conduction and non-conduction between the output terminal of the first inverter and the second wiring. A first terminal of the second capacitor is electrically connected to the second wiring. A second terminal of the second capacitor is electrically connected to an input terminal of the second inverter. The third transistor functions as a switch that switches conduction and non-conduction between the input terminal and an output terminal of the second inverter. The fourth transistor functions as a switch that switches conduction and non-conduction between the output terminal of the second inverter and the first wiring. The sense amplifier is has a function of performing an initializing operation including a first operation to a fourth operation. The first operation is establishing conduction between the input terminal and the output terminal of the first inverter using the first transistor. The second operation is establishing conduction between the input terminal and the output terminal of the second inverter using the third transistor. The third operation is establishing conduction between the output terminal of the first inverter and the second wiring using the second transistor. The fourth operation is establishing conduction between the output terminal of the second inverter and the first wiring using the fourth transistor.

In the above embodiment, the first transistor and the third transistor each include a metal oxide in its channel formation region.

In the above embodiment, the first transistor, the third transistor, one of the fifth transistor and the sixth transistor, and one of the seventh transistor and the eighth transistor each include a metal oxide in its channel formation region.

According to one embodiment of the present invention, a sense amplifier that is less likely to be influenced by a variation in characteristics of a transistor can be provided. According to another embodiment of the present invention, a semiconductor device that is less likely to be influenced by a variation in characteristics of a transistor can be provided. According to another embodiment of the present invention, an operation method of a sense amplifier that is less likely to be influenced by a variation in characteristics of a transistor can be provided. According to another embodiment of the present invention, an operation method of a semiconductor device that is less likely to be influenced by a variation in characteristics of a transistor can be provided.

Note that the effects of one embodiment of the present invention are not limited to the above effects. In addition, the effects listed above do not preclude the existence of other effects. The other effects are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BEST MODE FOR CARRYING OUT THE INVENTION

Figure 1A:
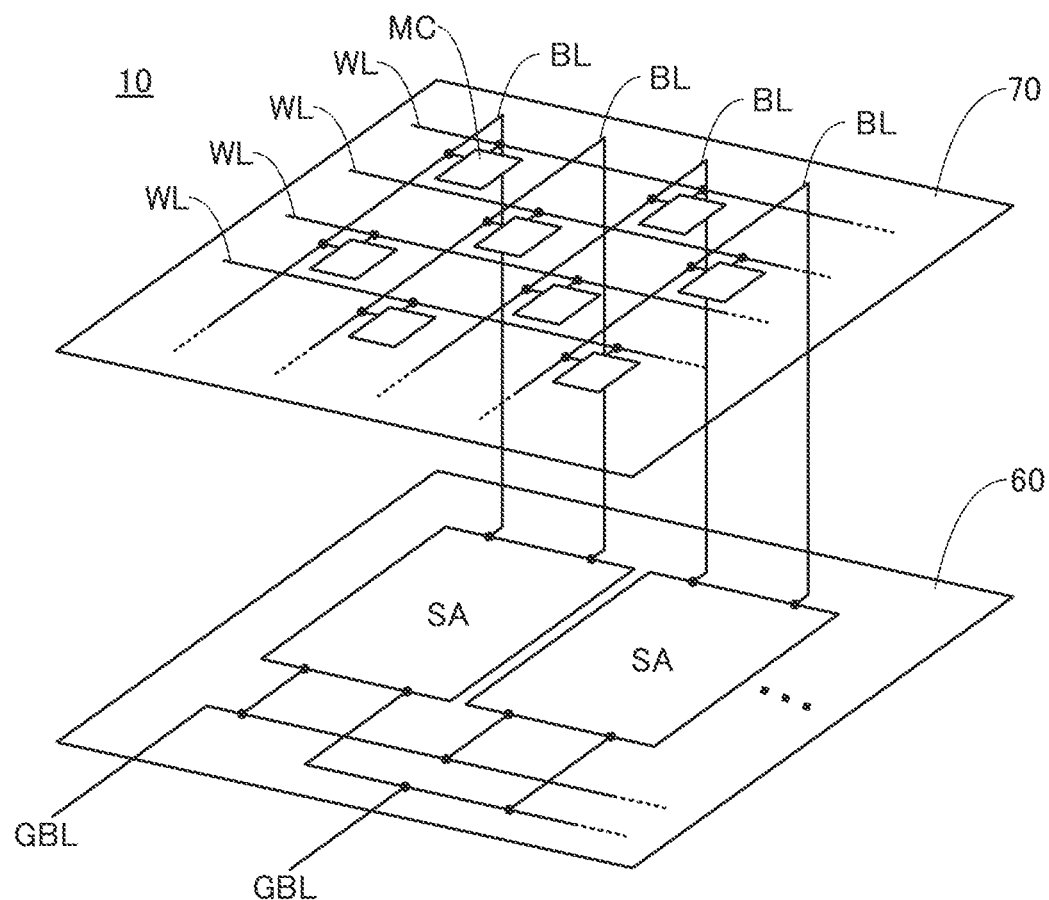
FIG. 1A is a block diagram illustrating a structure example of a semiconductor device.

Embodiments will be described below with reference to the accompanying drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Any of the embodiments described below can be combined as appropriate. In the case where a plurality of structure examples are described in one embodiment, some of the structure examples can be combined as appropriate.

Note that in a block diagram attached to this specification, components are classified according to their functions and shown as independent blocks; however, it is practically difficult to completely separate the components according to their functions, and one component may have a plurality of functions.

In the drawings, the size, the layer thickness, the region, or the like is sometimes exaggerated for clarity, and thus is not limited to the illustrated scale. The drawings are schematic views showing ideal examples, and embodiments of the present invention are not limited to shapes or values shown in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, the terms for describing arrangement such as "over" and "below" do not necessarily mean directly over and directly below, respectively, in the description of a physical relationship between components. For example, the expression "a gate electrode over a gate insulating layer" can mean the case where there is an additional component between the gate insulating layer and the gate electrode.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "perpendicular" indicates that the angle formed between two straight lines is greater than or equal to 80° and less than or equal to 100°. Thus, the case where the angle is greater than or equal to 85° and less than or equal to 95° is also included.

In this specification and the like, ordinal numbers such as "first", "second", and "third" are used in order to avoid confusion among components, and the terms do not limit the components numerically.

In this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "voltage" often refers to a difference between a given potential and a reference potential (e.g., a ground potential). Therefore, the terms "voltage" and "potential difference" can be replaced with each other.

In this specification and the like, a transistor is an element having at least three terminals: a gate, a drain, and a source. The transistor has a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Functions of a source and a drain are sometimes switched when a transistor of different polarity is employed or when a direction of current flow is changed in circuit operation, for example. Therefore, the terms "source" and "drain" can be used interchangeably in this specification and the like.

Unless otherwise specified, off-state current in this specification and the like refers to drain current of a transistor in an off state (also referred to as non-conducting state and cutoff state). Unless otherwise specified, the off state of an n-channel transistor means that a gate voltage with respect to a source voltage (Vgs) is lower than the threshold voltage (Vth), and the off state of a p-channel transistor means that Vgs is higher than Vth. That is, the off-state current of an n-channel transistor sometimes refers to a drain current that flows when the gate voltage with respect to the source voltage Vgs is lower than the threshold voltage Vth.

In the above description of off-state current, a drain may be replaced with a source. That is, the off-state current sometimes refers to a source current when the transistor is in an off state. In addition, the term "leakage current" sometimes expresses the same meaning as off-state current. In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is referred to as oxide semiconductor in some cases. That is to say, a metal oxide that has at least one of an amplifying function, a rectifying function, and a switching function can be referred to as metal oxide semiconductor, or OS for short. An OS transistor or an OS FET refers to a transistor including a metal oxide or an oxide semiconductor.

Embodiment 1

In this embodiment, a semiconductor device according to one embodiment of the present invention will be described. The semiconductor device according to one embodiment of the present invention includes a memory cell formed using an OS transistor.

<Structure Example of Semiconductor Device>

FIG. 1A is a block diagram illustrating a structure example of a semiconductor device 10 according to one embodiment of the present invention.

The semiconductor device 10 includes a plurality of memory cells MC and sense amplifiers SA electrically connected to the plurality of memory cells MC (see FIG. 1A).

Figure 1B:
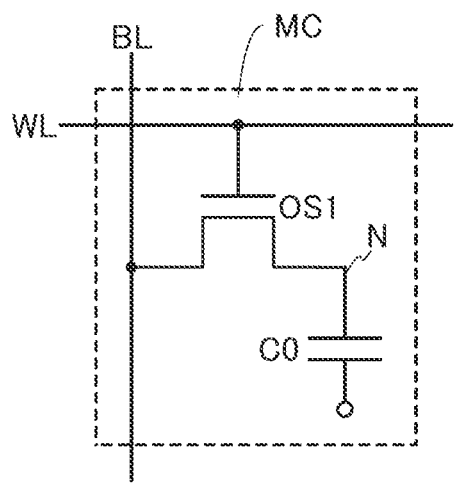
FIGS. 1B and 1C are circuit diagrams each illustrating a configuration example of a semiconductor device.

The memory cell MC includes a transistor OS1 and a capacitor C0 (see FIG. 1B). The memory cell MC is a volatile memory that can store data by holding charge in the capacitor C0.

A wiring WL supplies a signal for controlling the on/off state of the transistor OS1. That is, the wiring WL serves as a word line of the memory cell MC. A wiring BL supplies a charge to be written to the capacitor C0 through the transistor OS1. That is, the wiring BL serves as a bit line of the memory cell MC. The transistor OS1 is turned off after charge is written to the capacitor C0, so that the charge can be held in the memory cell MC.

The memory cell MC is electrically connected to the sense amplifier SA through the wiring BL. The sense amplifier SA has a function of amplifying the potential of data stored in the memory cell MC and outputting the amplified potential. Even in the case where a potential read from the memory cell MC is extremely low, the read potential is amplified by the sense amplifier SA; thus, data reading of the semiconductor device 10 can be surely performed.

Note that FIG. 1A shows an example where the memory cells MC and the sense amplifiers SA are formed in different layers. In FIG. 1A, the memory cells MC are formed in a layer above the sense amplifiers SA, and positioned so that at least one memory cell MC has a region overlapping with the sense amplifier SA. In that case, the area of the semiconductor device 10 can be smaller than that when the memory cells MC and the sense amplifiers SA are formed in the same layer.

Figure 2:
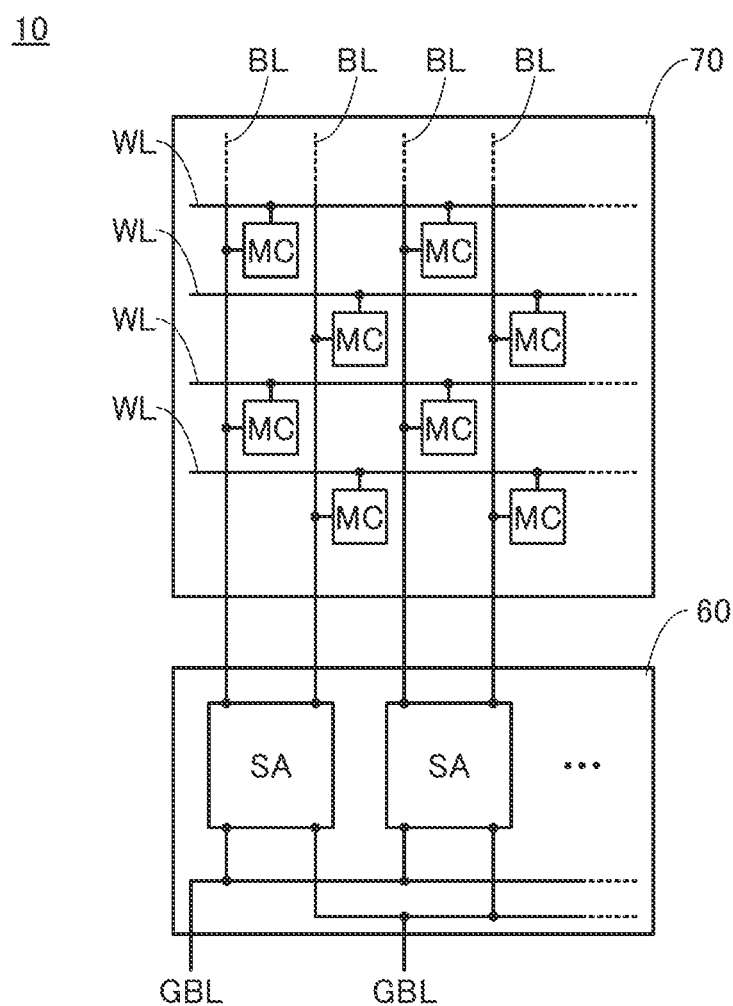
FIG. 2 is a block diagram illustrating a structure example of a semiconductor device.

FIG. 1A shows an example where the memory cells MC are formed in the layer above the sense amplifiers SA; however, one embodiment of the present invention is not limited thereto, and the memory cells MC and the sense amplifiers SA may be formed in the same layer. FIG. 2 is a block diagram illustrating a structure example of the semiconductor device 10 where the memory cells MC and the sense amplifiers SA are formed in the same layer.

The semiconductor device 10 includes a cell array 70 and a sense amplifier circuit 60. The cell array 70 includes a plurality of memory cells MC. Each of the memory cells MC is electrically connected to the wiring WL and the wiring BL. The memory cells MC are selected in accordance with a potential supplied to the wiring WL, and a potential corresponding to data to be written to the memory cells MC (hereinafter also referred to as writing potential) is supplied to the wiring BL; in this manner, data is written to the memory cells MC.

Note that the number of the memory cells MC included in the cell array 70 can be freely determined. For example, the number thereof can be larger than or equal to 128 and smaller than or equal to 512. Here, the case where the cell array 70 includes the memory cells MC arranged in a matrix of i rows and j columns (i and j are each an integer of 2 or more) is shown. Therefore, in the cell array 70, i wirings WL and j wirings BL are provided.

In the cell array 70 illustrated in FIG. 1A, the memory cell MC electrically connected to one wiring BL and the memory cell MC electrically connected to a wiring BL adjacent to the one wiring BL are not electrically connected to the same wiring WL. Thus, the cell array 70 includes i×j/2 memory cells MC.

In one embodiment of the present invention, as a layout type of the cell array 70, a folded-type layout, an open-type layout, or the like can be used. In the case of a folded-type layout, noise generated in a reading potential output to the wiring BL can be reduced owing to a change in the potential of the wiring WL. On the other hand, in the case of an open-type layout, the density of the memory cells MC can be higher than in the case of a folded-type layout, and thus the area of the cell array 70 can be reduced. FIG. 1A illustrates a structure example of the cell array 70 in the case of a folded-type layout.

The sense amplifier circuit 60 is electrically connected to the plurality of wirings BL and a plurality of wirings GBL. The sense amplifier circuit 60 has a function of amplifying a signal that is input and controlling output of the amplified signal. Specifically, the sense amplifier circuit 60 has a function of amplifying the potentials of the wirings BL that corresponds to data stored in the memory cells MC (hereinafter, the potentials are also referred to as reading potentials), and outputting them to the wirings GBL at a predetermined timing Even in the case where a potential read from the memory cell MC is extremely low, the reading potentials are amplified by the sense amplifier circuit 60; thus, data reading can be surely performed. Furthermore, since output of the amplified potentials to the wirings GBL is controlled, each of the wirings GBL can be shared. The sense amplifier circuit 60 includes a plurality of sense amplifiers SA.

The sense amplifier SA has a function of amplifying a difference between a reference potential and a reading potential supplied to the wiring BL and holding the amplified potential difference. The sense amplifier SA also has a function of controlling output of the amplified potential to the wiring GBL. In the example shown here, the sense amplifier SA is electrically connected to two wirings BL and two wirings GBL.

FIG. 1B illustrates a configuration example of the memory cell MC. The memory cell MC includes the transistor OS1 and the capacitor C0. A gate of the transistor OS1 is electrically connected to the wiring WL, one of a source and a drain thereof is electrically connected to one electrode of the capacitor C0, and the other of the source and the drain thereof is electrically connected to the wiring BL. The other electrode of the capacitor C0 is connected to a wiring or a terminal to which a predetermined potential (such as a ground potential) is supplied. Here, a node at which the one of the source and the drain of the transistor OS1 and the one electrode of the capacitor C0 are connected to each other is referred to as node N.

Here, the transistor OS1 has a function of holding charge accumulated in the node N by being turned off. For that reason, the off-state current of the transistor OS1 is preferably small. The low off-state current of the transistor OS1 enables a reduction in leakage of charge held at the node N. Consequently, data stored in the memory cell MC can be held for a long time.

Here, a transistor in which a channel formation region includes a semiconductor with a wider bandgap and lower intrinsic carrier density than silicon or the like can have a low off-state current, and thus is preferably used as the transistor OS1. Examples of such a semiconductor material include an oxide semiconductor having a band gap greater than or equal to twice the band gap of silicon. A transistor in which a channel formation region includes an oxide semiconductor (hereinafter also referred to as OS transistor) has much smaller off-state current than a transistor including a material other than an oxide semiconductor, such as silicon. Therefore, with the use of an OS transistor as the transistor OS1, data written in the memory cell MC can be held for a long time and the interval between refresh operations can be long. Specifically, the interval between refresh operations can be one hour or longer.

The transistor OS1 may be a transistor with a back gate. A transistor OS2 illustrated in FIG. 1C includes a back gate, and the back gate of the transistor OS2 is electrically connected to a wiring BGL. The wiring BGL is a wiring for supplying a voltage Vbg_w1. Moreover, by setting the voltage Vbg_w1 to a negative voltage, the threshold voltage of the transistor OS2 can be shifted to the positive side and thus the holding time of the memory cell MC can be lengthened.

With the use of an OS transistor for the transistor OS1 included in the memory cell MC, the semiconductor device 10 can be used as a memory device in which data can be stored for a long time. Therefore, in the semiconductor device 10, power supply can be stopped while data is not written or read. By lengthening the interval between refresh operations or stopping power supply while data is not written or read, power consumption of the semiconductor device 10 can be reduced.

Next, a specific structure example of the semiconductor device 10 is described with reference to FIG. 3.

Figure 3:
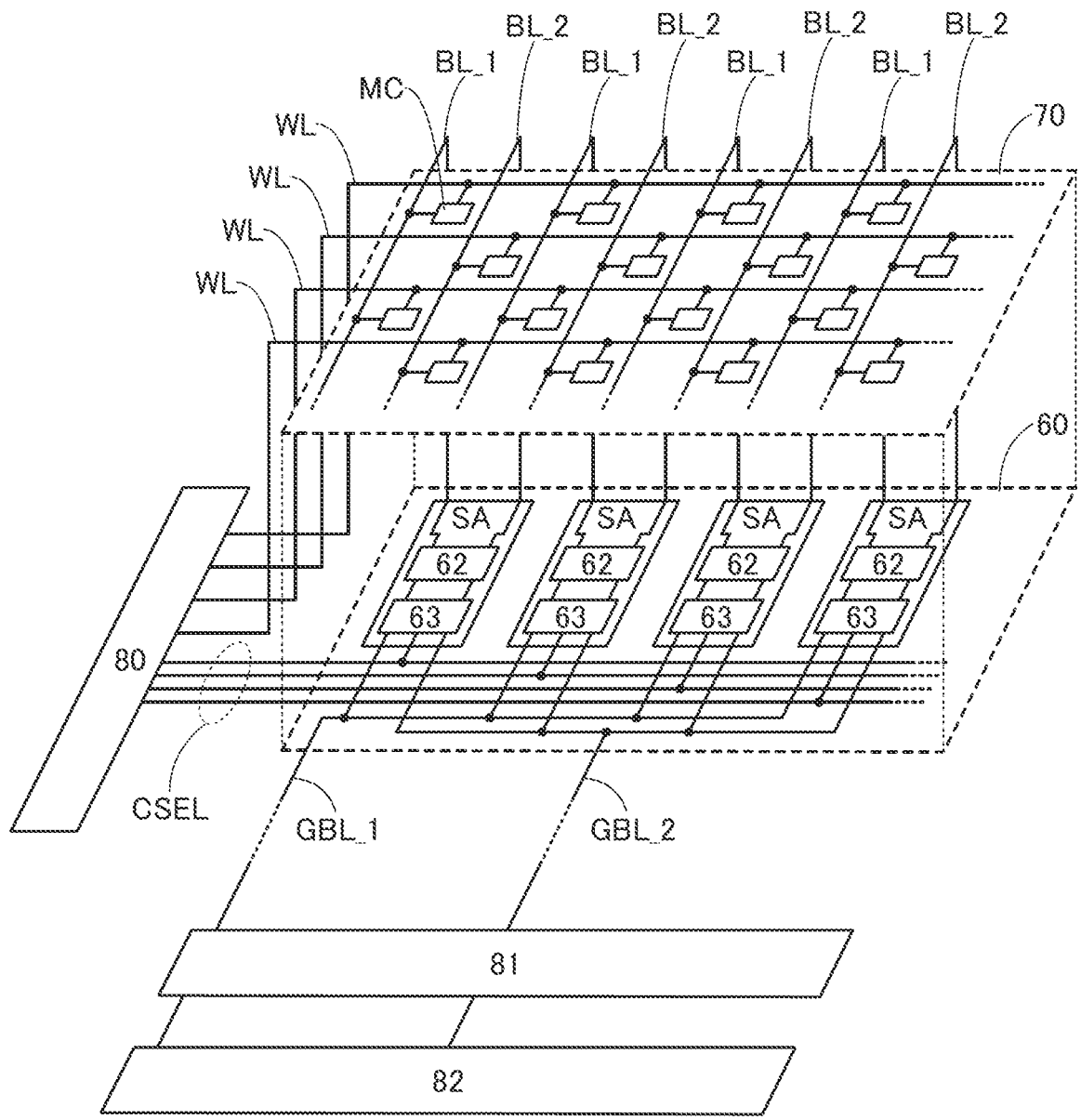
FIG. 3 is a block diagram illustrating a structure example of a semiconductor device.

The semiconductor device 10 illustrated in FIG. 3 has the configuration of the semiconductor device 10 illustrated in FIG. 1A, and in addition includes a driver circuit 80, a main amplifier 81, and an input/output circuit 82.

The main amplifier 81 is connected to the sense amplifier circuit 60 and the input/output circuit 82. The main amplifier 81 has a function of amplifying a signal input thereto. Specifically, the main amplifier 81 has a function of amplifying the potential of the wiring GBL and outputting the amplified potential to the input/output circuit 82. Note that the main amplifier 81 can be omitted in some cases.

Note that FIG. 3 shows an example where the memory cells MC are formed in a layer different from the sense amplifiers SA, the driver circuit 80, the main amplifier 81, and the input/output circuit 82. In FIG. 3, the memory cells MC are formed in a layer above the sense simplifiers SA, and positioned so that at least one memory cell MC has a region overlapping with the sense amplifier SA. Accordingly, the area of the semiconductor device 10 can be reduced.

FIG. 3 shows an example where the memory cells MC are formed in the layer above the sense amplifiers SA; however, one embodiment of the present invention is not limited thereto, and the memory cells MC and the sense amplifiers SA may be formed in the same layer. Moreover, the memory cells MC, the sense amplifiers SA, the driver circuit 80, the main amplifier 81, and the input/output circuit 82 may be formed in the same layer.

The input/output circuit 82 has a function of outputting the potentials of the wirings GBL or the potentials output from the main amplifier 81 as reading data to the outside.

The driver circuit 80 is connected to the memory cells MC through the wirings WL. The driver circuit 80 has a function of supplying a signal for selecting the memory cells MC to which data is written (hereinafter, the signal is also referred to as write word signal) to the wiring WL. Note that the driver circuit 80 can include a decoder or the like.

The sense amplifiers SA are connected to the memory cells MC through the wirings BL. Here, a structure example where two adjacent wirings BL (a wiring BL_1 and a wiring BL_2) are connected to the same sense amplifier SA is shown. The sense amplifier SA includes an amplifier circuit 62 and a switch circuit 63.

The amplifier circuit 62 has a function of amplifying the potential of the wiring BL. Specifically, the amplifier circuit 62 has a function of amplifying a difference between the potential of the wiring BL and a reference potential and holding the amplified potential difference. For example, in the case where the potential of the wiring BL_1 is amplified, a difference between the potential of the wiring BL_1 and the potential of the wiring BL_2 (i.e., a reference potential) is amplified. In the case where the potential of the wiring BL_2 is amplified, a difference between the potential of the wiring BL_1 (i.e., a reference potential) and the potential of the wiring BL_2 is amplified.

The switch circuit 63 has a function of determining whether the amplified potential of the wiring BL is output to the wiring GBL. In the example shown here, the switch circuit 63 is connected to two wirings GBL (a wiring GBL_1 and a wiring GBL_2). The switch circuit 63 has a function of controlling conduction between the wirings BL_1 and GBL_1 and conduction between the wirings BL_2 and GBL_2.

The switch circuit 63 is connected to one of a plurality of wirings CSEL, and the operation of the switch circuit 63 is controlled on the basis of a signal supplied to the wiring CSEL from the driver circuit 80. The semiconductor device 10 is capable of selecting a signal to be output to the outside with the use of the switch circuits 63 and the wirings CSEL. Therefore, the input/output circuit 82 does not need a function of selecting a signal with the use of a multiplexer or the like, and thus can have a simple circuit configuration.

Note that here, a structure example where the wirings WL and the wirings CSEL are connected to the driver circuit 80 is shown; however, the wirings WL and the wirings CSEL may be connected to different driver circuits. In this case, the potentials of the wirings WL and the wirings CSEL are controlled by different driver circuits.

Note that the number of the wirings GBL is not particularly limited, and may be a given number smaller than the number of the wirings BL (i.e., j) in the cell array 70. For example, in the case where the number of the wirings BL connected to one wiring GBL is k (k is an integer of 2 or more), the number of the wirings GBL is j/k.

<Sense Amplifier SA1>

Next, structure examples of a sense amplifier SA1, which is applicable to the sense amplifier SA in the semiconductor device 10, will be described.

Figure 4:
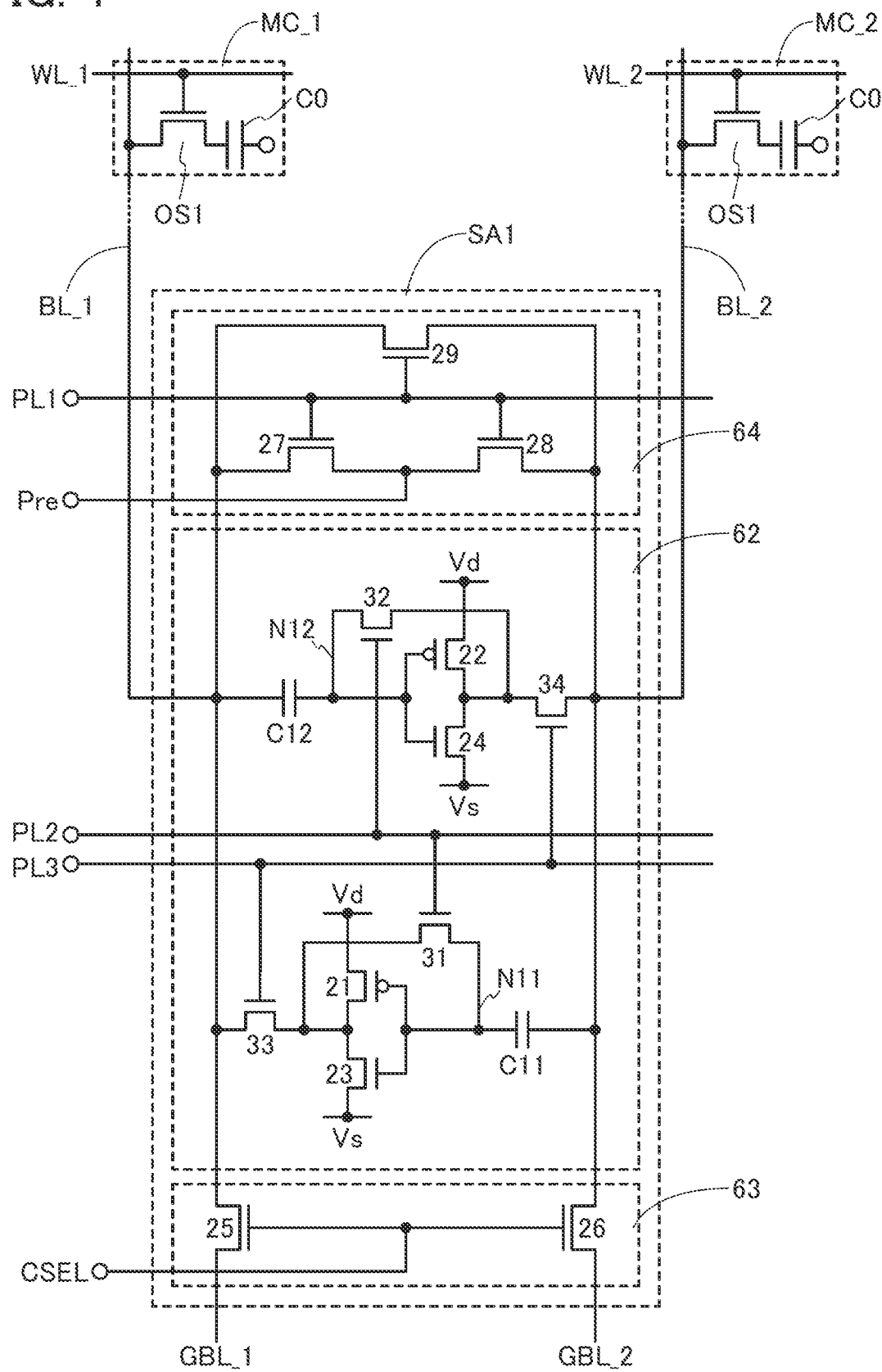
FIG. 4 is a circuit diagram illustrating a configuration example of a memory cell and a sense amplifier.

FIG. 4 illustrates an example of a circuit configuration of the memory cells MC and the sense amplifier SA1 electrically connected to the memory cells MC. The memory cells MC are connected to the sense amplifier SA1 through the wirings BL. In the example shown here, a memory cell MC_1 is connected to the sense amplifier SA1 through the wiring BL_1, and a memory cell MC_2 is connected to the sense amplifier SA1 through the wiring BL_2.

Although one memory cell MC is connected to one wiring BL in the example of FIG. 4, a plurality of memory cells MC may be connected to one wiring BL.

The sense amplifier SA1 includes the amplifier circuit 62, the switch circuit 63, and a precharge circuit 64.

The amplifier circuit 62 includes p-channel transistors 21 and 22, n-channel transistors 23, 24, and 31 to 34, and capacitors C11 and C12.

Figure 5:
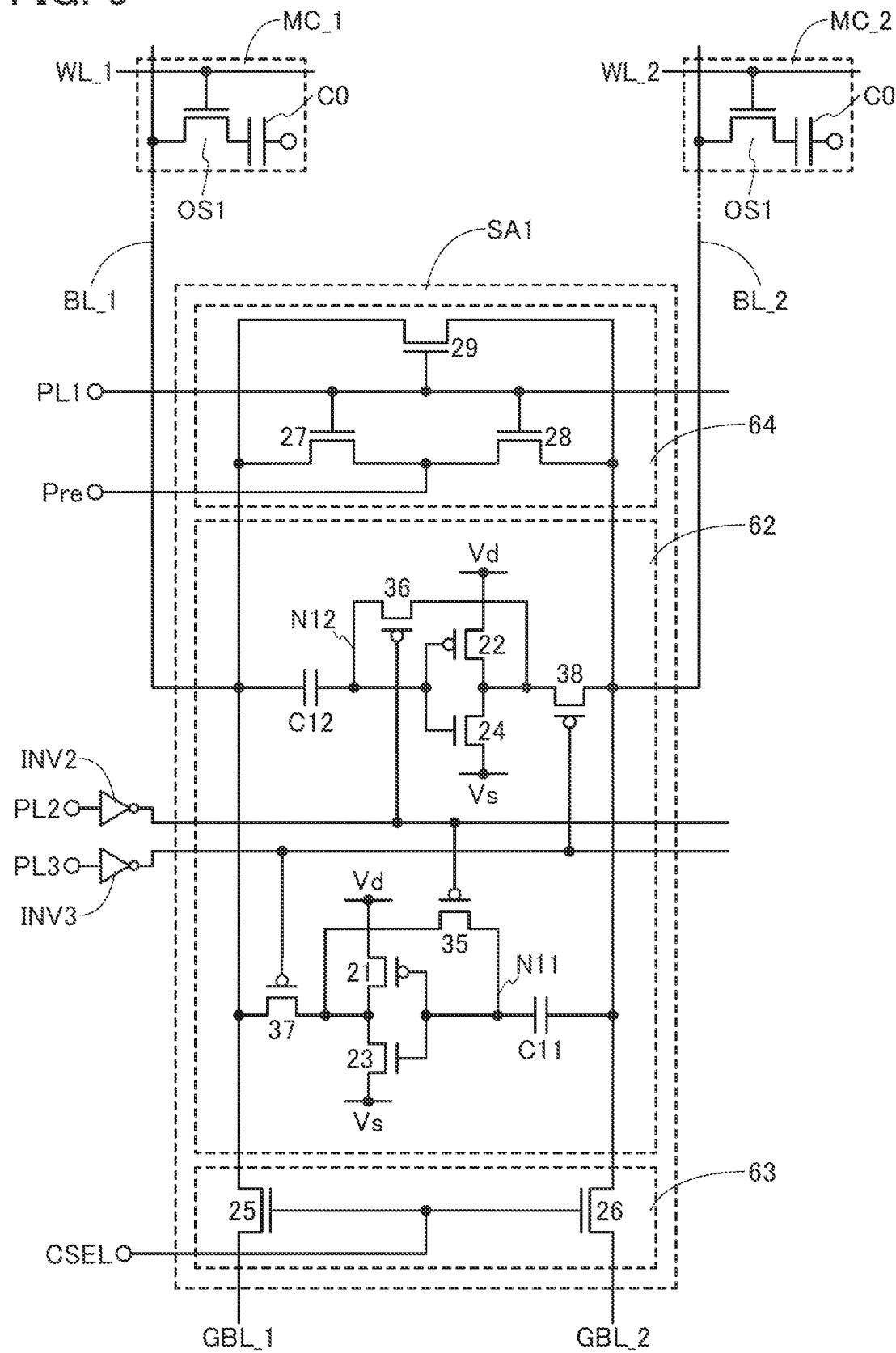
FIG. 5 is a circuit diagram illustrating a configuration example of a memory cell and a sense amplifier.

Note that the n-channel transistors 31 to 34 may be p-channel transistors. FIG. 5 illustrates a circuit configuration example of the sense amplifier SA1 where p-channel transistors 35 to 38 are used instead of the transistors 31 to 34. In that case, each gate of the transistors 35 to 38 is connected to a wiring PL2 through an inverter INV2 or to a wiring PL3 through an inverter INV3 to invert the logic. The wirings PL2 and PL3 will be described later.

Figure 6:
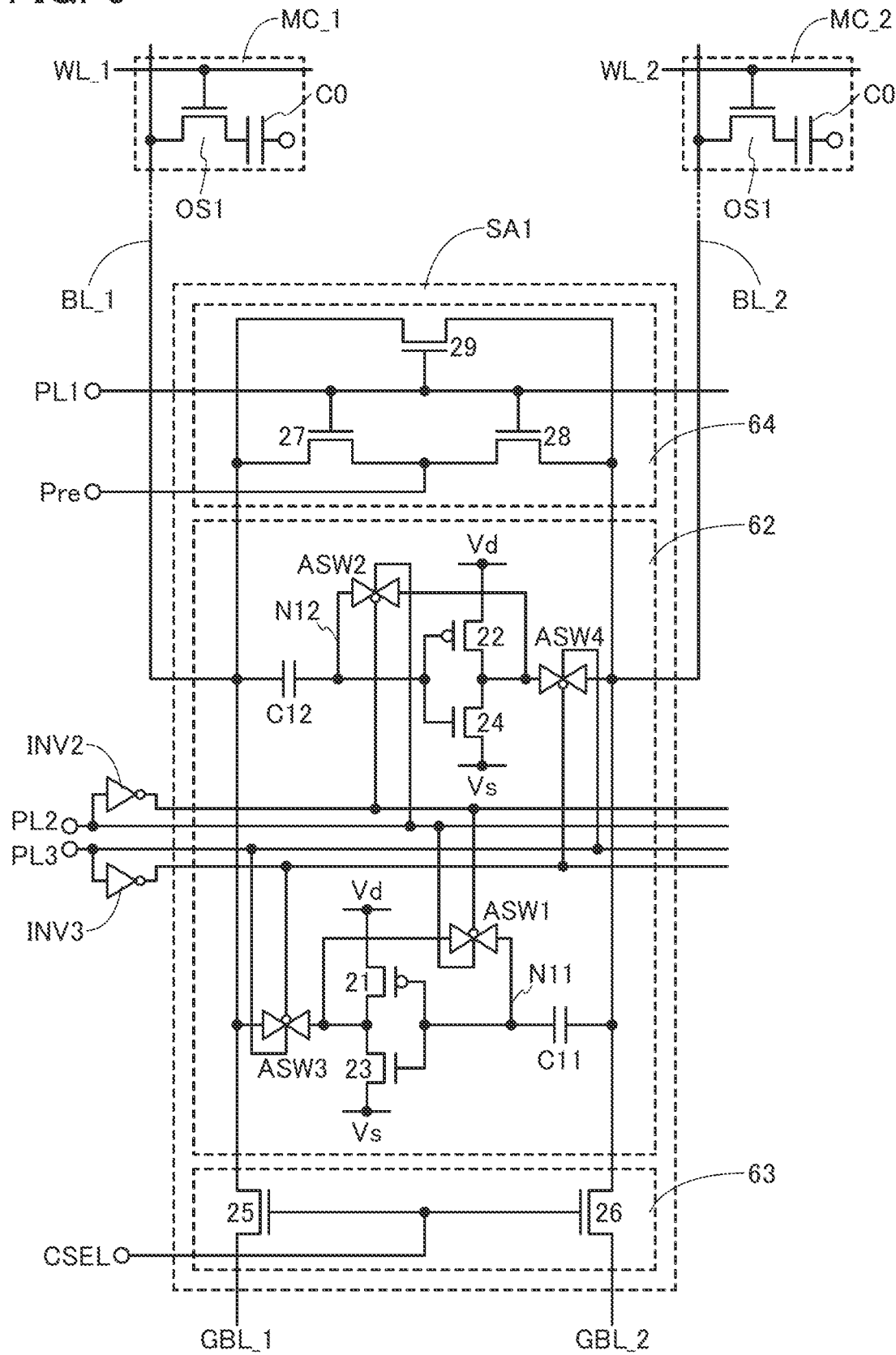
FIG. 6 is a circuit diagram illustrating a configuration example of a memory cell and a sense amplifier.

Alternatively, the n-channel transistors 31 to 34 may be analog switches. FIG. 6 illustrates a circuit configuration example of the sense amplifier SA1 where analog switches ASW1 to ASW4 are used instead of the transistors 31 to 34.

Figure 7:
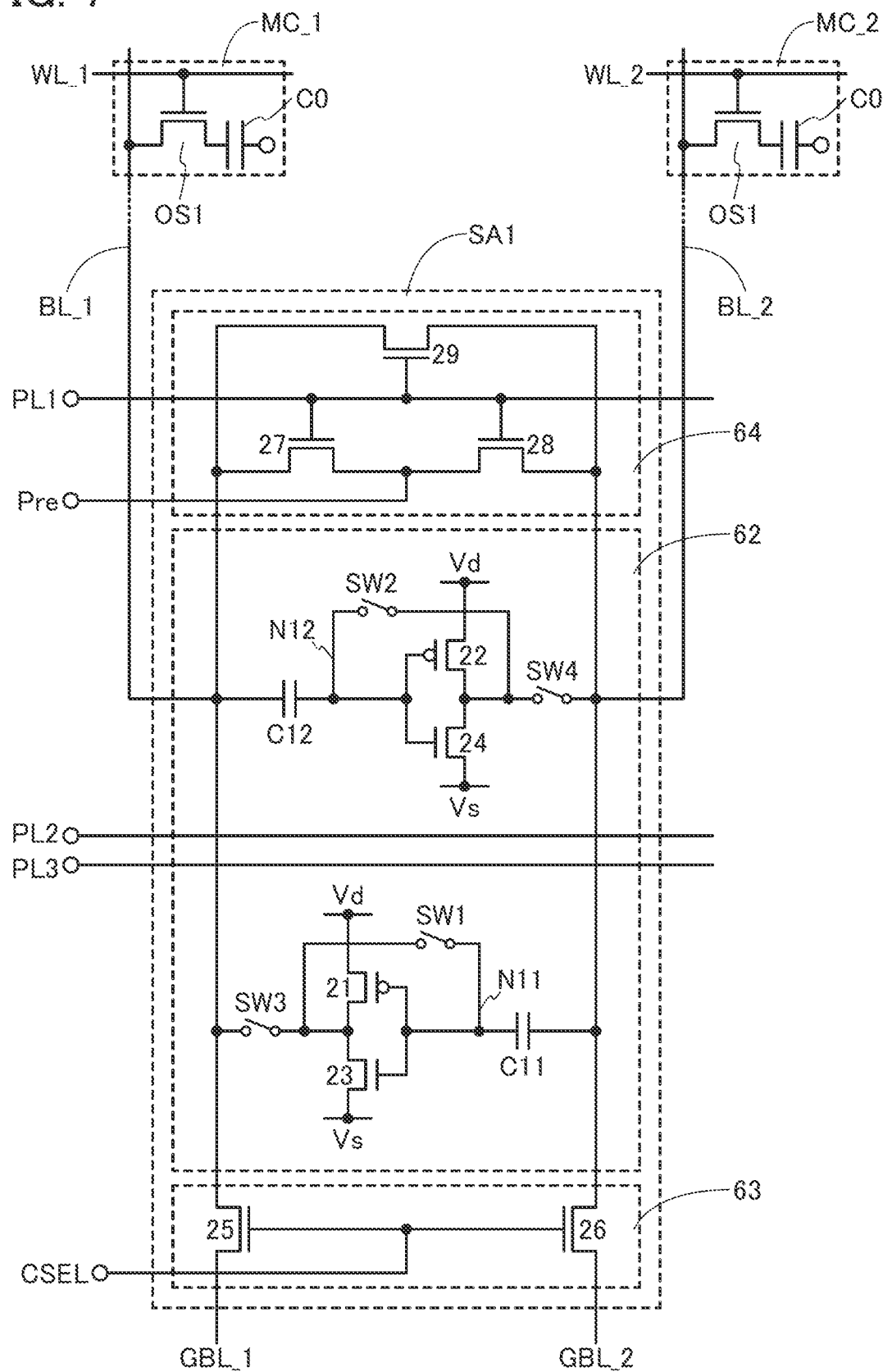
FIG. 7 is a circuit diagram illustrating a configuration example of a memory cell and a sense amplifier.

Further alternatively, the n-channel transistors 31 to 34 may be some kinds of switching elements. FIG. 7 illustrates a circuit configuration example of the sense amplifier SA1 where switches SW1 to SW4 are used instead of the transistors 31 to 34.

Figure 8:
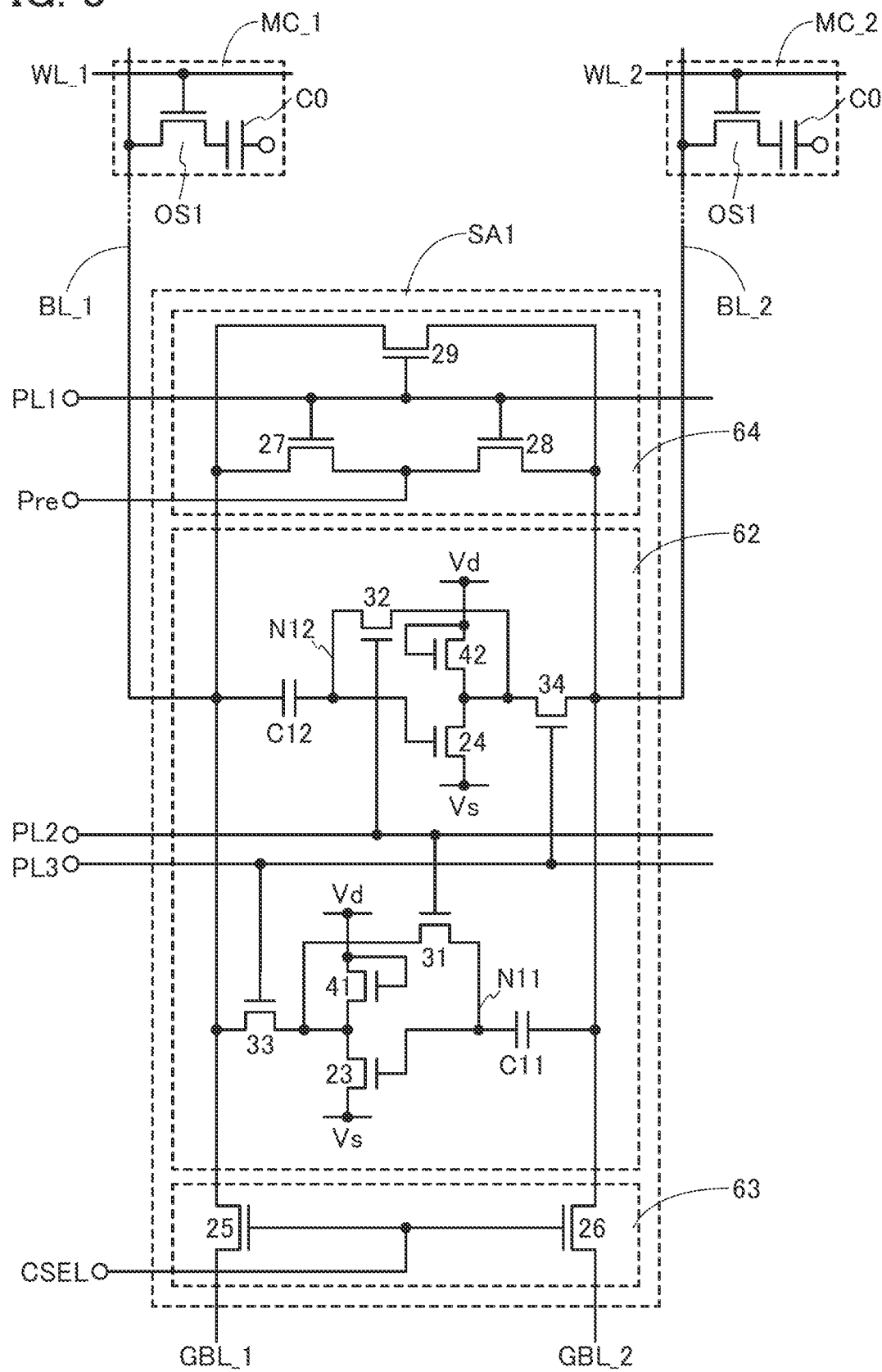
FIG. 8 is a circuit diagram illustrating a configuration example of a memory cell and a sense amplifier.

Furthermore, the p-channel transistors 21 and 22 may be n-channel transistors. For example, n-channel transistors 41 and 42 can be used instead of the p-channel transistors 21 and 22, and the transistors 41 and 42 may be diode-connected transistors, in which one of a source and a drain is connected to a gate. FIG. 8 illustrates a circuit configuration example of the sense amplifier SA1 where the n-channel transistors 41 and 42 are used instead of the transistors 21 and 22 illustrated in FIG. 4.

Figure 9:
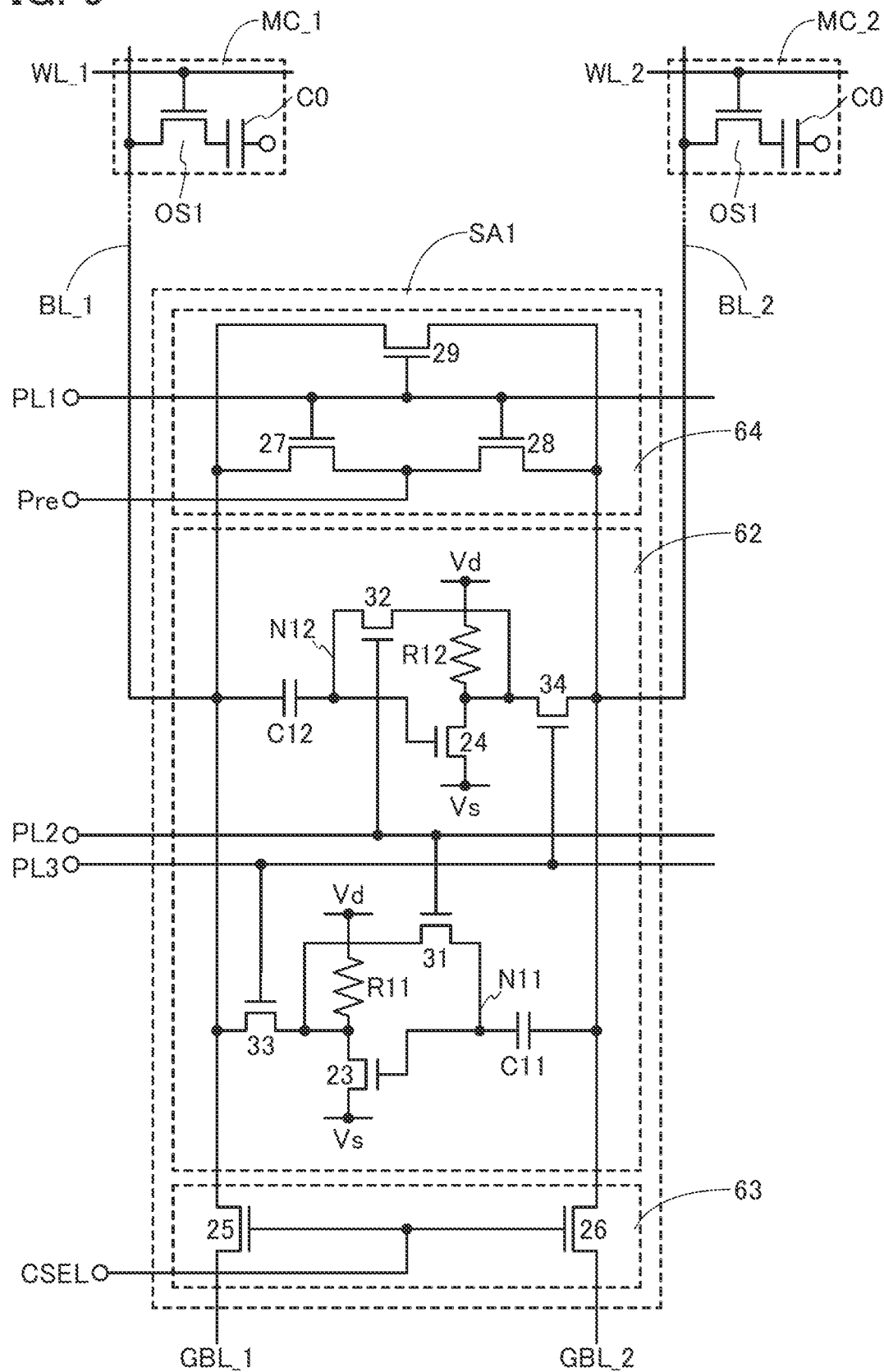
FIG. 9 is a circuit diagram illustrating a configuration example of a memory cell and a sense amplifier.

Alternatively, the p-channel transistors 21 and 22 may be resistors. FIG. 9 illustrates a circuit configuration example of the sense amplifier SA1 where resistors R11 and R12 are used instead of the transistors 21 and 22 illustrated in FIG. 4. When n-channel transistors or resistors are used instead of the transistors 21 and 22, the amplifier circuit 62 can be formed using transistors with the same conductivity type. In that case, the transistors in the amplifier circuit 62 can be manufactured in the same process, and thus the manufacturing process can be shortened.

Figure 10:
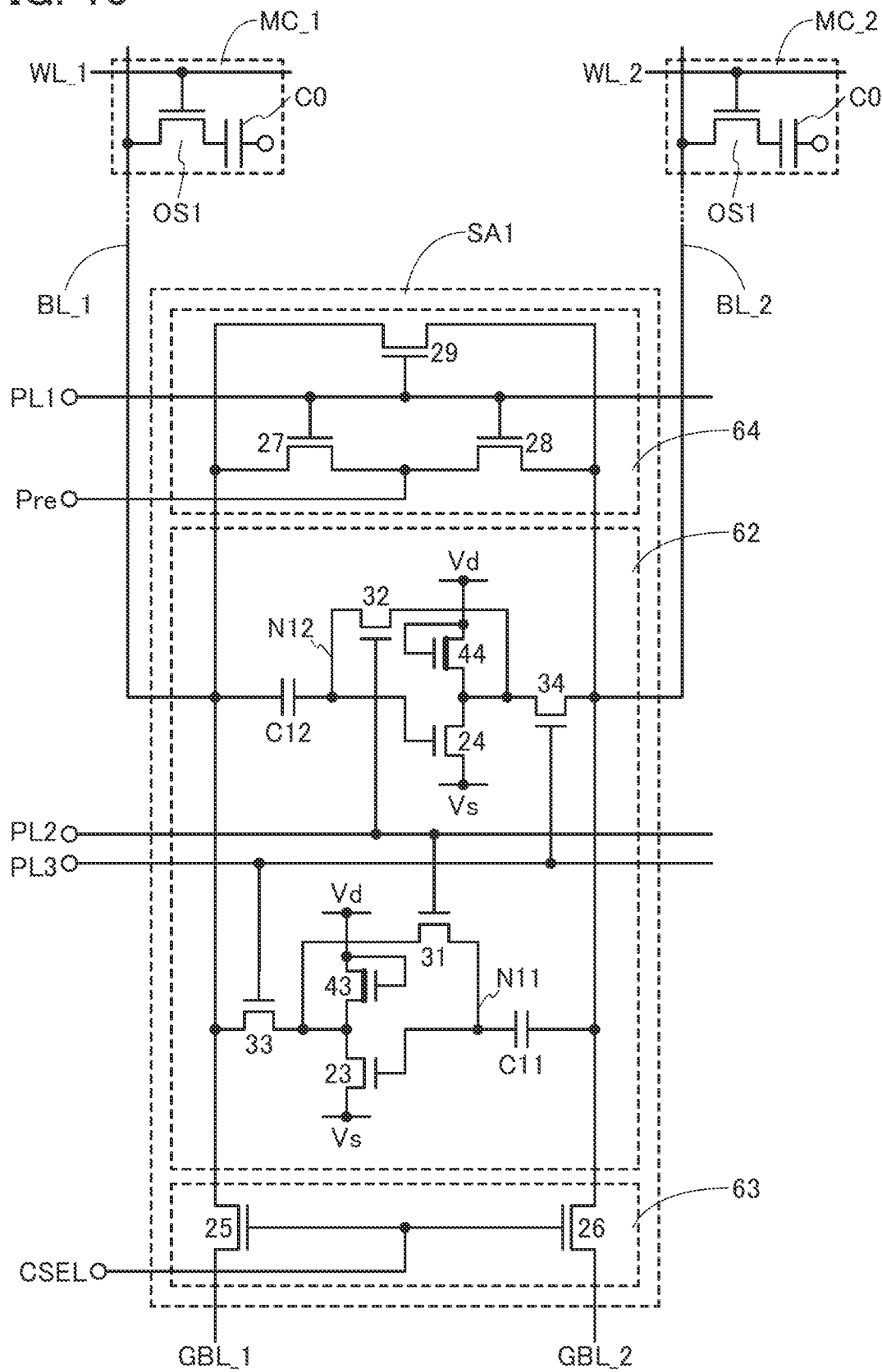
FIG. 10 is a circuit diagram illustrating a configuration example of a memory cell and a sense amplifier.

Alternatively, the p-channel transistors 21 and 22 may be n-channel transistors of a depletion type (also referred to as normally-on type). FIG. 10 illustrates a circuit configuration example of the sense amplifier SA1 where depletion-type transistors 43 and 44 are used instead of the transistors 21 and 22 illustrated in FIG. 4.

Figure 1C:
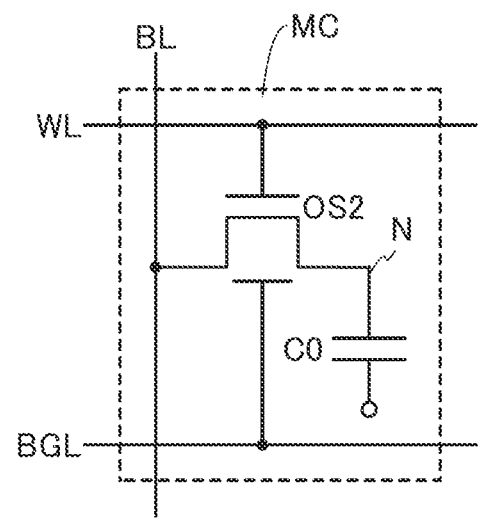

Alternatively, the p-channel transistors 21 and 22 may be n-channel transistors including back gates as well as the transistor OS2 illustrated in FIG. 1C. For example, the p-channel transistors 21 and 22 are n-channel transistors including back gates and diode-connected transistors in which one of a source and a drain thereof is connected to a gate. Moreover, a positive voltage may be applied to the back gates to shift the threshold voltages of the n-channel transistors, in which case the n-channel transistors can be used as the depletion-type transistors.

Figure 11:
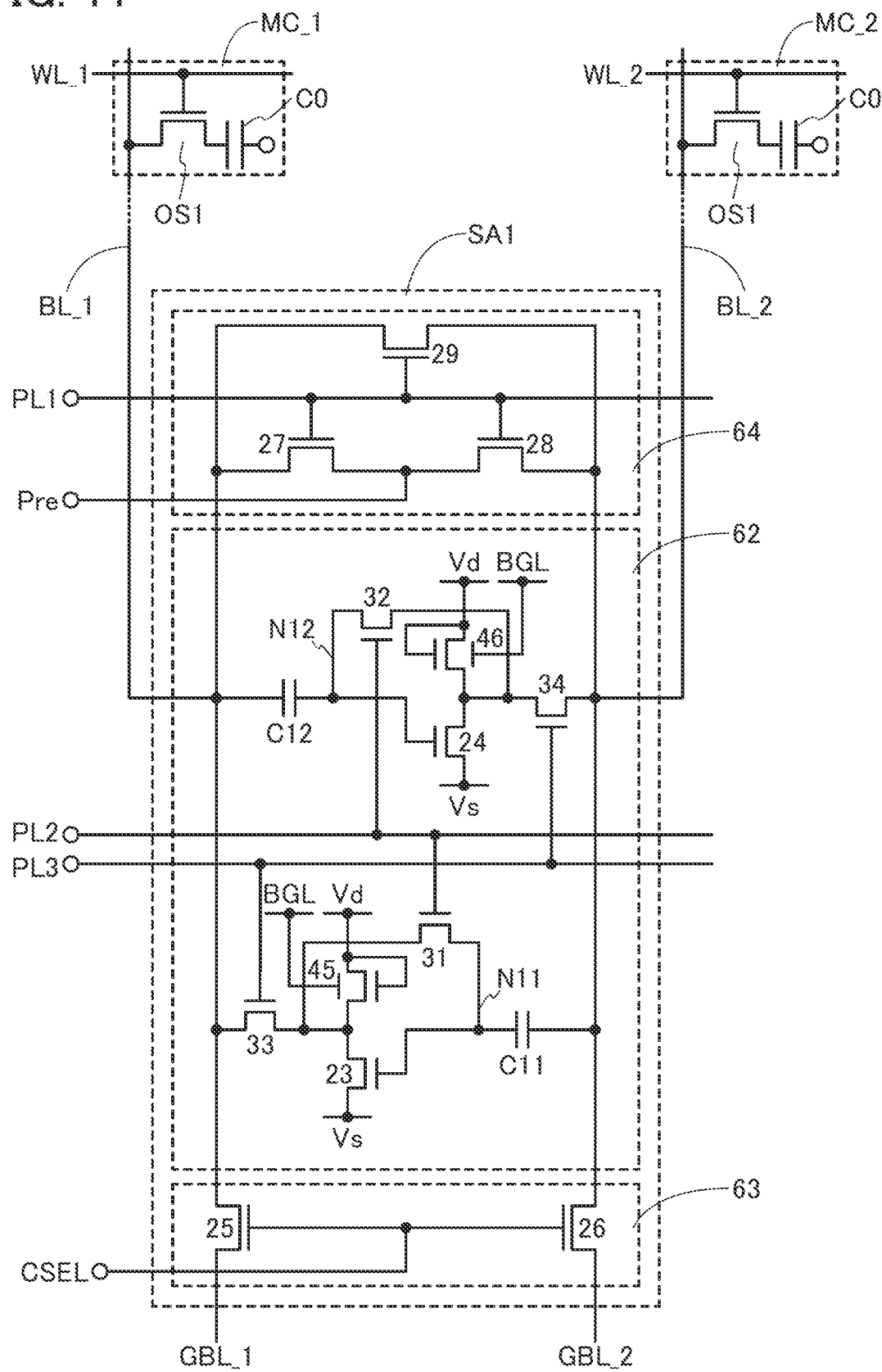
FIG. 11 is a circuit diagram illustrating a configuration example of a memory cell and a sense amplifier.

More specifically, FIG. 11 illustrates a circuit configuration example of the sense amplifier SA1 where transistors 45 and 46 including back gates are used instead of the transistors 21 and 22 illustrated in FIG. 4. The back gates of the transistors 45 and 46 are each electrically connected to the wiring BGL, and a positive voltage is supplied therethrough, whereby the transistors 45 and 46 can be the depletion-type transistors. When n-channel transistors are used instead of the transistors 21 and 22, the amplifier circuit 62 can be formed using transistors with the same conductivity type.

One of the source and the drain of the transistor 21 is connected to a wiring Vd, and the other of the source and the drain thereof is connected to one of a source and a drain of the transistor 23, one of a source and a drain of the transistor 31, and one of a source and a drain of the transistor 33 (see FIG. 4). The other of the source and the drain of the transistor 23 is connected to a wiring Vs, and the other of the source and the drain of the transistor 33 is connected to a wiring BL_1. The other of the source and the drain of the transistor 31 is connected to the gate of the transistor 21, a gate of the transistor 23, and one electrode of a capacitor C11, and the other electrode of the capacitor C11 is connected to a wiring BL_2. A gate of the transistor 31 is connected to the wiring PL2, and a gate of the transistor 33 is connected to the wiring PL3. Here, a node which is connected to the other of the source and the drain of the transistor 31, the gate of the transistor 21, the gate of the transistor 23, and the one electrode of the capacitor C11 is referred to as node N11.

One of the source and the drain of the transistor 22 is connected to the wiring Vd, and the other of the source and the drain thereof is connected to one of a source and a drain of the transistor 24, one of a source and a drain of the transistor 32, and one of a source and a drain of the transistor 34. The other of the source and the drain of the transistor 24 is connected to the wiring Vs and the other of the source and the drain of the transistor 34 is connected to the wiring BL_2. The other of the source and the drain of the transistor 32 is connected to the gate of the transistor 22, a gate of the transistor 24, and one electrode of a capacitor C12, and the other electrode of the capacitor C12 is connected to the wiring BL_1. A gate of the transistor 32 is connected to the wiring PL2, and a gate of the transistor 34 is connected to the wiring PL3. Here, a node which is connected to the other of the source and the drain of the transistor 32, the gate of the transistor 22, the gate of the transistor 24, and the one electrode of the capacitor C12 is referred to as node N12.

Here, the wiring Vd is a wiring for supplying a high-potential power supply VH_SP, and the wiring Vs is a wiring for supplying a low-potential power supply VL_SN. Note that the high-potential power supply VH_SP and the low-potential power supply VL_SN may be supplied intermittently. That is, the high-potential power supply VH_SP and the low-potential power supply VL_SN are supplied through the wiring Vd and the wiring Vs, respectively, in some periods, and are not supplied in other periods.

The transistors 31 and 32 each have a function of holding charge accumulated in the nodes N11 and N12 by being turned off. For that reason, the off-state currents of the transistors 31 and 32 are preferably small. For example, OS transistors may be used as the transistors 31 and 32.

The amplifier circuit 62 has a function of amplifying the potential of the wiring BL_1 and the potential of the wiring BL_2. In FIG. 4, the sense amplifier SA1 including the amplifier circuit 62 functions as a latch sense amplifier.

Figure 12A:
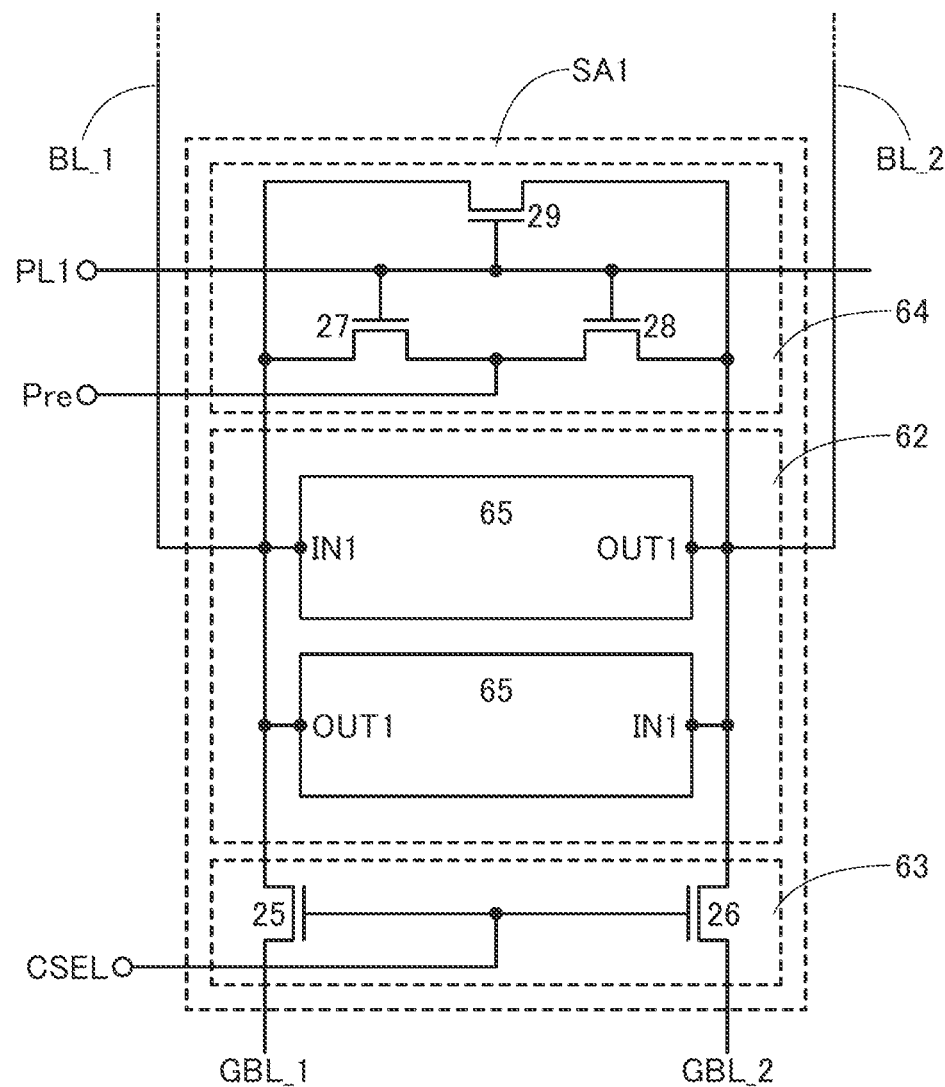
FIG. 12A is a circuit diagram illustrating a configuration example of a sense amplifier and FIG. 12B is a circuit diagram illustrating a configuration example of an amplifier circuit.
Figure 12B:
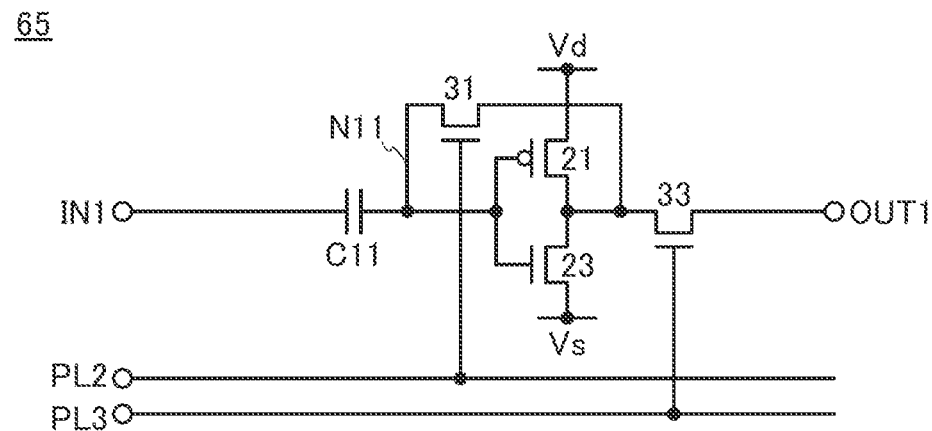

Note that the amplifier circuit 62 may have two amplifier circuits 65. FIG. 12A illustrates a circuit configuration example of the sense amplifier SA1 where the amplifier circuit 62 includes two amplifier circuits 65. FIG. 12B illustrates a circuit configuration example of the amplifier circuit 65.

As illustrated in FIG. 12A, the amplifier circuit 62 includes the two amplifier circuits 65, and each amplifier circuit 65 includes an input terminal IN1 and an output terminal OUT1. In one amplifier circuit 65, the input terminal IN1 is connected to the wiring BL_1 and the output terminal OUT1 is connected to the wiring BL_2. In the other amplifier circuit 65, the input terminal IN1 is connected to the wiring BL_2 and the output terminal OUT1 is connected to the wiring BL_1.

The amplifier circuit 65 includes the p-channel transistor 21, the n-channel transistors 23, 31, and 33, and the capacitor C11.

One of the source and the drain of the transistor 21 is connected to the wiring Vd and the other of the source and the drain thereof is connected to one of the source and the drain of the transistor 23, one of the source and the drain of the transistor 31, and one of the source and the drain of the transistor 33. The other of the source and the drain of the transistor 23 is connected to the wiring Vs, and the other of the source and the drain of the transistor 33 is connected to the output terminal OUT1. The other of the source and the drain of the transistor 31 is connected to the gate of the transistor 21, the gate of the transistor 23, and the one electrode of the capacitor C11, and the other electrode of the capacitor C11 is connected to the input terminal IN1. The gate of the transistor 31 is connected to the wiring PL2, and the gate of the transistor 33 is connected to the wiring PL3.

The switch circuit 63 includes n-channel transistors 25 and 26. The transistors 25 and 26 may be p-channel transistors. One of a source and a drain of the transistor 25 is connected to the wiring BL_1, and the other of the source and the drain thereof is connected to the wiring GBL_1. One of a source and a drain of the transistor 26 is connected to the wiring BL_2, and the other of the source and the drain thereof is connected to the wiring GBL_2.

Gates of the transistor 25 and the transistor 26 are connected to the wiring CSEL. The switch circuit 63 has a function of controlling conduction between the wiring BL_1 and the wiring GBL_1 and conduction between the wiring BL_2 and the wiring GBL_2 on the basis of a potential supplied to the wiring CSEL.

The precharge circuit 64 includes n-channel transistors 27, 28, and 29. The transistors 27, 28, and 29 may be p-channel transistors. One of a source and a drain of the transistor 27 is connected to the wiring BL_1, and the other of the source and the drain thereof is connected to a wiring Pre and one of a source and a drain of the transistor 28. The other of the source and the drain of the transistor 28 is connected to the wiring BL_2.

One of a source and a drain of the transistor 29 is connected to the wiring BL_1, and the other of the source and the drain thereof is connected to the wiring BL_2. A gate of the transistor 27, a gate of the transistor 28, and a gate of the transistor 29 are connected to a wiring PL1. The precharge circuit 64 has a function of initializing the potentials of the wiring BL_1 and the wiring BL_2.

<Operation Example 1 of Sense Amplifier SA1>

Next, an operation example of the memory cell MC and the sense amplifier SA1 illustrated in FIG. 4 at the time of reading data will be described with reference to a timing chart in FIG. 13.

First, in a period T1, the transistors 27 to 29 included in the precharge circuit 64 are turned on, so that the potentials of the wirings BL_1 and BL_2 are initialized. Specifically, a high-level potential VH_PL is supplied to the wiring PL1, whereby the transistors 27 to 29 in the precharge circuit 64 are turned on. Accordingly, a potential Vpre of the wiring Pre is supplied to the wirings BL_1 and BL_2. For example, the potential Vpre can be set as (VH_SP+VL_SN)/2.

Moreover, in the period T1, the transistors 31 and 32 in the amplifier circuit 62 are turned on, so that the potentials of the nodes N11 and N12 are initialized. Specifically, the high-level potential VH_PL is supplied to the wiring PL2, so that the transistors 31 and 32 in the amplifier circuit 62 are turned on.

Here, the transistors 21 and 23 form an inverter, and thus the potential of the node N11 becomes an intermediate potential corresponding to the characteristics of the transistors 21 and 23 when the transistor 31 is turned on to establish conduction between an input and an output of the inverter. This potential is referred to as Vn11. The intermediate potential Vn11 is determined while the influence of characteristic variation of the transistors 21 and 23 is reflected, and the inverter including the transistors 21 and 23 can react sensitively when the input potential changes from the intermediate potential Vn11.

Similarly, the transistors 22 and 24 form an inverter, and thus the potential of the node N12 becomes an intermediate potential corresponding to the characteristics of the transistors 22 and 24 when the transistor 32 is turned on to establish conduction between an input and an output of the inverter. This potential is referred to as Vn12. The intermediate potential Vn12 is determined while the influence of characteristic variation of the transistors 22 and 24 is reflected, and the inverter including the transistors 22 and 24 can react sensitively when the input potential changes from the intermediate potential Vn12.

Note that in the period T1, a low-level potential VL_CSEL is supplied to the wiring CSEL, and accordingly, the transistors 25 and 26 in the switch circuit 63 are off. A low-level potential VL_WL is supplied to the wiring WL_1, and accordingly, the transistor OS1 in the memory cell MC_1 is off. Similarly, although not illustrated in FIG. 13, the low-level potential VL_WL is supplied to the wiring WL_2, and accordingly, the transistor OS1 in the memory cell MC_2 is off.

Then, a low-level potential VL_PL is supplied to the wiring PL1 to turn off the transistors 27 to 29 in the precharge circuit 64. Similarly, the low-level potential VL_PL is supplied to the wiring PL2 to turn off the transistors 31 and 32 in the amplifier circuit 62.

At the timing when the low-level potential VL_PL is supplied to the wiring PL2, the supply of the high-potential power supply VH_SP and the low-potential power supply VL_SN may be stopped. When the supply of the high-potential power supply VH_SP and the low-potential power supply VL_SN is stopped, a shoot-through current can be prevented from flowing through the transistors 21 and 23 and through the transistors 22 and 24, and thus power consumption can be reduced. Moreover, in the case where the supply of the high-potential power supply VH_SP and the low-potential power supply VL_SN is stopped, the supply is restarted at the timing when the high-level potential VH_PL is supplied to the wiring PL3 in a period T3 to be described later.

In part of the period T1, a period during which the wirings Vd and Vs supply the potential Vpre may be provided. In the period during which the wirings Vd and Vs supply the potential Vpre, the inverter including the transistors 21 and 23 and the inverter including the transistors 22 and 24 output the potential Vpre. In this period, the transistors 31 and 32 are turned off and the transistors 33 and 34 are turned on, whereby the potential Vpre can be supplied to the wirings BL_1 and BL_2. That is, the amplifier circuit 62 can also function as the precharge circuit 64.

Then, in a period T2, the wiring WL_1 is selected. Specifically, a high-level potential VH_WL is supplied to the wiring WL_1 to turn on the transistor OS1 in the memory cell MC_1. As a result, conduction is established between the wiring BL_1 and the capacitor C0 through the transistor OS1. When the conduction is established between the wiring BL_1 and the capacitor C0, the potential of the wiring BL_1 changes in accordance with the amount of charge held in the capacitor C0.

Figure 13:
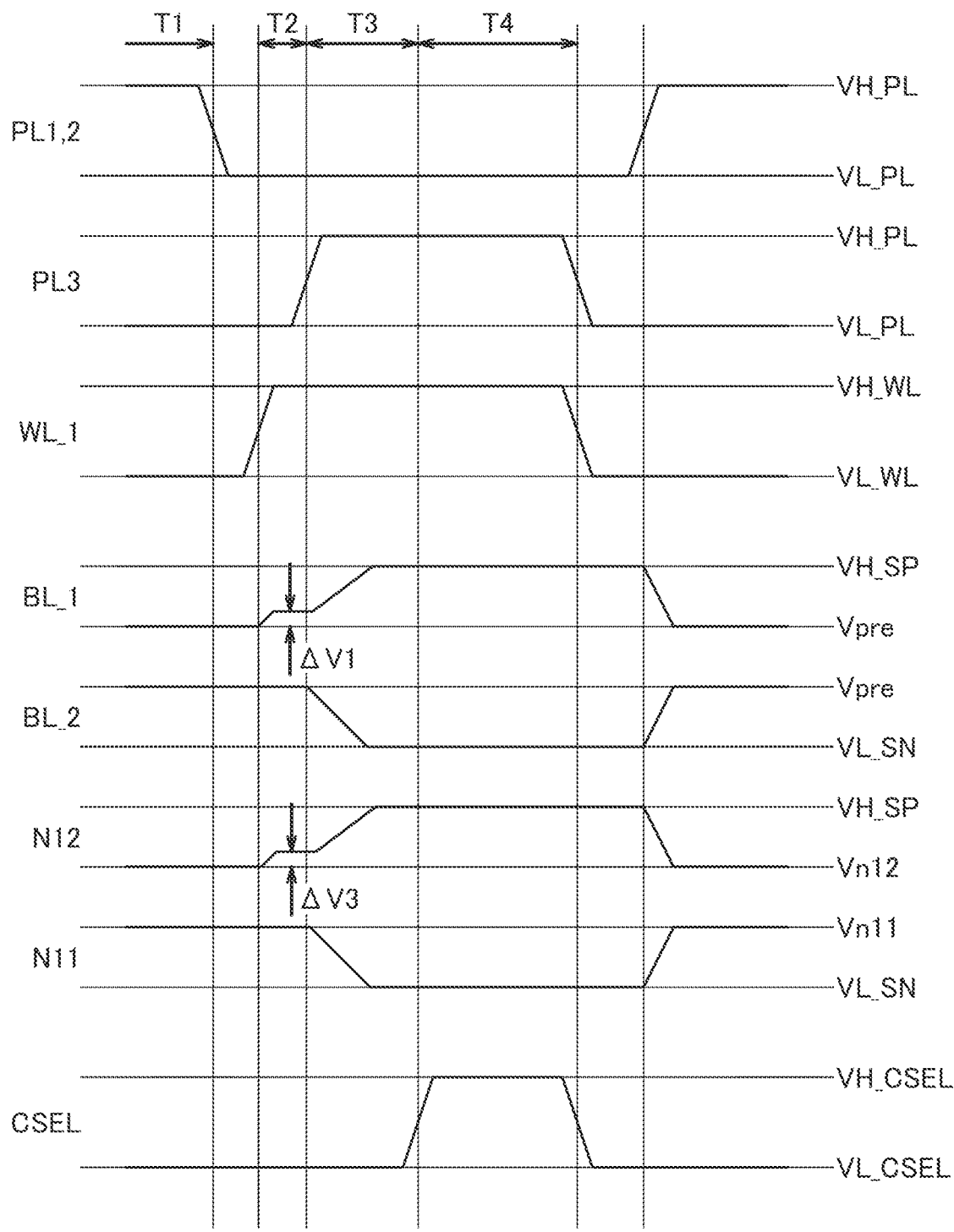
FIG. 13 is a timing chart.

The timing chart in FIG. 13 shows the case where the amount of charge held in the capacitor C0 is large. In the case where the amount of charge held in the capacitor C0 is large, charge is released from the capacitor C0 to the wiring BL_1, so that the potential of the wiring BL_1 is increased from the potential Vpre by ΔV1. By contrast, in the case where the amount of charge held in the capacitor C0 is small, charge flows from the wiring BL_1 into the capacitor C0, so that the potential of the wiring BL_1 is decreased by ΔV2 (not illustrated).

When the potential of the wiring BL_1 is increased from the potential Vpre by ΔV1, the potential of the node N12 is increased from the intermediate potential Vn12 by ΔV3 through the capacitor C12. When the potential of the node N12 is increased from the intermediate potential Vn12 corresponding to the characteristics of the transistors 22 and 24 by ΔV3, the inverter including the transistors 22 and 24 output the low-potential power supply VL_SN.

Note that in the period T2, the low-level potential VL_CSEL is kept supplied to the wiring CSEL, so that the transistors 25 and 26 in the switch circuit 63 remain off.

Next, in the period T3, the transistors 33 and 34 in the amplifier circuit 62 are turned on, so that the amplifier circuit 62 outputs to the wirings BL_1 and BL_2. Specifically, the high-level potential VH_PL is supplied to the wiring PL3 to turn on the transistors 33 and 34 in the amplifier circuit 62.

In FIG. 13 (in the case where the amount of charge held in the capacitor C0 is large), the amplifier circuit 62 outputs the low-potential power supply VL_SN to the wiring BL_2 when the transistors 33 and 34 in the amplifier circuit 62 are tuned on. As the potential of the wiring BL_2 is decreased from the potential Vpre to approach the low-potential power supply VL_SN, the potential of the node N11 is decreased through the capacitor C11 and the inverter including the transistors 21 and 23 outputs the high-potential power supply VH_SP. Then, the amplifier circuit 62 outputs the high-potential power supply VH_SP to the wiring BL_1, and the potential of the wiring BL_1 is increased from the potential Vpre+ΔV1 to approach the high-potential power supply VH_SP. Then, the potential of the node N12 is increased through the capacitor C12.

Note that in the case where the amount of charge held in the capacitor C0 is small and the potential of the wiring BL_1 at the beginning of the period T3 is the potential Vpre−ΔV2, when the transistors 33 and 34 are turned on, the potential of the wiring BL_2 is increased from the potential Vpre to approach the high-potential power supply VH_SP, and the potential of the wiring BL_1 is decreased from the potential Vpre−ΔV2 to approach the low-potential power supply VL_SN.

In the period T3, the low-level potential VL_PL is kept supplied to the wiring PL1, so that the transistors 27 to 29 in the precharge circuit 64 remain off. Similarly, the low-level potential VL_CSEL is kept supplied to the wiring CSEL, so that the transistors 25 and 26 in the switch circuit 63 remain off. In addition, the high-level potential VH_WL is kept supplied to the wiring WL_1, so that the transistor OS1 in the memory cell MC_1 remains off; thus, charge corresponding to the potential VH_SP of the wiring BL_1 is accumulated in the capacitor C0 in the memory cell MC_1.

In a period T4, the potential supplied to the wiring CSEL is controlled to turn on the switch circuit 63. Specifically, the high-level potential VH_CSEL is supplied to the wiring CSEL, so that the transistors 25 and 26 in the switch circuit 63 are turned on. Thus, the potential of the wiring BL_1 is supplied to the wiring GBL_1, and the potential of the wiring BL_2 is supplied to the wiring GBL_2.

In the period T4, the low-level potential VL_PL is kept supplied to the wiring PL1, so that the transistors 27 to 29 in the precharge circuit 64 remain off. In addition, the high-level potential VH_WL is kept supplied to the wiring WL_1, so that the transistor OS1 in the memory cell MC_1 remains on; thus, the charge corresponding to the potential VH_SP of the wiring BL_1 is accumulated in the capacitor C0 in the memory cell MC_1.

When the period T4 is over, the potential supplied to the wiring CSEL is controlled to turn off the switch circuit 63. Specifically, the low-level potential VL_CSEL is supplied to the wiring CSEL, so that the transistors 25 and 26 in the switch circuit 63 are turned off. In addition, the low-level potential VL_PL is supplied to the wiring PL3 to turn off the transistors 33 and 34 in the amplifier circuit 62.

When the period T4 is over, the wiring WL_1 is deselected. Specifically, the low-level potential VL_WL is supplied to the wiring WL_1, so that the transistor OS1 in the memory cell MC_1 is turned off. Through the above operation, charge corresponding to the potential VH_SP of the wiring BL_1 is held in the capacitor C0. Data is stored in the memory cell MC_1 even after the data is read.

Note that in the period T1, the operation for initializing the potentials of the nodes N11 and N12 does not need to be performed every time. This is because once the potentials of the wirings BL_1 and BL_2 and the nodes N11 and N12 are initialized, even when the potentials of the nodes N11 and N12 change in accordance with the change in the potentials of wirings BL_1 and BL_2, the potentials of the nodes N11 and N12 return to the potentials Vn11 and Vn12 after the potentials of the wirings BL_1 and BL_2 are initialized again. In that case, the off-state currents of the transistors 31 and 32 are preferably small. For example, OS transistors can be used as the transistors 31 and 32.

Through the above operation in the periods T1 to T4, data is read from the memory cell MC_1. Data in the memory cell MC_2 can be read similarly.

Moreover, data can be written to the memory cell MC on the basis of the above principle. Specifically, in a manner similar to that used for reading data, the transistors 27 to 29 in the precharge circuit 64 are turned on first, so that the potentials of the wirings BL_1 and BL_2 are initialized, and then the transistors 31 and 32 in the amplifier circuit 62 are turned on, so that the potentials of the nodes N11 and N12 are initialized.

Then, the wiring WL_1 connected to the memory cell MC_1 to which data is to be written or the wiring WL_2 connected to the memory cell MC_2 to which data is to be written is selected to turn on the transistor OS1 in the memory cell MC_1 or MC_2. This operation establishes conduction between the wiring BL_1 or the wiring BL_2 and the capacitor C0 through the transistor OS1.

Then, the potential supplied to the wiring CSEL is controlled to turn on the switch circuit 63. Consequently, conduction is established between the wirings BL_1 and GBL_1 and between the wirings BL_2 and GBL_2.

Writing potentials are supplied to the wirings GBL_1 and GBL_2, whereby the writing potentials are supplied to the wirings BL_1 and BL_2 through the switch circuit 63. Consequently, charge is accumulated in the capacitor C0 in accordance with the potential of the wiring BL_1 or BL_2, and thus data is written to the memory cell MC_1 or MC_2.

Note that after the potential of the wiring GBL_1 is supplied to the wiring BL_1 and the potential of the wiring GBL_2 is supplied to the wiring BL_2, the relation in level between the potential of the wiring BL_1 and the potential of the wiring BL_2 is maintained by the amplifier circuit 62 even after the transistors 25 and 26 in the switch circuit 63 are turned off.

<Operation Example 2 of Sense Amplifier SA1>

An operation example of the memory cell MC and the sense amplifier SA1 in FIG. 4, which is different from that shown in the timing chart in FIG. 13, will be described with reference to a timing chart in FIG. 14.

In a period T1, the transistors 31 and 32 in the amplifier circuit 62 are turned on, so that the potentials of the nodes N11 and N12 are initialized. Specifically, the high-level potential VH_PL is supplied to the wiring PL2 to turn on the transistors 31 and 32 in the amplifier circuit 62.

Also in the period T1, the transistors 33 and 34 in the amplifier circuit 62 are turned on, so that the potentials of the wirings BL_1 and BL_2 are initialized. Specifically, the high-level potential VH_PL is supplied to the wiring PL3 to turn on the transistors 33 and 34 in the amplifier circuit 62.

Here, the transistors 21 and 23 form the inverter, and thus the potential of the node N11 becomes an intermediate potential corresponding to the characteristics of the transistors 21 and 23 when the transistor 31 is turned on to establish conduction between the input and the output of the inverter. This potential is referred to as Vn11. The intermediate potential Vn11 is determined while the influence of characteristic variation of the transistors 21 and 23 is reflected, and the inverter including the transistors 21 and 23 can react sensitively when the input potential changes from Vn11.

In addition, when the transistor 33 is turned on to establish conduction between the output of the inverter including the transistors 21 and 23 and the wiring BL_1, the potential of the wiring BL_1 also becomes Vn11. Since the intermediate potential Vn11 corresponds to the characteristics of the transistors 21 and 23, in the case where the input of the inverter including the transistors 21 and 23 changes from Vn11, the output of the inverter also changes from Vn11. By initializing the potential of the wiring BL_1 to Vn11, the change in the output with the change in the input of the inverter from Vn11 can be transmitted to the wiring BL_1 promptly.

Similarly, the transistors 22 and 24 form the inverter, and thus the potential of the node N12 becomes an intermediate potential corresponding to the characteristics of the transistors 22 and 24 when the transistor 32 is turned on to establish conduction between the input and the output of the inverter. This potential is referred to as Vn12. The intermediate potential Vn12 is determined while the influence of characteristic variation of the transistors 22 and 24 is reflected, and the inverter including the transistors 22 and 24 can react sensitively when the input potential changes from Vn12.

Similarly, when the transistor 34 is turned on to establish conduction between the output of the inverter including the transistors 22 and 24 and the wiring BL_2, the potential of the wiring BL_2 also becomes Vn12. Since the intermediate potential Vn12 corresponds to the characteristics of the transistors 22 and 24, in the case where the input of the inverter including the transistors 22 and 24 changes from Vn12, the output of the inverter also changes from Vn12. By initializing the potential of the wiring BL_2 to Vn12, the change in the output with the change in the input of the inverter from Vn12 can be transmitted to the wiring BL_2 promptly.

Note that in the case where the transistors 33 and 34 in the amplifier circuit 62 are turned on to initialize the potentials of the wirings BL_1 and BL_2, the precharge circuit 64 is not necessary. In FIG. 14, the wiring PL1 is supplied with the low-level potential VL_PL in the periods T1 to T4.

Furthermore, in the period T1, the low-level potential VL_CSEL is supplied to the wiring CSEL, and accordingly, the transistors 25 and 26 in the switch circuit 63 are off. The low-level potential VL_WL is supplied to the wiring WL_1, and accordingly, the transistor OS1 in the memory cell MC_1 is off. Similarly, although not illustrated in FIG. 14, the low-level potential VL_WL is supplied to the wiring WL_2, and accordingly, the transistor OS1 in the memory cell MC_2 is off.

Then, the low-level potential VL_PL is supplied to the wirings PL2 and PL3 to turn off the transistors 31 to 34 in the amplifier circuit 62.

At the timing when the low-level potential VL_PL is supplied to the wirings PL2 and PL3, the supply of the high-potential power supply VH_SP and the low-potential power supply VL_SN may be stopped. When the supply of the high-potential power supply VH_SP and the low-potential power supply VL_SN is stopped, a shoot-through current can be prevented from flowing through the transistors 21 and 23 and through the transistors 22 and 24, and thus power consumption can be reduced. Moreover, in the case where the supply of the high-potential power supply VH_SP and the low-potential power supply VL_SN is stopped, the supply is restarted at the timing when the high-level potential VH_PL is supplied to the wiring PL3 in a period T3 to be described later.

Then, in a period T2, the wiring WL_1 is selected. Specifically, the high-level potential VH_WL is supplied to the wiring WL_1 to turn on the transistor OS1 in the memory cell MC_1. This operation establishes conduction between the wiring BL_1 and the capacitor C0 through the transistor OS1. When the conduction is established between the wiring BL_1 and the capacitor C0, the potential of the wiring BL_1 changes in accordance with the amount of charge held in the capacitor C0.

Figure 14:
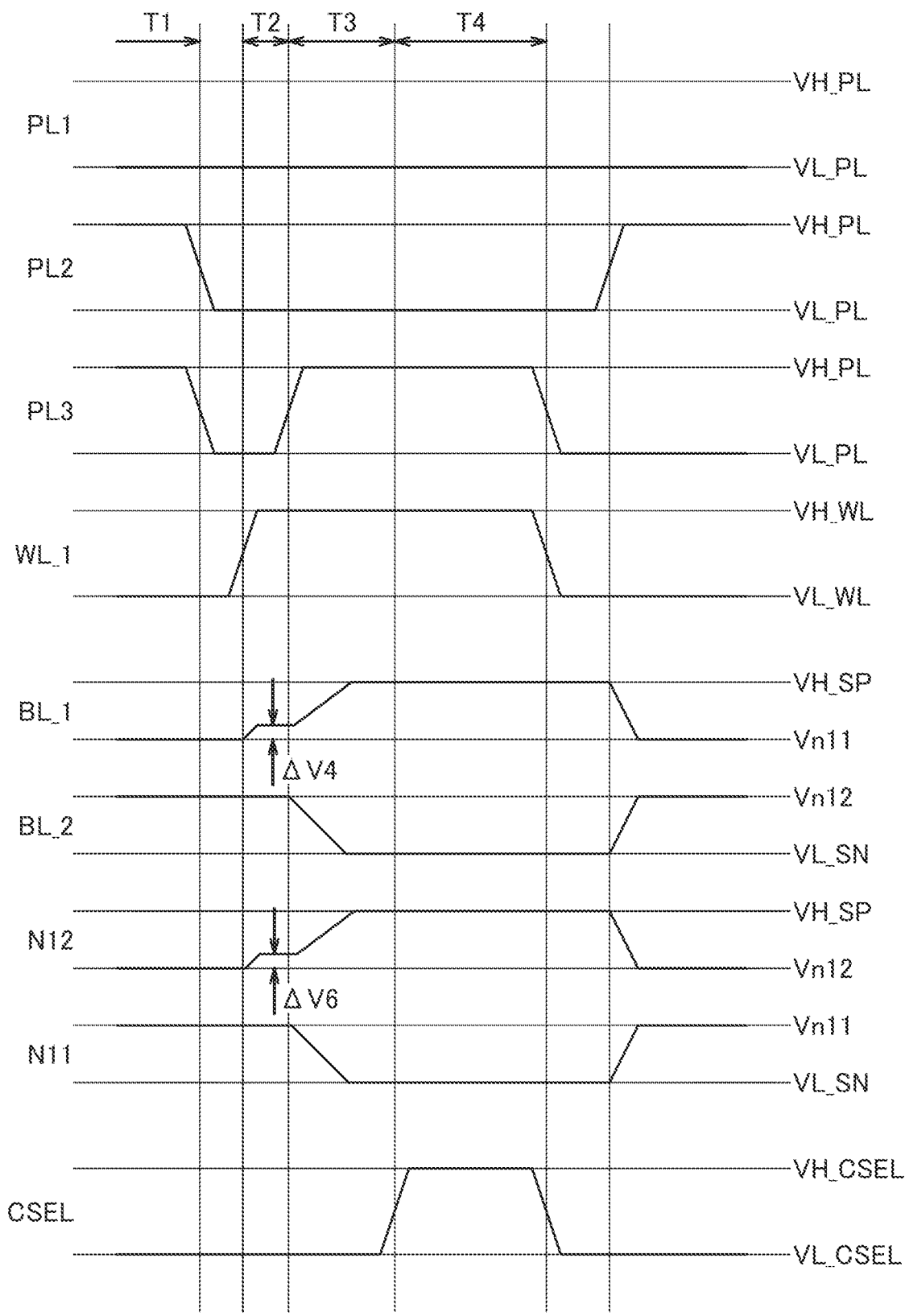
FIG. 14 is a timing chart.

The timing chart in FIG. 14 shows the case where the amount of charge held in the capacitor C0 is large. In the case where the amount of charge held in the capacitor C0 is large, charge is released from the capacitor C0 to the wiring BL_1, so that the potential of the wiring BL_1 is increased from the potential Vn11 by $\Delta V4$. By contrast, in the case where the amount of charge held in the capacitor C0 is small, charge flows from the wiring BL_1 into the capacitor C0, so that the potential of the wiring BL_1 is decreased by $\Delta V5$ (not illustrated).

When the potential of the wiring BL_1 is increased from the potential Vn11 by $\Delta V4$, the potential of the node N12 is increased by $\Delta V6$ through the capacitor C12. When the potential of the node N12 is increased from the intermediate potential Vn12 corresponding to the characteristics of the transistors 22 and 24 by $\Delta V6$, the inverter including the transistors 22 and 24 outputs the low-potential power supply VL_SN.

Note that in the period T2, the low-level potential VL_CSEL is kept supplied to the wiring CSEL, so that the transistors 25 and 26 in the switch circuit 63 remain off.

Next, in the period T3, the transistors 33 and 34 in the amplifier circuit 62 are turned on to obtain an output from the amplifier circuit 62 to the wirings BL_1 and BL_2. Specifically, the high-level potential VH_PL is supplied to the wiring PL3 to turn on the transistors 33 and 34 in the amplifier circuit 62.

In the case of FIG. 14 (in the case where the amount of charge held in the capacitor C0 is large), the amplifier circuit 62 outputs the low-potential power supply VL_SN to the wiring BL_2 when the transistors 33 and 34 in the amplifier circuit 62 are tuned on. As the potential of the wiring BL_2 is decreased from Vn12 to approach the low-potential power supply VL_SN, the potential of the node N11 is decreased through the capacitor C11 and the inverter including the transistors 21 and 23 outputs the high-potential power supply VH_SP. Then, the amplifier circuit 62 outputs the high-potential power supply VH_SP to the wiring BL_1, and the potential of the wiring BL_1 is increased from Vn11+ ΔV4 to approach the high-potential power supply VH_SP. The potential of the node N12 is also increased through the capacitor C12.

Note that in the case where the amount of charge held in the capacitor C0 is small and the potential of the wiring BL_1 at the beginning of the period T3 is the potential Vn11−ΔVS, when the transistors 33 and 34 are turned on, the potential of the wiring BL_2 is increased from Vn12 to approach the high-potential power supply VH_SP, and the potential of the wiring BL_1 is decreased from the potential Vn11−ΔV5 to approach the low-potential power supply VL_SN.

Note that in the period T3, the low-level potential VL_CSEL is kept supplied to the wiring CSEL, so that the transistors 25 and 26 in the switch circuit 63 remain off. In addition, the high-level potential VH_WL is kept supplied to the wiring WL_1, so that the transistor OS1 in the memory cell MC_1 remains on; thus, charge corresponding to the potential VH_SP of the wiring BL_1 is accumulated in the capacitor C0 in the memory cell MC_1.

Next, in the period T4, the potential supplied to the wiring CSEL is controlled to turn on the switch circuit 63. Specifically, the high-level potential VH_CSEL is supplied to the wiring CSEL, so that the transistors 25 and 26 in the switch circuit 63 are turned on. Thus, the potential of the wiring BL_1 is supplied to the wiring GBL_1, and the potential of the wiring BL_2 is supplied to the wiring GBL_2.

Note that in the period T4, the high-level potential VH_WL is kept supplied to the wiring WL_1, so that the transistor OS1 in the memory cell MC_1 remains on; thus, charge corresponding to the potential VH_SP of the wiring BL_1 remains accumulated in the capacitor C0 in the memory cell MC_1.

When the period T4 is over, the potential supplied to the wiring CSEL is controlled to turn off the switch circuit 63. Specifically, the low-level potential VL_CSEL is supplied to the wiring CSEL, so that the transistors 25 and 26 in the switch circuit 63 are turned off. In addition, the low-level potential VL_PL is supplied to the wiring PL3 to turn off the transistors 33 and 34 in the amplifier circuit 62.

When the period T4 is over, the wiring WL_1 is deselected. Specifically, the low-level potential VL_WL is supplied to the wiring WL_1, whereby the transistor OS1 in the memory cell MC_1 is turned off. Through the above operation, charge corresponding to the potential VH_SP of the wiring BL_1 is held in the capacitor C0. Data is stored in the memory cell MC_1 even after the data is read.

Through the operation in the periods T1 to T4, data is read from the memory cell MC_1. Data in the memory cell MC_2 can be read similarly.

Moreover, data can be written to the memory cell MC on the basis of the above principle. Specifically, in a manner similar to that used for reading data, the transistors 31 and 32 in the amplifier circuit 62 are turned on first, so that the potentials of the nodes N11 and N12 are initialized, and then the transistors 33 and 34 in the amplifier circuit 62 are turned on, so that the potentials of the wirings BL_1 and BL_2 are initialized.

Then, the wiring WL_1 connected to the memory cell MC_1 to which data is to be written or the wiring WL_2 connected to the memory cell MC_2 to which data is to be written is selected to turn on the transistor OS1 in the memory cell MC_1 or MC_2. This operation establishes conduction between the wiring BL_1 or the wiring BL_2 and the capacitor C0 through the transistor OS1.

Then, the potential supplied to the wiring CSEL is controlled to turn on the switch circuit 63. Consequently, conduction is established between the wirings BL_1 and GBL_1 and between the wirings BL_2 and GBL_2.

Writing potentials are supplied to the wirings GBL_1 and GBL_2, whereby the writing potentials are supplied to the wirings BL_1 and BL_2 through the switch circuit 63. Consequently, charge is accumulated in the capacitor C0 in accordance with the potential of the wiring BL_1 or BL_2, and thus data is written to the memory cell MC_1 or MC_2.

Note that after the potential of the wiring GBL_1 is supplied to the wiring BL_1 and the potential of the wiring GBL_2 is supplied to the wiring BL_2, the relation in level between the potential of the wiring BL_1 and the potential of the wiring BL_2 is maintained by the amplifier circuit 62 even after the transistors 25 and 26 in the switch circuit 63 are turned off.

<Sense Amplifier SA2>

Next, a configuration example of a sense amplifier different from the sense amplifier SA1 in FIG. 4 will be described with reference to FIG. 15.

Figure 15:
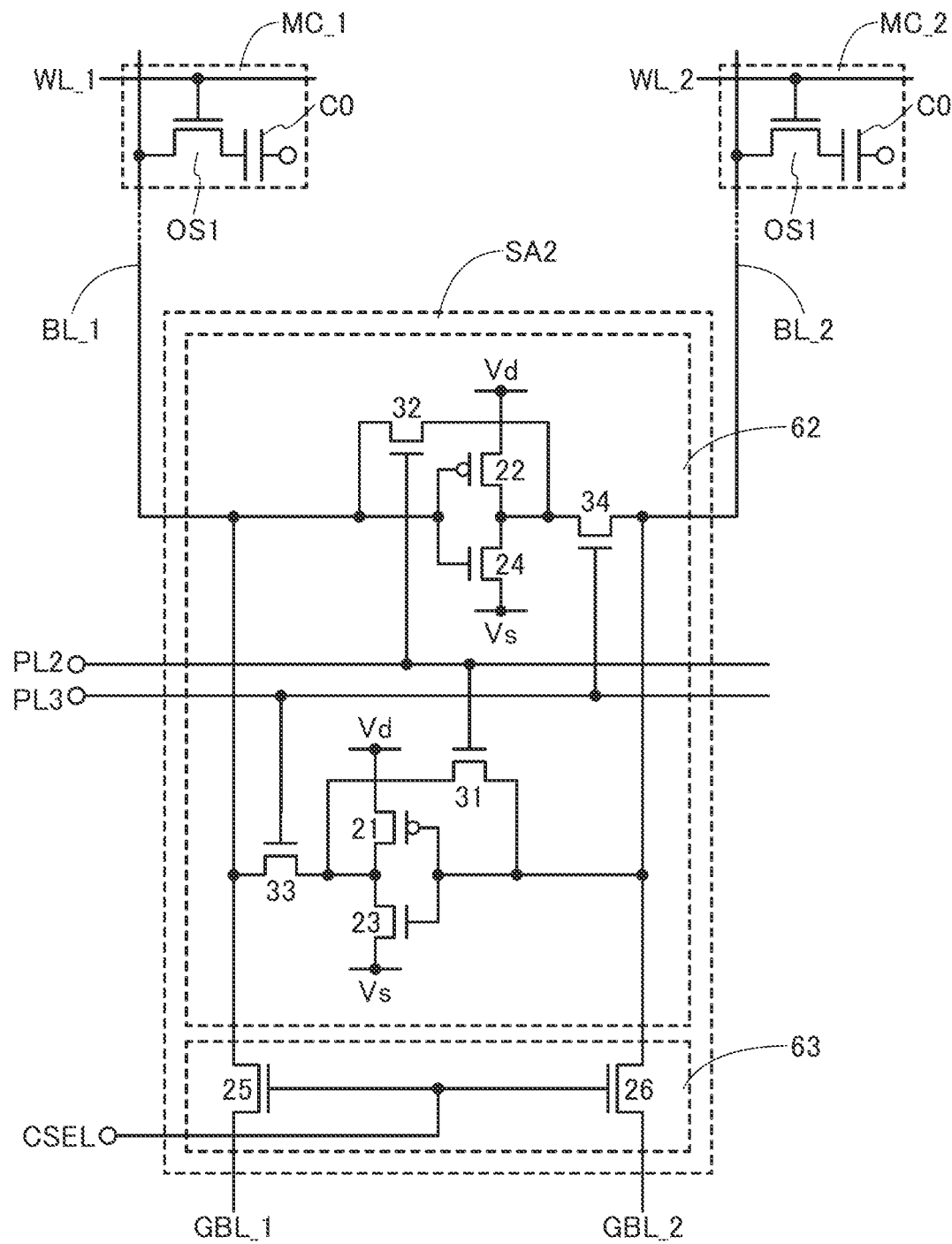
FIG. 15 is a circuit diagram illustrating a configuration example of a memory cell and a sense amplifier.

The sense amplifier SA2 in FIG. 15 is different from the sense amplifier SA1 in that it does not include the precharge circuit 64 and the amplifier circuit 62 does not include the capacitors C11 and C12. In the following description of the configuration example of the sense amplifier SA2, the description of the sense amplifier SA1 is referred to for the same components as the sense amplifier SA1.

FIG. 15 illustrates an example of a circuit configuration of the memory cells MC and the sense amplifier SA2 electrically connected to the memory cells MC. The memory cells MC are connected to the sense amplifier SA2 through the wirings BL. In the example shown here, the memory cell MC_1 is connected to the sense amplifier SA2 through the wiring BL_1, and the memory cell MC_2 is connected to the sense amplifier SA2 through the wiring BL_2.

The sense amplifier SA2 includes the amplifier circuit 62 and the switch circuit 63.

The amplifier circuit 62 includes the p-channel transistors 21 and 22 and the n-channel transistors 23, 24, and 31 to 34.

Figure 16:
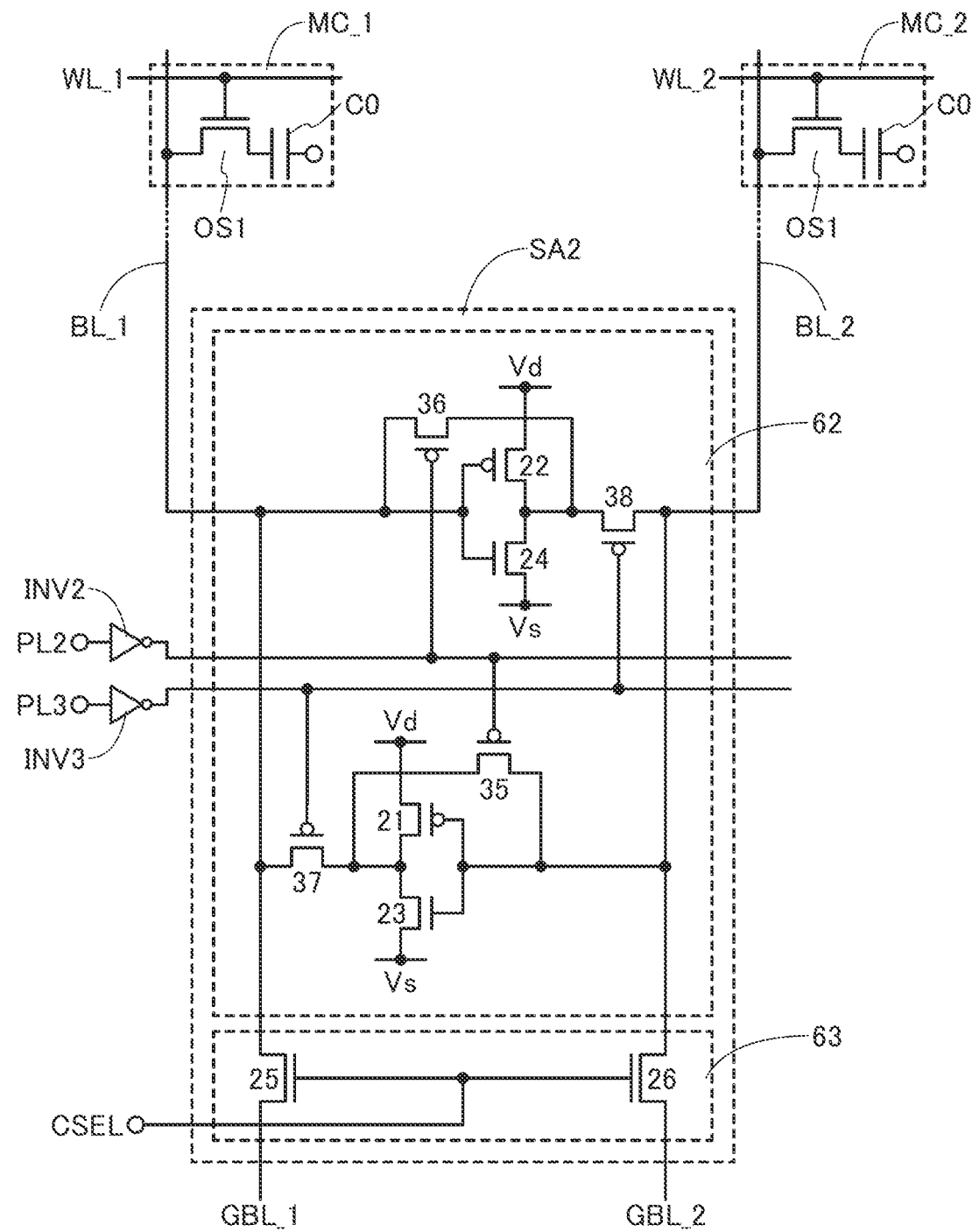
FIG. 16 is a circuit diagram illustrating a configuration example of a memory cell and a sense amplifier.

Here, the n-channel transistors 31 to 34 may be p-channel transistors. FIG. 16 illustrates a circuit configuration example of the sense amplifier SA2 where the p-channel transistors 35 to 38 are used instead of the transistors 31 to 34. In that case, each gate of the transistors 35 to 38 is connected to the wiring PL2 through the inverter INV2 or to the wiring PL3 through the inverter INV3 to invert the logic.

Figure 17:
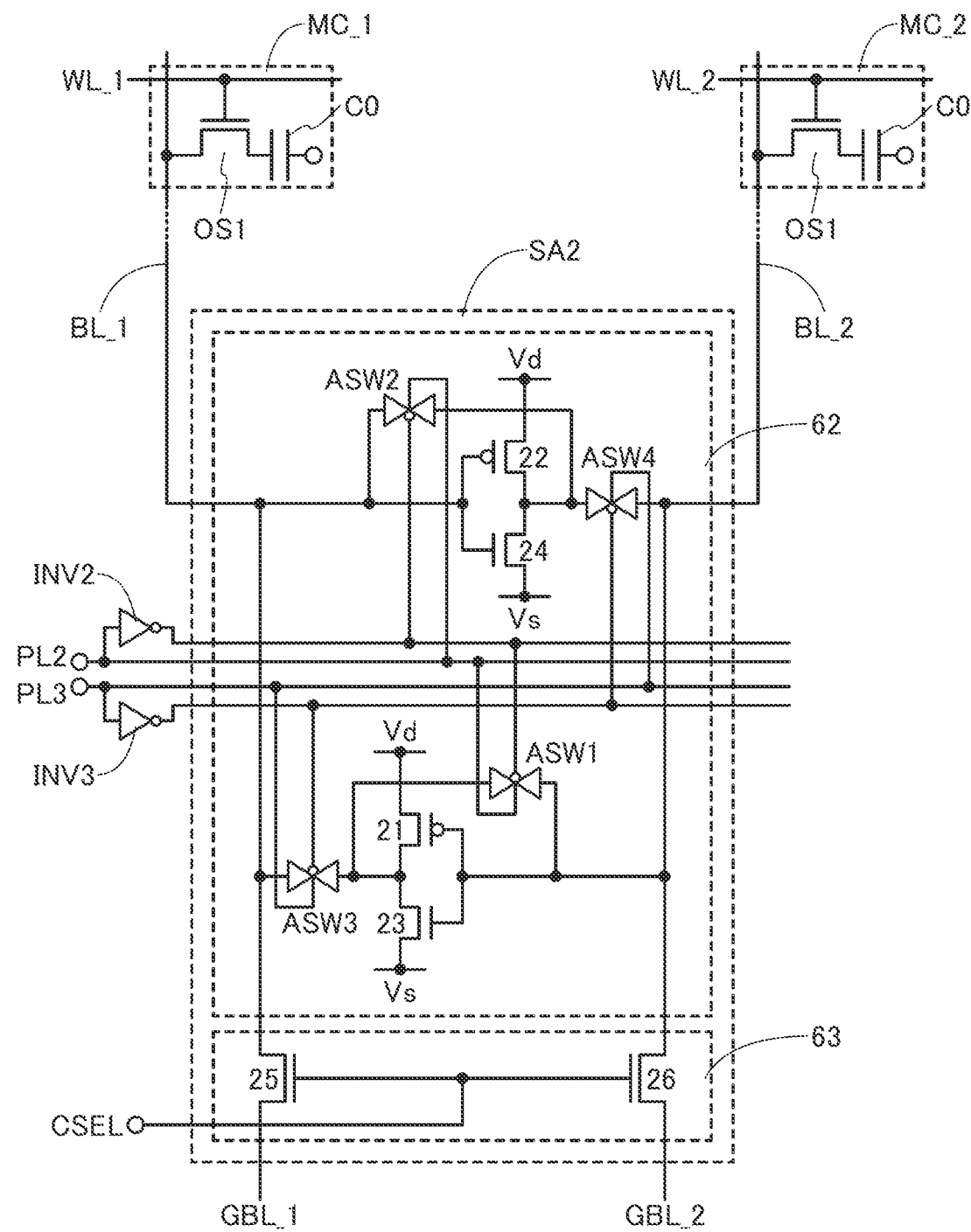
FIG. 17 is a circuit diagram illustrating a configuration example of a memory cell and a sense amplifier.

Alternatively, the n-channel transistors 31 to 34 may be analog switches. FIG. 17 illustrates a circuit configuration example of the sense amplifier SA2 where the analog switches ASW1 to ASW4 are used instead of the transistors 31 to 34.

Figure 18:
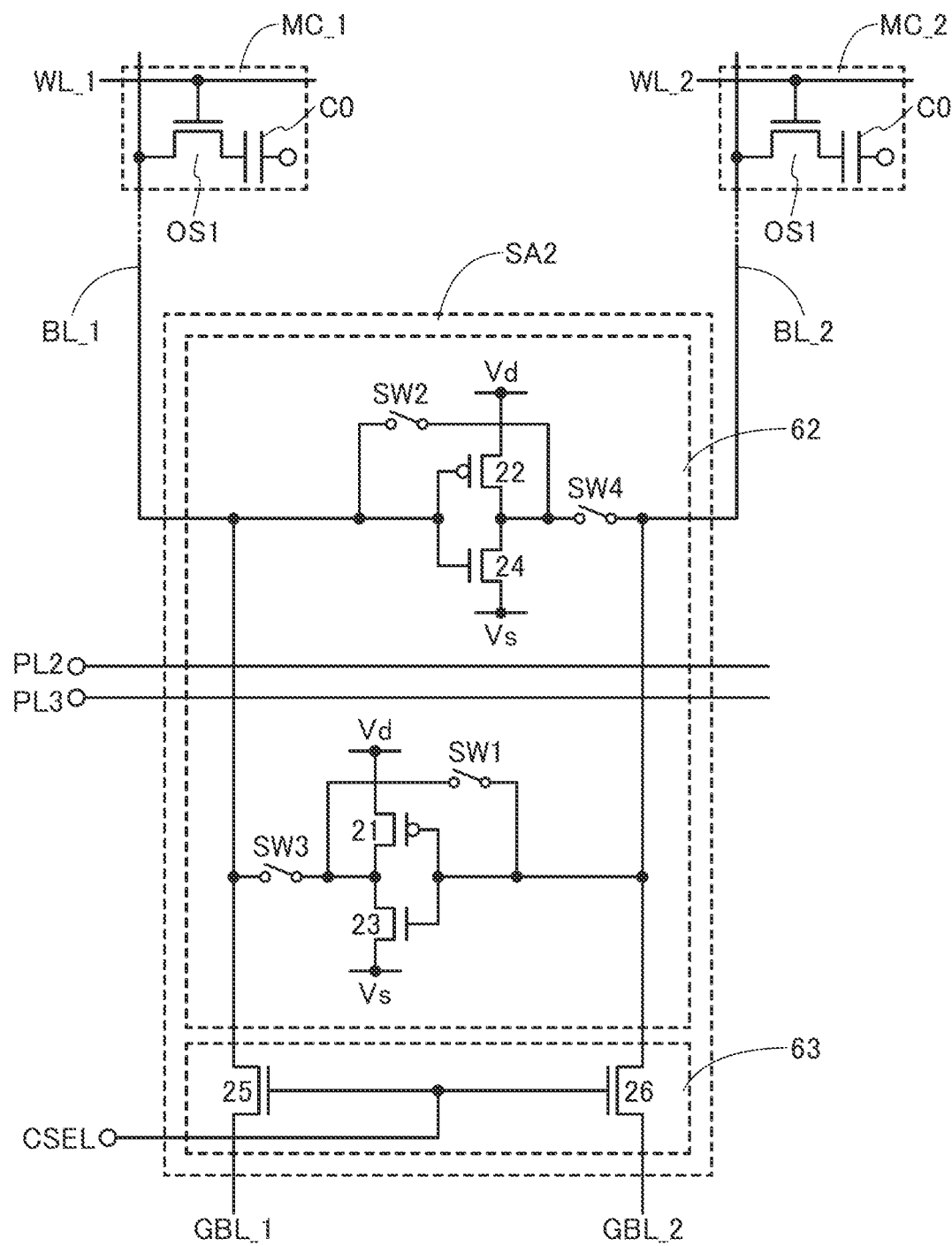
FIG. 18 is a circuit diagram illustrating a configuration example of a memory cell and a sense amplifier.

Further alternatively, the n-channel transistors 31 to 34 may be some kinds of switching elements. FIG. 18 illustrates a circuit configuration example of the sense amplifier SA2 where the switches SW1 to SW4 are used instead of the transistors 31 to 34.

For the transistors 21 and 22, the description of the sense amplifier SA1 is referred to.

One of the source and the drain of the transistor 21 is connected to the wiring Vd, and the other of the source and the drain thereof is connected to one of the source and the drain of the transistor 23, one of the source and the drain of the transistor 31, and one of the source and the drain of the transistor 33 (see FIG. 15). The other of the source and the drain of the transistor 23 is connected to the wiring Vs, and the other of the source and the drain of the transistor 33 is connected to the wiring BL_1. The other of the source and the drain of the transistor 31 is connected to the gate of the transistor 21, the gate of the transistor 23, and the wiring BL_2. The gate of the transistor 31 is connected to the wiring PL2 and the gate of the transistor 33 is connected to the wiring PL3.

One of the source and the drain of the transistor 22 is connected to the wiring Vd, and the other of the source and the drain thereof is connected to one of the source and the drain of the transistor 24, one of the source and the drain of the transistor 32, and one of the source and the drain of the transistor 34. The other of the source and the drain of the transistor 24 is connected to the wiring Vs, and the other of the source and the drain of the transistor 34 is connected to the wiring BL_2. The other of the source and the drain of the transistor 32 is connected to the gate of the transistor 22, the gate of the transistor 24, and the wiring BL_1. The gate of the transistor 32 is connected to the wiring PL2 and the gate of the transistor 34 is connected to the wiring PL3.

The wiring Vd is a wiring for supplying the high-potential power supply VH_SP, and the wiring Vs is a wiring for supplying the low-potential power supply VL_SN. Note that the high-potential power supply VH_SP and the low-potential power supply VL_SN may be supplied intermittently. That is, the high-potential power supply VH_SP and the low-potential power supply VL_SN are supplied through the wiring Vd and the wiring Vs, respectively, in some periods, and are not supplied in other periods.

The amplifier circuit 62 has a function of amplifying the potential of the wiring BL_1 and the potential of the wiring BL_2. Note that the sense amplifier SA2 including the amplifier circuit 62 illustrated in FIG. 15 functions as a latch sense amplifier.

Figure 19A:
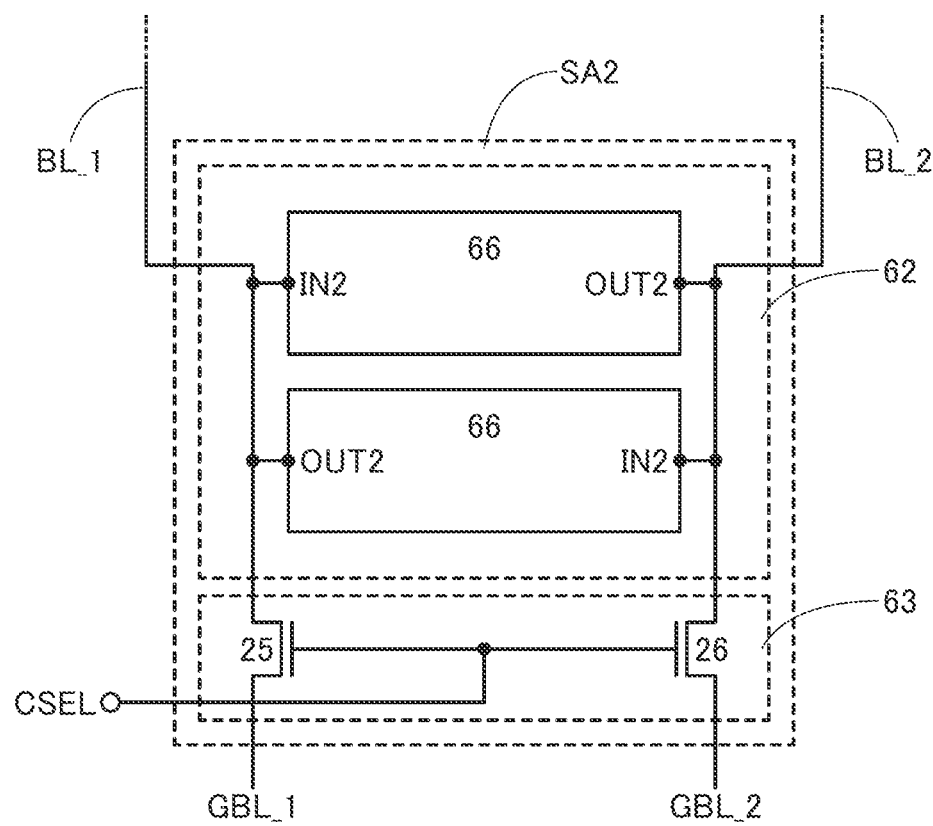
FIG. 19A is a circuit diagram illustrating a configuration example of a sense amplifier and FIG. 19B is a circuit diagram illustrating a configuration example of an amplifier circuit.
Figure 19B:
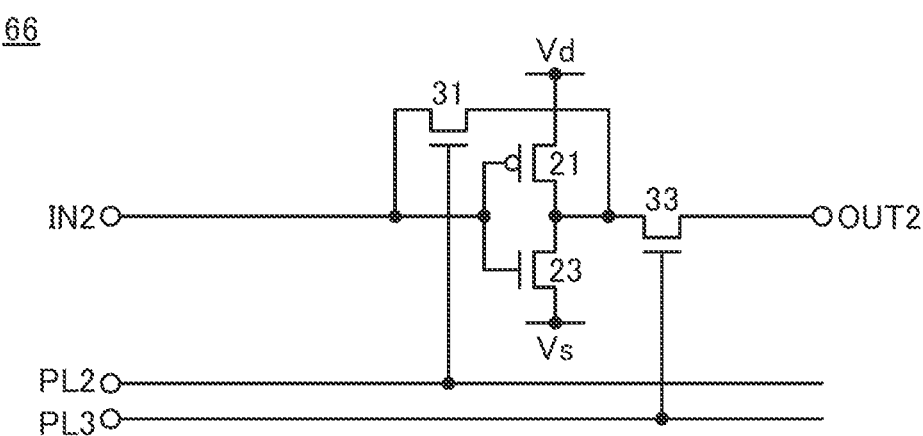

Note that the amplifier circuit 62 may have two amplifier circuits 66. FIG. 19A illustrates a circuit configuration example of the sense amplifier SA2 where the amplifier circuit 62 includes two amplifier circuits 66. FIG. 19B illustrates a circuit configuration example of the amplifier circuit 66.

As illustrated in FIG. 19A, the amplifier circuit 62 includes the two amplifier circuits 66, and each amplifier circuit 66 includes an input terminal IN2 and an output terminal OUT2. In one amplifier circuit 66, the input terminal IN2 is connected to the wiring BL_1 and the output terminal OUT2 is connected to the wiring BL_2. In the other amplifier circuit 66, the input terminal IN2 is connected to the wiring BL_2 and the output terminal OUT2 is connected to the wiring BL_1.

The amplifier circuit 66 includes the p-channel transistor 21 and the n-channel transistors 23, 31, and 33.

One of the source and the drain of the transistor 21 is connected to the wiring Vd and the other of the source and the drain thereof is connected to one of the source and the drain of the transistor 23, one of the source and the drain of the transistor 31, and one of the source and the drain of the transistor 33. The other of the source and the drain of the transistor 23 is connected to the wiring Vs and the other of the source and the drain of the transistor 33 is connected to the output terminal OUT2. The other of the source and the drain of the transistor 31 is connected to the gate of the transistor 21, the gate of the transistor 23, and the input terminal IN2. The gate of the transistor 31 is connected to the wiring PL2 and the gate of the transistor 33 is connected to the wiring PL3.

For the switch circuit 63, the description of the sense amplifier SA1 is referred to.

<Operation Example 1 of Sense Amplifier SA2>

Next, an operation example of the memory cell MC and the sense amplifier SA2 illustrated in FIG. 15 at the time of reading data will be described with reference to the timing chart in FIG. 20.

In a period T1, the transistors 31 and 32 in the amplifier circuit 62 are turned on, so that the potentials of the wirings BL_1 and BL_2 are initialized. Specifically, the high-level potential VH_PL is supplied to the wiring PL2 to turn on the transistors 31 and 32 in the amplifier circuit 62.

The transistors 21 and 23 form an inverter, and thus the potential of the wiring BL_2 becomes an intermediate potential corresponding to the characteristics of the transistors 21 and 23 when the transistor 31 is turned on to establish conduction between an input and an output of the inverter. This potential is referred to as Vbl2. The intermediate potential Vbl2 is determined while the influence of characteristic variation of the transistors 21 and 23 is reflected, and the inverter including the transistors 21 and 23 can react sensitively when the input potential changes from Vbl2.

Similarly, the transistors 22 and 24 form an inverter, and thus the potential of the wiring BL_1 becomes an intermediate potential corresponding to the characteristics of the transistors 22 and 24 when the transistor 32 is turned on to establish conduction between an input and an output of the inverter. This potential is referred to as Vbl1. The intermediate potential Vbl1 is determined while the influence of characteristic variation of the transistors 22 and 24 is reflected, and the inverter including the transistors 22 and 24 can react sensitively when the input potential changes from Vbl1.

Note that in the period T1, the low-level potential VL_CSEL is supplied to the wiring CSEL, and accordingly, the transistors 25 and 26 in the switch circuit 63 are off. The low-level potential VL_WL is supplied to the wiring WL_1, and accordingly, the transistor OS1 in the memory cell MC_1 is off. Similarly, although not illustrated in FIG. 20, the low-level potential VL_WL is supplied to the wiring WL_2, and accordingly, the transistor OS1 in the memory cell MC_2 is off.

Then, the low-level potential VL_PL is supplied to the wiring PL2 to turn off the transistors 31 and 32 in the amplifier circuit 62.

At the timing when the low-level potential VL_PL is supplied to the wiring PL2, the supply of the high-potential power supply VH_SP and the low-potential power supply VL_SN may be stopped. When the supply of the high-potential power supply VH_SP and the low-potential power supply VL_SN is stopped, a shoot-through current can be prevented from flowing through the transistors 21 and 23 and through the transistors 22 and 24, and thus power consumption can be reduced. Moreover, in the case where the supply of the high-potential power supply VH_SP and the low-potential power supply VL_SN is stopped, the supply is restarted at the timing when the high-level potential VH_PL is supplied to the wiring PL3 in a period T3 to be described later.

In a period T2, the wiring WL_1 is selected. Specifically, the high-level potential VH_WL is supplied to the wiring WL_1 to turn on the transistor OS1 in the memory cell MC_1. This operation establishes conduction between the wiring BL_1 and the capacitor C0 through the transistor OS1. When the conduction is established between the wiring BL_1 and the capacitor C0, the potential of the wiring BL_1 changes in accordance with the amount of charge held in the capacitor C0.

Figure 20:
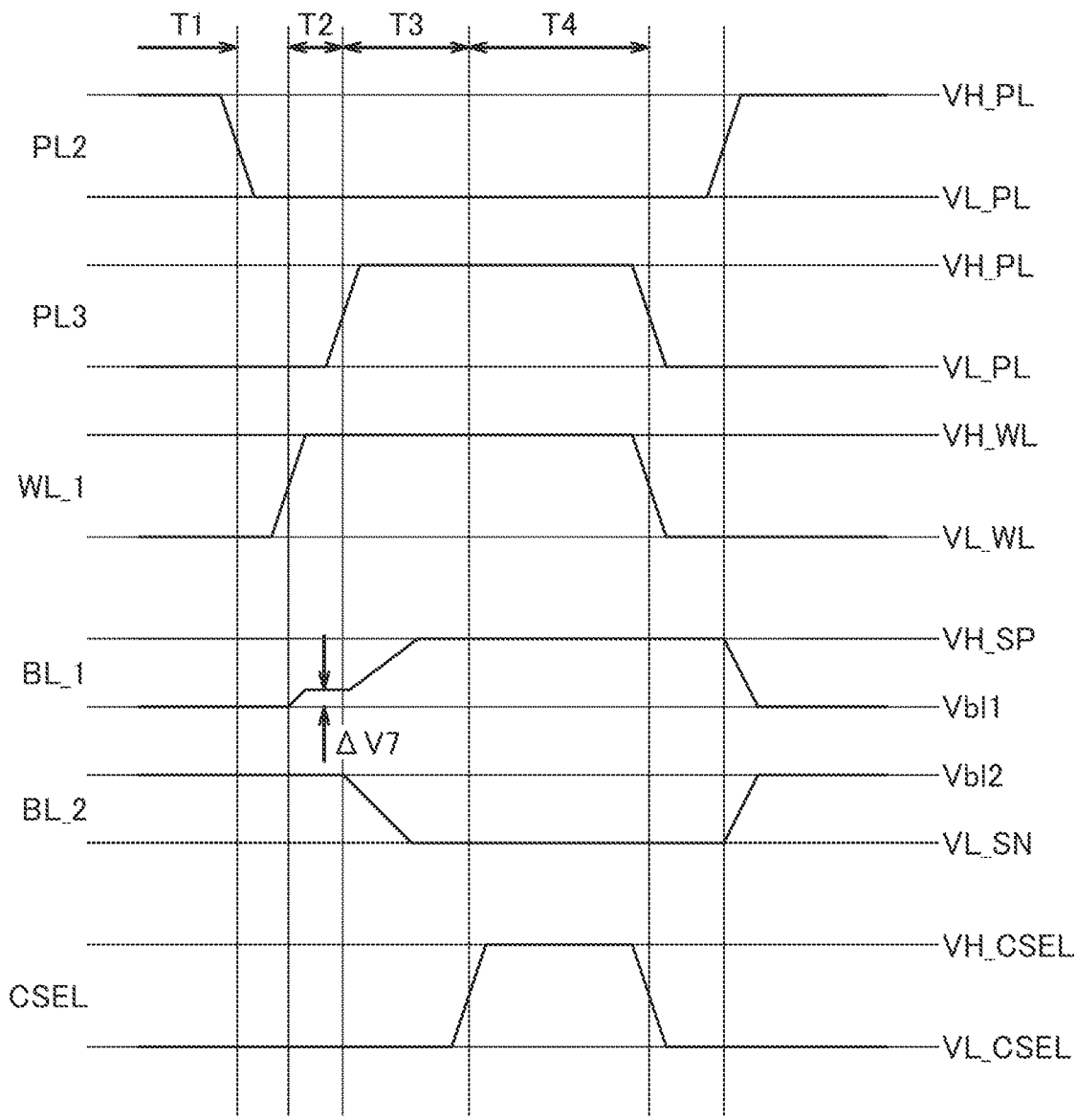
FIG. 20 is a timing chart.

The timing chart in FIG. 20 shows the case where the amount of charge held in the capacitor C0 is large. In the case where the amount of charge held in the capacitor C0 is large, charge is released from the capacitor C0 to the wiring BL_1, so that the potential of the wiring BL_1 is increased from the potential Vbl1 by ΔV7. By contrast, in the case where the amount of charge held in the capacitor C0 is small, charge flows from the wiring BL_1 into the capacitor C0, so that the potential of the wiring BL_1 is decreased by ΔV8 (not illustrated).

When the potential of the BL_1 is increased from the intermediate potential Vbl1 corresponding to the characteristics of the transistors 22 and 24 by ΔV7, the inverter including the transistors 22 and 24 output the low-potential power supply VL_SN.

Note that in the period T2, the low-level potential VL_CSEL is kept supplied to the wiring CSEL, so that the transistors 25 and 26 in the switch circuit 63 remain off.

Next, in the period T3, the transistors 33 and 34 in the amplifier circuit 62 are turned on to obtain an output from the amplifier circuit 62 to the wirings BL_1 and BL_2. Specifically, the high-level potential VH_PL is supplied to the wiring PL3 to turn on the transistors 33 and 34 in the amplifier circuit 62.

In the case of FIG. 20 (in the case where the amount of charge held in the capacitor C0 is large), the amplifier circuit 62 outputs the low-potential power supply VL_SN to the wiring BL_2 when the transistors 33 and 34 in the amplifier circuit 62 are tuned on. As the potential of the wiring BL_2 is decreased from Vbl2 to approach the low-potential power supply VL_SN, the inverter including the transistors 21 and 23 outputs the high-potential power supply VH_SP. Then, the amplifier circuit 62 outputs the high-potential power supply VH_SP to the wiring BL_1, and the potential of the wiring BL_1 is increased from Vbl1+ΔV7 to approach the high-potential power supply VH_SP.

Note that in the case where the amount of charge held in the capacitor C0 is small and the potential of the wiring BL_1 at the beginning of the period T3 is the potential Vbl1−ΔV8, when the transistors 33 and 34 are turned on, the potential of the wiring BL_2 is increased from Vbl2 to approach the high-potential power supply VH_SP, and the potential of the wiring BL_1 is decreased from the potential Vbl1−ΔV8 to approach the low-potential power supply VL_SN.

Note that in the period T3, the low-level potential VL_CSEL is kept supplied to the wiring CSEL, so that the transistors 25 and 26 in the switch circuit 63 remain off. The high-level potential VH_WL is kept supplied to the wiring WL_1, so that the transistor OS1 in the memory cell MC_1 remains on; thus, charge corresponding to the potential VH_SP of the wiring BL_1 is accumulated in the capacitor C0 in the memory cell MC_1.

In a period T4, the potential supplied to the wiring CSEL is controlled to turn on the switch circuit 63. Specifically, the high-level potential VH_CSEL is supplied to the wiring CSEL, so that the transistors 25 and 26 in the switch circuit 63 are turned on. Thus, the potential of the wiring BL_1 is supplied to the wiring GBL_1, and the potential of the wiring BL_2 is supplied to the wiring GBL_2.

Note that in the period T4, the high-level potential VH_WL is kept supplied to the wiring WL_1, so that the transistor OS1 in the memory cell MC_1 remains on; thus, charge corresponding to the potential VH_SP of the wiring BL_1 remains accumulated in the capacitor C0 in the memory cell MC_1.

When the period T4 is over, the potential supplied to the wiring CSEL is controlled to turn off the switch circuit 63. Specifically, the low-level potential VL_CSEL is supplied to the wiring CSEL, so that the transistors 25 and 26 in the switch circuit 63 are turned off. In addition, a low-level potential VL_PL is supplied to the wiring PL3 to turn off the transistors 33 and 34 in the amplifier circuit 62.

When the period T4 is over, the wiring WL_1 is deselected. Specifically, the low-level potential VL_WL is supplied to the wiring WL_1, whereby the transistor OS1 in the memory cell MC_1 is turned off. Through the above operation, the charge corresponding to the potential VH_SP of the wiring BL_1 is held in the capacitor C0. Data is stored in the memory cell MC_1 even after the data is read.

Through the operation in the periods T1 to T4, data is read from the memory cell MC_1. Data in the memory cell MC_2 can be read similarly.

Moreover, data can be written to the memory cell MC on the basis of the above principle. Specifically, in a manner similar to that used for reading data, the transistors 31 and 32 in the amplifier circuit 62 are turned on first, so that the potentials of the wirings BL_1 and BL_2 are initialized.

Then, the wiring WL_1 connected to the memory cell MC_1 to which data is to be written or the wiring WL_2 connected to the memory cell MC_2 to which data is to be written is selected to turn on the transistor OS1 in the memory cell MC_1 or MC_2. This operation establishes conduction between the wiring BL_1 or the wiring BL_2 and the capacitor C0 through the transistor OS1.

Then, the potential supplied to the wiring CSEL is controlled to turn on the switch circuit 63. Consequently, conduction is established between the wirings BL_1 and GBL_1 and between the wirings BL_2 and GBL_2.

Writing potentials are supplied to the wirings GBL_1 and GBL_2, whereby the writing potentials are supplied to the wirings BL_1 and BL_2 through the switch circuit 63. Consequently, charge is accumulated in the capacitor C0 in accordance with the potential of the wiring BL_1 or BL_2 and thus data is written to the memory cell MC_1 or MC_2.

Note that after the potential of the wiring GBL_1 is supplied to the wiring BL_1 and the potential of the wiring GBL_2 is supplied to the wiring BL_2, the relation in level between the potential of the wiring BL_1 and the potential of the wiring BL_2 is maintained by the amplifier circuit 62 even after the transistors 25 and 26 in the switch circuit 63 are turned off.

<Operation Example 2 of Sense Amplifier SA2>

In the memory cells MC and the sense amplifier SA2 illustrated in FIG. 15, as in the operation example 2 of the sense amplifier SA1, the transistors 33 and 34 can be turned on in addition to the transistors 31 and 32 in the amplifier circuit 62 in the period T1.

In that case, unlike the sense amplifier SA1, the sense amplifier SA2 does not include the capacitors C11 and C12, and thus both of the potentials Vbl1 and Vbl2 are output to each of the wirings BL_1 and BL_2. That is, the inverter including the transistors 21 and 23 outputs the potential Vbl2 to the wirings BL_1 and BL_2, and the inverter including the transistors 22 and 24 outputs the potential Vbl1 to the wirings BL_1 and BL_2.

As a result, the potentials of the wirings BL_1 and BL_2 each become the intermediate potential between the potentials Vbl1 and Vbl2. When both of the potentials Vbl1 and Vbl2 are output to each of the wirings BL_1 and BL_2, the potentials of the wirings BL_1 and BL_2 can each be the intermediate potential corresponding to the characteristics of the transistors 21 to 24.

As described above, according to one embodiment of the present invention, the sense amplifier that is less likely to be influenced by a variation in transistor characteristics can be formed by initializing the potential of a wiring or a node to a potential corresponding to the transistor characteristics. Even when a transistor, a capacitor, and the like are miniaturized and influence of variation in the characteristics with respect to power source voltage increases, a sense amplifier with high accuracy can be formed. Note that the structures, operation methods, and the like described in this embodiment can be implemented in combination as appropriate.

This embodiment can be implemented in combination with any of the other embodiments described in this specification as appropriate.

Embodiment 2

In this embodiment, an example of the semiconductor device described in the above embodiment is described with reference to FIGS. 21A and 21B, FIGS. 22A and 22B, FIG. 23, and FIG. 24. In addition, a metal oxide that can be used in the OS transistor is described. In particular, the details of a metal oxide and a cloud-aligned composite (CAC) will be described below.

<Structure Example of Semiconductor Device>

FIGS. 21A and 21B, FIGS. 22A and 22B, and FIG. 23 are a top view and cross-sectional views each illustrating a semiconductor device 600 including a transistor 200, a transistor 500, and a capacitor 100 of one embodiment of the present invention. Note that the transistor 200 and the transistor 500 each include a back gate.

Note that the semiconductor device 600 corresponds to part of the amplifier circuit 62 in the sense amplifier SA1; the transistor 200, the transistor 500, and the capacitor 100 correspond to the transistor 31, the transistor 23, and the capacitor C11, respectively. Alternatively, the transistor 200, the transistor 500, and the capacitor 100 correspond to the transistor 32, the transistor 24, and the capacitor C12, respectively.

Moreover, in the case where the transistors 21 and 22 in the amplifier circuit 62 of the sense amplifier SA1 are n-channel transistors, the transistor 500 may correspond to the transistor 21 or the transistor 22.

Figure 21A:
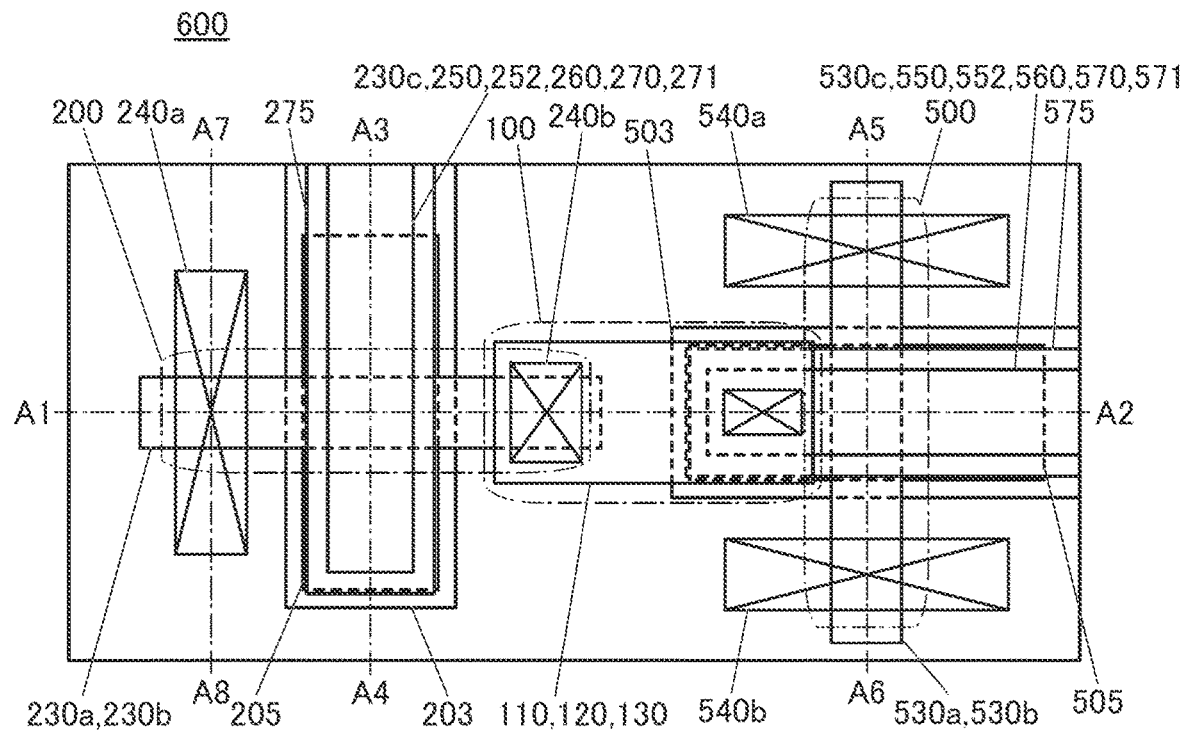
FIGS. 21A and 21B are a top view and a cross-sectional view illustrating a semiconductor device.

FIG. 21A is a top view of the semiconductor device 600. FIGS. 21B, 22A, 22B, and 23 are cross-sectional views of the semiconductor device 600.

Figure 21B:
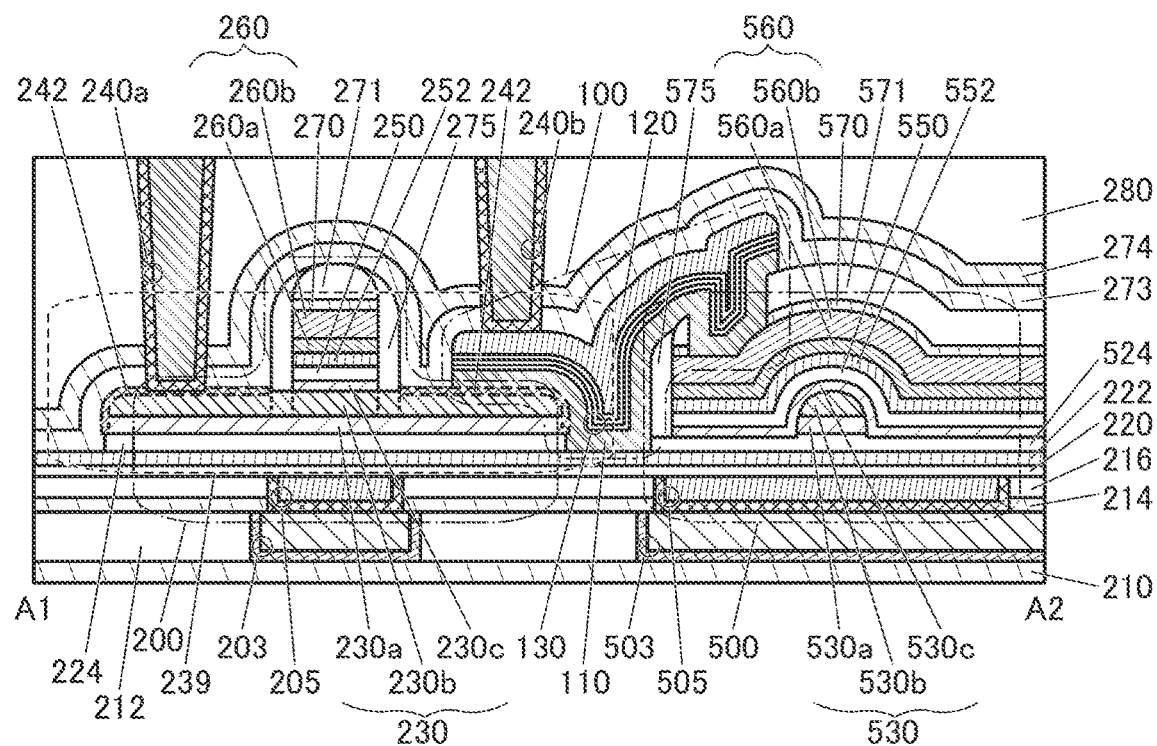
Figure 22A:
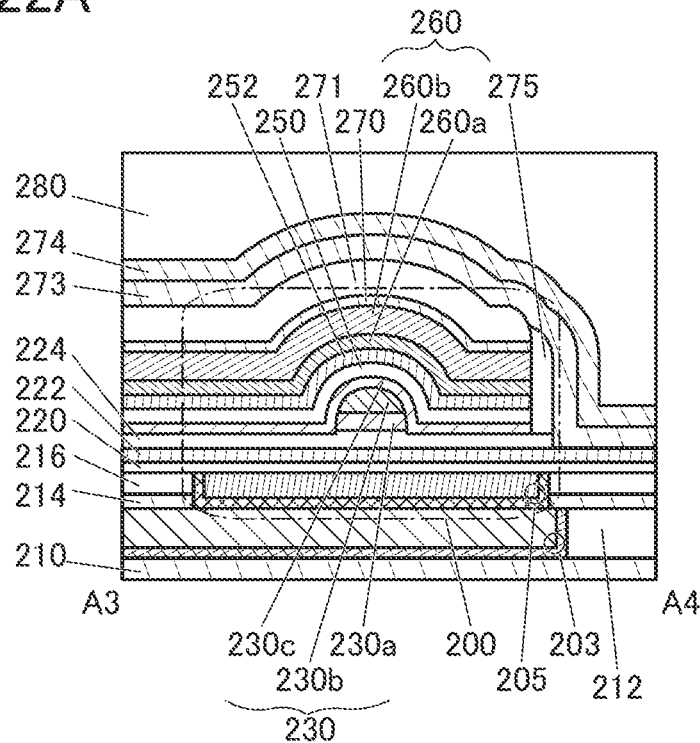
FIGS. 22A and 22B are cross-sectional views illustrating a semiconductor device.
Figure 22B:
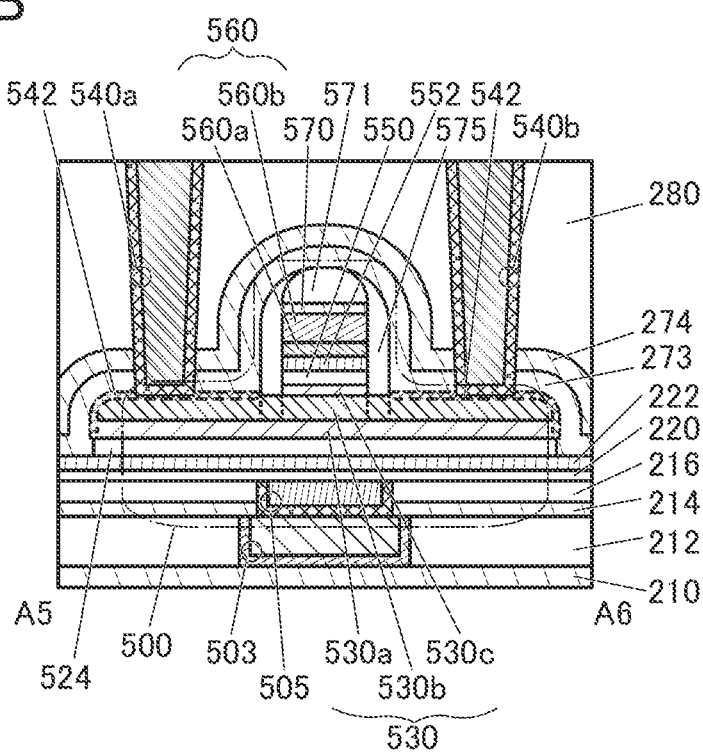
Figure 23:
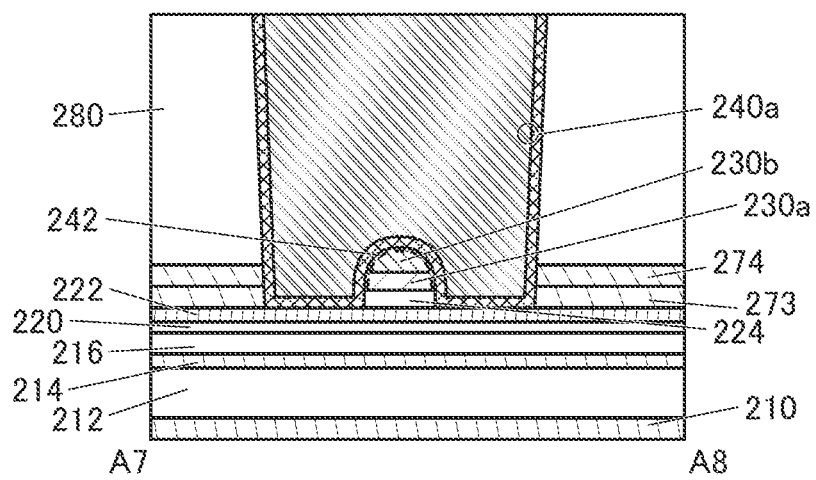
FIG. 23 is a cross-sectional view illustrating a semiconductor device.

Here, FIG. 21B is a cross-sectional view taken along dashed-dotted line A1-A2 in FIG. 21A, which corresponds to a cross section in a channel length direction of the transistor 200 and in a channel width direction of the transistor 500. FIG. 22A is a cross-sectional view taken along dashed-dotted line A3-A4 in FIG. 21A, which corresponds to a cross section in the channel width direction of the transistor 200. FIG. 22B is a cross-sectional view taken along dashed-dotted line A5-A6 in FIG. 21A, which corresponds to a cross section in the channel length direction of the transistor 500. FIG. 23 is a cross-sectional view taken along dashed-dotted line A7-A8 in FIG. 21A, which corresponds to a cross section of a source region or a drain region of the transistor 200. Note that for simplification of the drawing, some components in the top view in FIG. 21A are not illustrated.

The semiconductor device 600 includes the transistor 200, the transistor 500, the capacitor 100, and an insulator 210, an insulator 212, an insulator 273, an insulator 274, and an insulator 280, each of which functions as an interlayer film. The semiconductor device 600 further includes a conductor 203 functioning as a wiring and a conductor 240 (a conductor 240a and a conductor 240b) functioning as a plug. The conductor 203 and the conductor 240 are electrically connected to the transistor 200. The semiconductor device 600 further includes a conductor 503 functioning as a wiring and a conductor 540a functioning as a plug. The conductor 503 and the conductor 540a are electrically connected to the transistor 500. The semiconductor device 600 further includes a conductor 540b functioning as a plug and electrically connected to the capacitor 100. Note that the conductor 540a and the conductor 540b are sometimes collectively referred to as conductor 540 in the following description. Note that the conductor 503 is formed in the same layer as the conductor 203 and has a structure similar to that of the conductor 203. Also, the conductor 540 is formed in the same layer as the conductor 240 and has a structure similar to that of the conductor 240. Thus, for the conductor 503 and the conductor 540, the description of the conductor 203 and the conductor 240 can be referred to, respectively.

Note that in the conductor 203, a first conductor is formed in contact with an inner wall of an opening of the insulator 212 and a second conductor is formed inside the first conductor. Here, the top surface of the conductor 203 can be at substantially the same level as the top surface of the insulator 212. Although the first conductor and the second conductor of the conductor 203 are stacked in this embodiment, the present invention is not limited thereto. For example, the conductor 203 may have a single-layer structure or a stacked-layer structure of three or more layers. Note that in the case where a stacked-layer structure is used, the layers may be distinguished by ordinal numbers corresponding to the formation order. Note that the conductor 503 has a structure similar to that of the conductor 203.

The insulator 273 is positioned over the transistor 200, the transistor 500, and the capacitor 100. The insulator 274 is positioned over the insulator 273. The insulator 280 is positioned over the insulator 274.

The conductor 240 is formed in contact with an inner wall of an opening of the insulators 273, 274, and 280. Here, the top surface of the conductor 240 can be at substantially the same level as the top surface of the insulator 280. Although the conductor 240 has a two-layer structure in this embodiment, the present invention is not limited thereto. For example, the conductor 240 may have a single-layer structure or a stacked-layer structure of three or more layers. Note that the conductor 540 has a structure similar to that of the conductor 240.

As illustrated in FIGS. 21A and 21B and FIG. 22A, the transistor 200 includes insulators 214 and 216 positioned over a substrate (not illustrated), a conductor 205 positioned to be embedded in the insulators 214 and 216, an insulator 220 positioned over the insulator 216 and the conductor 205, an insulator 222 positioned over the insulator 220, an insulator 224 positioned over the insulator 222, an oxide 230 (an oxide 230a, an oxide 230b, and an oxide 230c) positioned over the insulator 224, an insulator 250 positioned over the oxide 230, a metal oxide 252 positioned over the insulator 250, a conductor 260 (a conductor 260a and a conductor 260b) positioned over the metal oxide 252, an insulator 270 positioned over the conductor 260, an insulator 271 positioned over the insulator 270, an insulator 275 positioned in contact with at least the side surfaces of the oxide 230c, the insulator 250, the metal oxide 252, and the conductor 260, and layers 242 formed over the oxide 230. The conductor 240a is positioned in contact with one of the layers 242.

In the transistor 200, one of the layers 242 functions as one of a source and a drain, the other of the layers 242 functions as the other of the source and the drain, the conductor 260 functions as a front gate, and the conductor 205 functions as a back gate. The conductor 240*b* is electrically connected to a conductor corresponding to the wiring BL_1 or the wiring BL_2. The conductor 260 is electrically connected to a conductor corresponding to the wiring PL2.

As illustrated in FIGS. 21A and 21B and FIG. 22B, the transistor 500 includes the insulators 214 and 216 positioned over the substrate (not illustrated), a conductor 505 positioned to be embedded in the insulators 214 and 216, the insulator 220 positioned over the insulator 216 and the conductor 505, the insulator 222 positioned over the insulator 220, an insulator 524 positioned over the insulator 222, an oxide 530 (an oxide 530*a*, an oxide 530*b*, and an oxide 530*c*) positioned over the insulator 524, an insulator 550 positioned over the oxide 530, a metal oxide 552 positioned over the insulator 550, a conductor 560 (a conductor 560*a* and a conductor 560*b*) positioned over the metal oxide 552, an insulator 570 positioned over the conductor 560, an insulator 571 positioned over the insulator 570, and an insulator 575 positioned in contact with at least the side surfaces of the oxide 530*c*, the insulator 550, the metal oxide 552, and the conductor 560, and layers 542 formed over the oxide 530. The conductor 540*a* is positioned in contact with one of the layers 542 and the conductor 540*b* is positioned in contact with the other of the layers 542.

In the transistor 500, one of the layers 542 functions as one of a source and a drain, the other of the layers 542 functions as the other of the source and the drain, the conductor 560 functions as a front gate, and the conductor 505 functions as a back gate. The conductor 560 is electrically connected to a conductor 110 corresponding to the node N11 or the node N12.

Here, the transistor 500 is formed in the same layer as the transistor 200 and has a structure similar to that of the transistor 200. Thus, the oxide 530 has a structure similar to that of the oxide 230 and the description of the oxide 230 can be referred to for the oxide 530. The conductor 505 has a structure similar to that of the conductor 205, and thus the description of the conductor 205 can be referred to for the conductor 505. The insulator 524 has a structure similar to that of the insulator 224, and thus the description of the insulator 224 can be referred to for the insulator 524. The insulator 550 has a structure similar to that of the insulator 250, and thus the description of the insulator 250 can be referred to for the insulator 550. The metal oxide 552 has a structure similar to that of the metal oxide 252, and thus the description of the metal oxide 252 can be referred to for the metal oxide 552. The conductor 560 has a structure similar to that of the conductor 260, and thus the description of the conductor 260 can be referred to for the conductor 560. The insulator 570 has a structure similar to that of the insulator 270, and thus the description of the insulator 270 can be referred to for the insulator 570. The insulator 571 has a structure similar to that of the insulator 271, and thus the description of the insulator 271 can be referred to for the insulator 571. The insulator 575 has a structure similar to that of the insulator 275, and thus the description of the insulator 275 can be referred to for the insulator 575. Unless otherwise specified, as described above, the description of the structure of the transistor 200 can be referred to for the structure of the transistor 500 in the following description.

Although the transistor 200 has a structure in which the oxide 230*a*, the oxide 230*b*, and the oxide 230*c* are stacked, the present invention is not limited thereto. For example, the transistor 200 may have a single-layer structure of the oxide 230*b*, a two-layer structure of the oxide 230*b* and the oxide 230*a* or 230*c*, or a stacked-layer structure of four or more layers. The same applies to the oxide 530 of the transistor 500. Similarly, although the transistor 200 has a structure in which the conductor 260*a* and the conductor 260*b* are stacked, the present invention is not limited thereto. The same applies to the conductor 560 of the transistor 500.

The capacitor 100 includes the conductor 110, an insulator 130 over the conductor 110, and a conductor 120 over the insulator 130. The conductor 120 is preferably positioned so that at least part of the conductor 120 overlaps with the conductor 110 with the insulator 130 therebetween. Furthermore, the conductor 240*b* is positioned in contact with the top surface of the conductor 120. The conductor 110 is in contact with one of the layers 242 functions as one of the source and the drain of the transistor 200, and in contact with the conductor 560 through an opening of the insulators 570 and 571.

In the capacitor 100, the conductor 110 functions as one electrode and the conductor 120 functions as the other electrode. The insulator 130 functions as a dielectric of the capacitor 100. The conductor 240*b* is electrically connected to a conductor corresponding to the wiring BL_1 or the wiring BL_2. Here, the conductor 110 is connected to one of the source and the drain of the transistor 200 and a gate of the transistor 500, and functions as the node N11 or the node N12.

As illustrated in FIG. 21A, the capacitor 100 is formed so as to partly overlap with the transistor 200 and the transistor 500. Accordingly, the total projected area of the transistor 200, the transistor 500, and the capacitor 100 can be reduced, and thus the area occupied by the semiconductor device 600 can be reduced. Thus, the semiconductor device can be easily miniaturized and highly integrated. Furthermore, the transistor 200, the transistor 500, and the capacitor 100 can be formed in the same process, and thus the process can be shortened, leading to an improvement in productivity.

Note that in the semiconductor device 600, the transistor 200, the transistor 500, and the capacitor 100 are provided so that the channel length directions of the transistors 200 and 500 are orthogonal to each other; however, the semiconductor device of this embodiment is not limited thereto.

Next, the oxide 230 used for the transistor 200 will be described in detail. In the following description, the description of the oxide 230 is referred to for the oxide 530 of the transistor 500, unless otherwise specified. In the transistor 200, the oxide 230 (the oxide 230*a*, the oxide 230*b*, and the oxide 230*c*), which includes a region where a channel is formed (hereinafter also referred to as channel formation region), is preferably formed using a metal oxide functioning as an oxide semiconductor (hereinafter such a metal oxide is also referred to as oxide semiconductor).

The transistor 200 including an oxide semiconductor in its channel formation region has an extremely low leakage current in an off state; thus, a semiconductor device with low power consumption can be provided. An oxide semiconductor can be formed by a sputtering method or the like and thus can be used in the transistor 200 included in a highly integrated semiconductor device.

For example, as the oxide 230, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. An In—Ga oxide or an In—Zn oxide may be used as the oxide 230.

Here, in addition to the constituent element of the oxide semiconductor, the oxide semiconductor contains a metal element such as aluminum, ruthenium, titanium, tantalum, chromium, or tungsten, whereby the oxide semiconductor forms a metal compound to have reduced resistance. Note that aluminum, titanium, tantalum, tungsten, or the like is preferably used.

In order to add the metal element to the oxide semiconductor, for example, a metal film containing the metal element, a nitride film containing the metal element, or an oxide film containing the metal element is provided over the oxide semiconductor. By providing such a film, some oxygen in the oxide semiconductor at or in the vicinity of an interface between the film and the oxide semiconductor may be absorbed by the film or the like and an oxygen vacancy may be formed, so that the resistance of the oxide semiconductor in the vicinity of the interface may be reduced.

After the metal film, the nitride film containing the metal element, or the oxide film containing the metal element is provided over the oxide semiconductor, heat treatment is preferably performed in an atmosphere containing nitrogen. By performing the heat treatment in an atmosphere containing nitrogen, the metal element in the metal film, the nitride film containing the metal element, or the oxide film containing the metal element diffuses into the oxide semiconductor, or the metal element in the oxide semiconductor diffuses into the film, whereby the oxide semiconductor forms a metal compound with the film to have partly reduced resistance. The metal element added to the oxide semiconductor becomes relatively stable when it forms a metal compound with the metal element in the oxide semiconductor; thus, a highly reliable semiconductor device can be provided.

Furthermore, at the interface between the oxide semiconductor and the metal film, the nitride film containing the metal element, or the oxide film containing the metal element, a compound layer (hereinafter also referred to as another layer) may be formed. Note that the compound layer (another layer) includes a metal compound containing a component of the metal film, the nitride film containing the metal element, or the oxide film containing the metal element and a component of the oxide semiconductor. For example, as the compound layer, a layer where the metal element of the oxide semiconductor and the metal element added to the oxide semiconductor are alloyed may be formed. The alloyed layer is relatively stable, and thus a highly reliable semiconductor device can be provided.

In the case where hydrogen in the oxide semiconductor diffuses into a low-resistance region of the oxide semiconductor and enters an oxygen vacancy in the low-resistance region, the hydrogen becomes relatively stable. It is known that hydrogen in an oxygen vacancy in an oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor or a region where the metal compound is formed tends to be further reduced, and the other region with the resistance maintained in the oxide semiconductor tends to be highly purified (impurities such as water or hydrogen therein tend to be reduced) and the resistance of the region tends to be increased.

When containing an impurity element such as hydrogen or nitrogen, an oxide semiconductor has an increased carrier density. Hydrogen contained in the oxide semiconductor reacts with oxygen bonded to a metal atom to be water, and thus forms an oxygen vacancy in some cases. Entry of hydrogen into the oxygen vacancy increases carrier density. Furthermore, in some cases, bonding of part of hydrogen to oxygen bonded to a metal atom causes generation of an electron functioning as a carrier. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be formed in the oxide semiconductor. In other words, when the resistance of the oxide 230 is selectively reduced, a region functioning as a semiconductor having a low carrier density and low-resistance regions functioning as the source region or the drain region can be formed in the island-shaped oxide 230.

Figure 24:
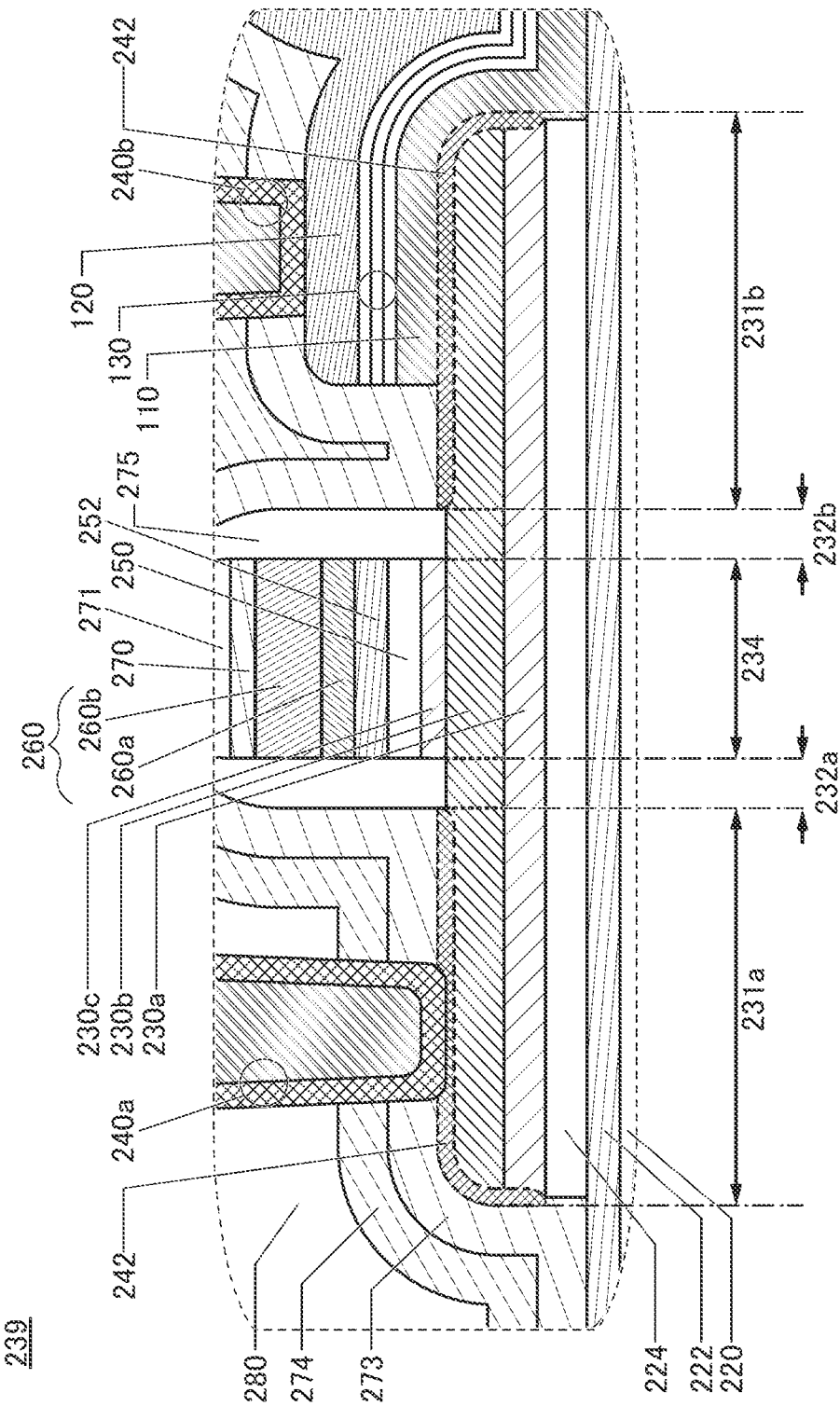
FIG. 24 is a cross-sectional view illustrating a semiconductor device.

Here, FIG. 24 is an enlarged view illustrating a region 239 including the oxide 230b whose resistance is selectively reduced, which is surrounded by a dashed line in FIG. 21B.

As illustrated in FIG. 24, the oxide 230 includes a region 234 functioning as a channel formation region of the transistor, a region 231 (a region 231a and a region 231b) functioning as a source region and a drain region, and a region 232 (a region 232a and a region 232b) provided between the region 234 and the region 231.

The region 231 functioning as the source region and the drain region has a low oxygen concentration and a reduced resistance. The region 234 functioning as the channel formation region is a high-resistance region having a higher oxygen concentration and a lower carrier density than the region 231 functioning as the source region and the drain region. The region 232 has a higher oxygen concentration and a lower carrier density than the region 231 functioning as the source region and the drain region and has a lower oxygen concentration and a higher carrier density than the region 234 functioning as the channel formation region.

The concentration of at least one of a metal element and an impurity element such as hydrogen and nitrogen in the region 231 is preferably higher than that in each of the region 232 and the region 234.

In addition to the metal elements of the oxide 230, the region 231 preferably contains one or more of metal elements such as aluminum, ruthenium, titanium, tantalum, tungsten, and chromium.

In order to form the region 231, for example, a film containing a metal element may be formed in contact with the oxide 230. The film containing the metal element is patterned into an island shape to be the conductor 110 after the formation of the region 231. Note that as the film containing the metal element, a metal film, an oxide film containing a metal element, or a nitride film containing a metal element can be used. In that case, the layer 242 may be formed at the interface between the film containing the metal element and the oxide 230. For example, the layer 242 is formed on the top surface and the side surface of the oxide 230, in some cases. Note that the layer 242 includes a metal compound containing a component of the film containing the metal element and a component of the oxide 230, and can also be referred to as compound layer. For example, as the layer 242, a layer in which the metal element of the oxide 230 and the metal element added to the oxide 230 are alloyed may be formed.

Addition of the metal element to the oxide 230 can form a metal compound in the oxide 230 and the region 231 with a reduced resistance can be formed. Note that the metal compound is not necessarily formed in the oxide 230. For example, the metal compound may be formed in the film containing the metal element (the conductor 110). Alternatively, the metal compound may be formed on the surface of the oxide 230, on the surface of the conductor 110, or in the layer 242 formed at the interface between the conductor 110 and the oxide 230.

Thus, the region 231 includes a low-resistance region of the layer 242, in some cases. Accordingly, at least part of the layer 242 functions as the source region or the drain region of the transistor 200, in some cases.

The region 232 includes a region overlapping with the insulator 275. The concentration of at least one of metal elements such as aluminum, ruthenium, titanium, tantalum, tungsten, and chromium and impurity elements such as hydrogen and nitrogen in the region 232 is preferably higher than that in the region 234. For example, when the film containing the metal element is provided in contact with the region 231 of the oxide 230, a component in the film containing the metal element forms a metal compound with a component in the oxide semiconductor in some cases. The metal compound attracts hydrogen in the oxide 230 in some cases. Thus, the hydrogen concentration of the region 232 in the vicinity of the region 231 may be increased.

One or both of the region 232a and the region 232b may have a region overlapping with the conductor 260. With such a structure, the conductor 260 can overlap with the regions 232a and 232b.

Although the regions 234, 231, and 232 are formed in the oxide 230b in FIG. 24, the present invention is not limited thereto. For example, these regions may be formed in the layers 242; the compound layer formed between the layers 242 and the oxide 230; the oxide 230a; or the oxide 230c. Although the boundaries between the regions are illustrated as being substantially perpendicular to the top surface of the oxide 230 in FIG. 24, this embodiment is not limited thereto.

For example, the region 232 may project to the conductor 260 side in the vicinity of the surface of the oxide 230b, and the region 232 may recede to the conductor 240a or 240b side in the vicinity of the bottom surface of the oxide 230b.

In the oxide 230, the boundaries between the regions are difficult to clearly observe in some cases. The concentration of a metal element and an impurity element such as hydrogen and nitrogen, which is detected in each region, may be gradually changed (such a change is also referred to as gradation) not only between the regions but also in each region. That is, the region closer to the channel formation region preferably has a lower concentration of a metal element and an impurity element such as hydrogen and nitrogen.

In order to selectively reduce the resistance of the oxide 230, at least one of metal elements that increase conductivity such as aluminum, ruthenium, titanium, tantalum, tungsten, and chromium and an impurity is added to a desired region. As the impurity, an element that forms an oxygen vacancy, an element trapped by an oxygen vacancy, or the like may be used. Examples of the element are hydrogen, boron, carbon, nitrogen, fluorine, phosphorus, sulfur, chlorine, and a rare gas. Typical examples of the rare gas include helium, neon, argon, krypton, and xenon.

When the content of the metal element that increases conductivity, the element that forms an oxygen vacancy, and the element trapped by an oxygen vacancy in the region 231 is increased, the carrier density is increased and the resistance can be reduced.

In order to reduce the resistance of the region 231, for example, the film containing the metal element is formed in contact with the region 231 of the oxide 230. As the film containing the metal element, a metal film, an oxide film containing a metal element, a nitride film containing a metal element, or the like can be used. The film containing the metal element is preferably formed over the oxide 230 with at least the insulator 250, the metal oxide 252, the conductor 260, the insulator 270, the insulator 271, and the insulator 275 therebetween. Note that the film containing the metal element has a thickness of more than or equal to 10 nm and less than or equal to 200 nm. For example, the film containing the metal element contains a metal element such as aluminum, ruthenium, titanium, tantalum, tungsten, or chromium. The film containing the metal element can be formed by a sputtering method, a CVD method, an MBE method, a PLD method, an ALD method, or the like.

When the oxide 230 is in contact with the film containing the metal element, a component of the film containing the metal element forms a metal compound with a component of the oxide 230 and the region 231 with a reduced resistance is formed. Moreover, oxygen in the oxide 230 positioned at or in the vicinity of the interface between the oxide 230 and the film containing the metal element is partly absorbed by the layers 242; accordingly, an oxygen vacancy is formed and the region 231 with a reduced resistance is formed, in some cases.

Furthermore, heat treatment is preferably performed in an atmosphere containing nitrogen in the state where the oxide 230 is in contact with the film containing the metal element. By the heat treatment, the metal element of the film containing the metal element diffuses into the oxide 230, or the metal element of the oxide 230 diffuses into the film containing the metal element, whereby the oxide 230 forms a metal compound with the film containing the metal element to have partly reduced resistance. In this manner, the layers 242 are formed between the oxide 230 and the film containing the metal element. Note that the metal element of the oxide 230 may be alloyed with the metal element of the film containing the metal element. Thus, the layers 242 may contain an alloy. The alloy is relatively stable, and thus a highly reliable semiconductor device can be provided.

The heat treatment can be performed, for example, at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere or an inert gas atmosphere. The heat treatment may be performed under a reduced pressure. Heat treatment may be performed in a nitrogen atmosphere or an inert gas atmosphere, and then another heat treatment may be performed in an atmosphere containing an oxidizing gas.

In the case where hydrogen in the oxide 230 diffuses into the region 231 and enters an oxygen vacancy in the region 231, the hydrogen becomes relatively stable. Hydrogen in an oxygen vacancy in the region 234 is released from the oxygen vacancy by heat treatment at 250° C. or higher, diffuses into the region 231, enters an oxygen vacancy in the region 231, and becomes relatively stable. Thus, by the heat treatment, the resistance of the region 231 is further reduced, and the region 234 is highly purified (impurities such as water or hydrogen therein are reduced) and the resistance of the region 234 is increased.

By contrast, since the regions 234 and 232 of the oxide 230 overlap with the conductor 260 and the insulator 275, addition of a metal element to the regions is prevented. Furthermore, absorption of oxygen atoms in the regions 234 and 232 of the oxide 230 by the film containing the metal element is prevented.

An oxygen vacancy may be formed in the region 231 and the region 232 due to absorption of oxygen in the region 231 of the oxide 230 and the region 232 of the oxide 230 adjacent to the region 231 by the film containing the metal element. Entry of hydrogen in the oxide 230 to the oxygen vacancy increases the carrier density of the regions 231 and 232. Therefore, the regions 231 and 232 of the oxide 230 become low-resistance regions.

In the case where the film containing the metal element has a property of absorbing hydrogen, hydrogen in the oxide 230 is absorbed by the film. Accordingly, hydrogen, which is an impurity in the oxide 230, can be reduced. In a later step, the film containing the metal element is patterned to be the conductor 110, and accordingly most hydrogen absorbed from the oxide 230 is removed.

After the layers 242 are formed, part of the film containing the metal element is removed, so that the island-shaped conductor 110 is formed. The film containing the metal element is formed to be sufficiently thick, for example, more than or equal to 10 nm and less than or equal to 200 nm, so that the conductor 110 can have sufficient conductivity. Like the film containing the metal element, the conductor 110 preferably has a thickness of more than or equal to 10 nm and less than or equal to 20 nm, and preferably contains a metal element such as aluminum, ruthenium, titanium, tantalum, tungsten, or chromium. The conductor 110 may be an oxide film containing a metal element or a nitride film containing a metal element.

The layer 242 is formed between the conductor 110 and the oxide 230. In the layer 242, the metal element of the film containing the metal element is alloyed with the metal element of the oxide 230 in some cases, and thus the resistance between the conductor 110 and the region 231b is reduced in some cases.

As illustrated in FIG. 21B, the conductor 110 is in contact with the conductor 560 functioning as the gate of the transistor 500 through the opening in the insulators 570 and 571. With the use of the conductor 110 having sufficient conductivity, the conductivity between the transistors 200 and 500 can be favorable, and accordingly, the initialized potential can be accurately held in the node N11 or N12. Furthermore, when the transistors 200 and 500 are formed in the same layer and connected to each other through the conductor 110, there is no need to form an extra plug to connect the transistors 200 and 500 in the upper or lower layer. Thus, the number of plugs formed in the layer where the transistors 200 and 500 are formed can be reduced, so that diffusion of impurities such as hydrogen into the transistors 200 and 500 through the plugs can be reduced.

A transistor formed using an oxide semiconductor is likely to have its electrical characteristics changed by impurities and oxygen vacancies in a channel formation region in the oxide semiconductor; as a result, the reliability is reduced, in some cases. Moreover, if the channel formation region in the oxide semiconductor includes oxygen vacancies, the transistor tends to have normally-on characteristics. Thus, oxygen vacancies in the region 234 where a channel is formed are preferably minimized As illustrated in FIG. 24, the insulator 275 containing oxygen at a higher proportion than oxygen in the stoichiometric composition (also referred to as "excess oxygen") is preferably provided in contact with the insulator 250, the region 232 of the oxide 230b, and the oxide 230c. That is, excess oxygen contained in the insulator 275 diffuses into the region 234 of the oxide 230, whereby oxygen vacancies in the region 234 of the oxide 230 can be reduced.

In order to provide an excess-oxygen region in the insulator 275, an oxide is preferably formed by a sputtering method for the insulator 273 in contact with the insulator 275. The oxide formed by a sputtering method can be an insulator containing few impurities such as water or hydrogen. Deposition by a sputtering method is preferably performed with the use of a facing-target sputtering apparatus, for example With the use of the facing-target sputtering apparatus, deposition can be performed without exposing a deposition surface to a high electric field region between facing targets; thus, the deposition surface is less likely to be damaged due to plasma. Since deposition damage to the oxide 230 due to plasma during the deposition of the insulator to be the insulator 273 can be small, the sputtering apparatus is preferably used. A deposition method using a facing-target sputtering apparatus can be referred to as vapor deposition SP (VDSP, registered trademark).

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2 > E_1 > E_0$.

The ions in plasma are accelerated by a potential difference $(E_2 - E_0)$ and collide with the target; accordingly, the sputtered particles are ejected from the target. These sputtered particles are attached to a deposition surface and deposited thereover; as a result, a film is deposited. Some ions recoil by the target and might pass through the deposited film as recoil ions, and be taken into the insulator 275 in contact with the deposition surface. The ions in the plasma are accelerated by a potential difference $(E_2 - E_1)$ and collide with the deposition surface. At that time, some ions reach the inside of the insulator 275. The ions are taken into the insulator 275; accordingly, a region into which the ions are taken is formed in the insulator 275. That is, an excess-oxygen region is formed in the insulator 275 in the case where the ions contain oxygen.

Introduction of excess oxygen into the insulator 275 can form an excess-oxygen region in the insulator 275. The excess oxygen in the insulator 275 is supplied to the region 234 of the oxide 230 and can compensate for oxygen vacancies in the oxide 230.

For the insulator 275, silicon oxide, silicon oxynitride, silicon nitride oxide, or porous silicon oxide is preferably used. An excess-oxygen region is likely to be formed in a material such as silicon oxynitride. By contrast, an excess-oxygen region is less likely to be formed in the oxide 230 than in a material such as silicon oxynitride even when an oxide film is formed over the oxide 230 by a sputtering method. Therefore, provision of the insulator 275 including an excess-oxygen region in the periphery of the region 234 of the oxide 230 makes it possible to supply excess oxygen of the insulator 275 to the region 234 of the oxide 230 effectively.

For the insulator 273, aluminum oxide is preferably used. When heat treatment is performed in a state where aluminum oxide is adjacent to the oxide 230, the aluminum oxide extracts hydrogen in the oxide 230 in some cases. Note that when the layers 242 are provided between the oxide 230 and the aluminum oxide, hydrogen in the layers 242 is absorbed by the aluminum oxide and the layers 242 with reduced hydrogen absorb hydrogen in the oxide 230, in some cases. Thus, the hydrogen concentration of the oxide 230 can be lowered. Furthermore, when heat treatment is performed in the state where the insulator 273 is adjacent to the oxide 230, oxygen can be supplied from the insulator 273 to the oxide 230, the insulator 224, or the insulator 222, in some cases.

When the above-described structures or the above-described steps are combined, the resistance of the oxide 230 can be selectively reduced.

In formation of a low-resistance region in the oxide 230, the resistance of the oxide 230 is reduced in a self-aligned manner with the use of the conductor 260 functioning as a gate electrode and the insulator 275 as masks. Therefore, when the plurality of transistors 200 are formed simultaneously, variations in electrical characteristics of the transistors can be reduced. The channel length of the transistor 200 depends on the width of the conductor 260 and the thickness of the insulator 275. The transistor 200 can be miniaturized when the conductor 260 with the minimum feature width is used.

Thus, by appropriately selecting the areas of the regions, a transistor having electrical characteristics necessary for the circuit design can be easily provided.

An oxide semiconductor can be formed by a sputtering method or the like and thus can be used in a transistor included in a highly integrated semiconductor device. A transistor including an oxide semiconductor in a channel formation region has an extremely low leakage current (off-state current) in an off state; thus, a semiconductor device with low power consumption can be provided. The transistor 200 has low off-state current, and thus the initialized potential can be held in the node N11 or N12 for a long time.

Accordingly, a semiconductor device including a transistor having a high on-state current can be provided. Alternatively, a semiconductor device including a transistor having a low off-state current can be provided. Alternatively, a semiconductor device that has small variation in electrical characteristics, i.e., stable electrical characteristics, and has high reliability can be provided.

The structure of the semiconductor device 600 is described in detail below. Unless otherwise specified, the description of the detailed structure of the transistor 200 is referred to for the detailed structure of the transistor 500.

The conductor 203 extends in the channel width direction as illustrated in FIGS. 21A and 22A, and functions as a wiring that applies a potential to the conductor 205. The conductor 203 is preferably provided to be embedded in the insulator 212.

The conductor 205 is positioned to overlap with the oxide 230 and the conductor 260. Moreover, the conductor 205 may be provided over and in contact with the conductor 203. The conductor 205 is preferably provided to be embedded in the insulator 214 and the insulator 216.

Here, the conductor 260 functions as a first gate (also referred to as front gate) electrode in some cases. The conductor 205 functions as a second gate (also referred to as back gate) electrode in some cases. In that case, by changing a potential applied to the conductor 205 independently of a potential applied to the conductor 260, the threshold voltage of the transistor 200 can be controlled. In particular, by applying a negative potential to the conductor 205, the threshold voltage of the transistor 200 can be higher than 0 V, and the off-state current can be reduced. Thus, a drain current when a potential applied to the conductor 260 is 0 V can be smaller in the case where a negative potential is applied to the conductor 205 than in the case where the negative potential is not applied to the conductor 205.

When the conductor 205 is provided over the conductor 203, the distance between the conductor 260 functioning as the first gate electrode and the conductor 203 functioning as the wiring can be set as appropriate. That is, the insulators 214 and 216 and the like are provided between the conductors 203 and 260, whereby a parasitic capacitance between the conductors 203 and 260 can be reduced, and the withstand voltage between the conductors 203 and 260 can be increased.

The reduction in the parasitic capacitance between the conductors 203 and 260 can improve the switching speed of the transistor 200, so that the transistor 200 can have high frequency characteristics. The increase in the withstand voltage between the conductors 203 and 260 can improve the reliability of the transistor 200. Therefore, the insulator 214 and the insulator 216 are preferably thick. Note that the extending direction of the conductor 203 is not limited to this example; for example, the conductor 203 may extend in the channel length direction of the transistor 200.

As illustrated in FIG. 21A, the conductor 205 is positioned to overlap with the oxide 230 and the conductor 260. The conductor 205 is preferably larger than the region 234 of the oxide 230. As illustrated in FIG. 22A, it is particularly preferable that the conductor 205 extend beyond the end portion of the region 234 of the oxide 230 that intersects with the channel width direction. That is, the conductor 205 and the conductor 260 preferably overlap with each other with the insulator positioned therebetween in a region on an outer side of the side surface of the oxide 230 in the channel width direction.

With the above structure, in the case where potentials are applied to the conductor 260 and the conductor 205, an electric field generated from the conductor 260 and an electric field generated from the conductor 205 are connected, so that the channel formation region in the oxide 230 can be electrically surrounded.

That is, the channel formation region in the region 234 can be electrically surrounded by the electric field of the conductor 260 functioning as the first gate electrode and the electric field of the conductor 205 functioning as the second gate electrode. In this specification, such a transistor structure in which the channel formation region is electrically surrounded by the electric fields of the first gate electrode and the second gate electrode is referred to as surrounded channel (s-channel) structure.

In the conductor 205, a first conductor is formed in contact with an inner wall of an opening of the insulators 214 and 216 and a second conductor is formed inside the first conductor. Here, the top surfaces of the first and second conductors can be at substantially the same level as the top surface of the insulator 216. Although the first conductor and the second conductor of the conductor 205 are stacked in the transistor 200, the present invention is not limited thereto. For example, the conductor 205 may have a single-layer structure or a stacked-layer structure of three or more layers.

The first conductor of the conductor 205 or the conductor 203 is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom, that is, a conductive material through which the impurities are less likely to pass. Alternatively, the first conductor of the conductor 205 or the conductor 203 is preferably formed using a conductive material having a function of inhibiting diffusion of oxygen (e.g., oxygen atoms or oxygen molecules), that is, a conductive material through which the oxygen is less likely to pass. Note that in this specification, a function of inhibiting diffusion of impurities or oxygen means a function of inhibiting diffusion of any one or all of the impurities and the oxygen.

When the first conductor of the conductor 205 or 203 has a function of inhibiting diffusion of oxygen, the conductivity of the second conductor of the conductor 205 or 203 can be prevented from being lowered because of oxidization of the second conductor of the conductor 205 or 203. As a conductive material having a function of inhibiting diffusion of oxygen, for example, tantalum, tantalum nitride, ruthenium, ruthenium oxide, or the like is preferably used. Thus, the first conductor of the conductor 205 or 203 may be a single layer or a stacked layer of the above conductive materials. Thus, impurities such as water or hydrogen can be inhibited from being diffused to the transistor 200 side through the conductors 203 and 205.

A conductive material containing tungsten, copper, or aluminum as its main component is preferably used for the second conductor of the conductor 205. Note that the second conductor of the conductor 205 is a single layer in the drawing but may have a stacked-layer structure, for example, a stacked layer of any of the above conductive materials and titanium or titanium nitride.

The second conductor of the conductor 203 functions as a wiring and thus is preferably a conductor having higher conductivity than the second conductor of the conductor 205. For example, a conductive material containing copper or aluminum as its main component can be used. The second conductor of the conductor 203 may have a stacked-layer structure, for example, a stacked layer of any of the above conductive materials and titanium or titanium nitride.

It is particularly preferable to use copper for the conductor 203. Copper is preferably used for the wiring and the like because of its small resistance. However, copper is easily diffused. Copper may deteriorate the electrical characteristics of the transistor 200 when diffused into the oxide 230. In view of the above, for example, the insulator 214 is formed using a material such as aluminum oxide or hafnium oxide through which copper is hardly allowed to pass, whereby diffusion of copper can be inhibited.

The conductor 205, the insulator 214, and the insulator 216 are not necessarily provided. In this case, part of the conductor 203 can function as the second gate electrode.

Each of the insulators 210 and 214 preferably functions as a barrier insulating film that inhibits impurities such as water or hydrogen from entering the transistor 200 from the substrate side. Accordingly, each of the insulators 210 and 214 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the impurities are less likely to pass. Alternatively, each of the insulators 210 and 214 is preferably formed using an insulating material having a function of inhibiting diffusion of oxygen (e.g., oxygen atoms or oxygen molecules), that is, a conductive material through which the oxygen is less likely to pass. Furthermore, an insulator functioning as a barrier insulating film similar to the insulator 210 or 214 may be provided over the insulator 280. With such an insulator, impurities such as water or hydrogen can be inhibited from entering the transistor 200 from above the insulator 280.

For example, it is preferable that aluminum oxide or the like be used for the insulator 210 and that silicon nitride or the like be used for the insulator 214. Owing to the insulators 210 and 214, impurities such as water or hydrogen can be inhibited from being diffused to the transistor 200 side from the substrate side. In addition, owing to the insulators 210 and 214, oxygen contained in the insulator 224 and the like can be inhibited from being diffused to the substrate side.

Furthermore, with the structure in which the conductor 205 is stacked over the conductor 203, the insulator 214 can be provided between the conductor 203 and the conductor 205. Here, even when a metal that is easily diffused, such as copper, is used as the second conductor of the conductor 203, silicon nitride or the like provided as the insulator 214 can inhibit diffusion of the metal to a layer positioned above the insulator 214.

The permittivity of each of the insulators 212, 216, and 280 functioning as an interlayer film is preferably lower than that of the insulator 210 or 214. In the case where a material with a low permittivity is used for an interlayer film, the parasitic capacitance between wirings can be reduced.

For example, the insulators 212, 216, and 280 can be formed to have a single-layer structure or a stacked-layer structure using any of insulators such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), and (Ba, Sr)$TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulators 220, 222, and 224 function as gate insulators. The insulator 524 provided in the transistor 500 also functions as a gate insulator like the insulator 224. Although the insulators 224 and 524 are separated from each other in this embodiment, the insulators 224 and 524 may be connected.

Here, as the insulator 224 in contact with the oxide 230, an insulator containing more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced, leading to an improvement in reliability of the transistor 200.

As the insulator containing the excess-oxygen region, specifically, an oxide material that releases part of oxygen by heating is preferably used. An oxide that releases oxygen by heating is an oxide film in which the amount of released oxygen converted into oxygen molecules is greater than or equal to $1.0 \times 10^{18}$ molecules/$cm^3$, preferably greater than or equal to $1.0 \times 10^{19}$ molecules/$cm^3$, further preferably greater than or equal to $2.0 \times 10^{19}$ molecules/$cm^3$ or greater than or equal to $3.0 \times 10^{20}$ molecules/$cm^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

In the case where the insulator 224 has an excess-oxygen region, the insulator 222 preferably has a function of inhibiting diffusion of oxygen (e.g., oxygen atoms or oxygen molecules), that is, a conductive material through which the oxygen is less likely to pass.

When the insulator 222 has a function of inhibiting diffusion of oxygen, oxygen in the excess-oxygen region of the insulator 224 is not diffused to the insulator 220 side and thus can be supplied to the oxide 230 efficiently. The conductor 205 can be inhibited from reacting with oxygen in the excess-oxygen region of the insulator 224.

The insulator 222 preferably has a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or (Ba, Sr)$TiO_3$ (BST). With miniaturization and high integration of a transistor, a problem such as generation of leakage current may arise because of a thin gate insulator. When a high-k material is used for an insulator functioning as the gate insulator, a gate potential at the time of operating the transistor can be reduced while keeping the physical thickness of the gate insulator.

It is particularly preferable to use an insulator containing an oxide of one or both of aluminum and hafnium, that is, an insulating material having a function of inhibiting diffusion of impurities, oxygen, and the like, that is, an insulating material through which the impurities and the oxygen are less likely to pass. Aluminum oxide, hafnium oxide, an oxide containing aluminum and hafnium (hafnium aluminate), or the like is preferably used for the insulator containing an oxide of one or both of aluminum and hafnium. The insulator 222 formed of such a material serves as a layer that prevents release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 220 be thermally stable. Silicon oxide and silicon oxynitride are suitable because of their thermal stability. Furthermore, combination of an insulator which is a high-k material and silicon oxide or silicon oxynitride enables the insulator 220 to have a stacked-layer structure that is thermally stable and has a high dielectric constant.

Note that the insulators 220, 222, and 224 may each have a stacked-layer structure of two or more layers. In this case, the stacked layers are not necessarily formed of the same material and may be formed of different materials.

The oxide 230 includes the oxide 230a, the oxide 230b over the oxide 230a, and the oxide 230c over the oxide 230b. When the oxide 230a is provided below the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

The oxide 230 preferably has a stacked-layer structure of oxides which differ in the atomic ratio of metal elements. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide which can be used as the oxide 230a or 230b.

The energy of the conduction band minimum of each of the oxides 230a and 230c is preferably higher than that of the oxide 230b. In other words, the electron affinity of each of the oxides 230a and 230c is preferably smaller than that of the oxide 230b.

Here, the energy level of the conduction band minimum is gradually varied at a junction portion of each of the oxides 230a, 230b, and 230c. In other words, the energy level of the conduction band minimum at a junction portion of each of the oxides 230a, 230b, and 230c is continuously varied or continuously connected. To vary the energy level gradually, the density of defect states in a mixed layer formed at the interface between the oxides 230a and 230b and the interface between the oxides 230b and 230c is decreased.

Specifically, when the oxides 230a and 230b or the oxides 230b and 230c contain the same element (as a main component) in addition to oxygen, a mixed layer with a low density of defect states can be formed. For example, in the case where the oxide 230b is an In—Ga—Zn oxide, it is preferable to use an In—Ga—Zn oxide, a Ga—Zn oxide, gallium oxide, or the like as each of the oxides 230a and 230c.

At this time, the oxide 230b serves as a main carrier path. When the oxides 230a and 230c have the above structure, the density of defect states at the interface between the oxides 230a and 230b and the interface between the oxides 230b and 230c can be made low. Thus, the influence of interface scattering on carrier conduction is small, and the transistor 200 can have a high on-state current.

The oxide 230 includes the regions 231, 232, and 234. Note that at least part of the region 231 is adjacent to the insulator 273. The region 232 has a region overlapping with at least the insulator 275.

When the transistor 200 is turned on, the region 231a or 231b functions as the source region or the drain region. At least part of the region 234 functions as a channel formation region. Since the region 232 is provided between the region 231 and the region 234, the transistor 200 can have a high on-state current and a low leakage current (off-state current) in an off state.

When the region 232 is provided in the transistor 200, high-resistance regions are not formed between the region 231 functioning as the source region and the drain region and the region 234 where a channel is formed, so that the on-state current and the mobility of the transistor can be increased. Since the first gate electrode (the conductor 260) does not overlap with the source and drain regions in the channel length direction owing to the region 232, formation of unnecessary capacitance between the first gate electrode (the conductor 260) and the source and drain regions can be suppressed. Leakage current in an off state can be reduced owing to the region 232.

Thus, by appropriately selecting the areas of the regions, a transistor having electrical characteristics necessary for the circuit design can be easily provided. For example, the transistor 200 can have a small off-state current and the transistor 500 can have a large on-state current.

The oxide 230 is preferably formed using a metal oxide functioning as an oxide semiconductor. For example, the metal oxide to be the region 234 preferably has a band gap of 2 eV or more, preferably 2.5 eV or more. In this manner, off-state current of a transistor can be reduced by using a metal oxide having a wide band gap.

A transistor including an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

The insulator 250 functions as a gate insulator. The insulator 250 is preferably positioned in contact with the top surface of the oxide 230c. The insulator 250 is preferably formed using an insulator from which oxygen is released by heating. The insulator 250 is an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS analysis. In the TDS analysis, the film surface temperature is preferably higher than or equal to 100° C. and lower than or equal to 700° C.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride, which have thermal stability, are preferable.

When as the insulator 250, an insulator from which oxygen is released by heating is provided in contact with the top surface of the oxide 230c, oxygen can be effectively supplied from the insulator 250 to the region 234 of the oxide 230b. Furthermore, as in the insulator 224, the concentration of impurities such as water or hydrogen in the insulator 250 is preferably lowered. The thickness of the insulator 250 is preferably greater than or equal to 1 nm and less than or equal to 20 nm.

Furthermore, in order that excess oxygen of the insulator 250 can be efficiently supplied to the oxide 230, the metal oxide 252 may be provided. Therefore, the metal oxide 252 preferably inhibits diffusion of oxygen from the insulator 250. Provision of the metal oxide 252 that inhibits diffusion of oxygen inhibits diffusion of excess oxygen from the insulator 250 to the conductor 260. That is, reduction in the amount of excess oxygen supplied to the oxide 230 can be suppressed. Moreover, oxidization of the conductor 260 due to excess oxygen can be suppressed.

Note that the metal oxide 252 may function as part of the first gate electrode. For example, an oxide semiconductor that can be used as the oxide 230 can be used as the metal oxide 252. In this case, when the conductor 260 is formed by a sputtering method, the metal oxide 252 can have a reduced electric resistance and become a conductor. Such a conductor can be referred to as oxide conductor (OC) electrode.

Note that the metal oxide 252 functions as the part of the gate insulator in some cases. Therefore, when silicon oxide, silicon oxynitride, or the like is used for the insulator 250, a metal oxide that is a high-k material with a high dielectric constant is preferably used as the metal oxide 252. Such a stacked-layer structure can be thermally stable and can have a high dielectric constant. Accordingly, a gate potential applied during operation of the transistor can be reduced while keeping the physical thickness of the gate insulator. In addition, an equivalent oxide thickness (EOT) of an insulator functioning as the gate insulator can be reduced.

Although the metal oxide 252 in the transistor 200 is shown as a single layer, the metal oxide 252 may have a stacked-layer structure of two or more layers. For example, a metal oxide functioning as part of a gate electrode and a metal oxide functioning as part of a gate insulator may be stacked.

With the metal oxide 252 functioning as a gate electrode, the on-state current of the transistor 200 can be increased without a reduction in the influence of the electric field generated from the conductor 260. With the metal oxide 252 functioning as a gate insulator, the distance between the conductor 260 and the oxide 230 is kept by the physical thicknesses of the insulator 250 and the metal oxide 252, so that leakage current between the conductor 260 and the oxide 230 can be reduced. Thus, with the stacked-layer structure of the insulator 250 and the metal oxide 252, the physical distance between the conductor 260 and the oxide 230 and the intensity of electric field applied from the conductor 260 to the oxide 230 can be easily adjusted as appropriate.

Specifically, the oxide semiconductor that can be used for the oxide 230 can also be used for the metal oxide 252 when the resistance thereof is reduced. Alternatively, a metal oxide containing one or more of hafnium, aluminum, gallium, yttrium, zirconium, tungsten, titanium, tantalum, nickel, germanium, magnesium, and the like can be used as the metal oxide 252.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film Thus, hafnium aluminate is less likely to be crystallized by heat treatment in a later step, so that hafnium aluminate is preferable. Note that the metal oxide 252 is not a necessary component and can be included as appropriate depending on characteristics needed for the transistor.

The conductor 260 functioning as the first gate electrode includes the conductor 260a and the conductor 260b over the conductor 260a. Like the first conductor of the conductor 205, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., oxygen atoms and oxygen molecules).

When the conductor 260a has a function of inhibiting diffusion of oxygen, the conductivity of the conductor 260b can be prevented from being lowered because of oxidization due to excess oxygen in the insulator 250 and the metal oxide 252. As a conductive material having a function of inhibiting diffusion of oxygen, for example, tantalum, tantalum nitride, ruthenium, ruthenium oxide, or the like is preferably used.

Furthermore, the conductor 260b is preferably formed using a conductive material including tungsten, copper, or aluminum as its main component. The conductor 260 functions as a wiring and thus is preferably a conductor having high conductivity. For example, a conductive material containing tungsten, copper, or aluminum as its main component can be used. The conductor 260b may have a stacked-layer structure, for example, a stacked layer of any of the above conductive materials and titanium or titanium nitride.

In the case where the conductor 205 extends beyond the end portions of the oxide 230 that intersect with the channel width direction as illustrated in FIG. 22A, the conductor 260 preferably overlaps with the conductor 205 with the insulator 250 positioned therebetween in the extending region. That is, a stacked-layer structure of the conductor 205, the insulator 250, and the conductor 260 is preferably formed in a region on an outer side of the side surface of the oxide 230.

With the above structure, in the case where potentials are applied to the conductor 260 and the conductor 205, an electric field generated from the conductor 260 and an electric field generated from the conductor 205 are connected, so that the channel formation region in the oxide 230 can be electrically surrounded.

That is, the channel formation region in the region 234 can be electrically surrounded by the electric field of the conductor 260 functioning as the first gate electrode and the electric field of the conductor 205 functioning as the second gate electrode.

Furthermore, the insulator 270 functioning as a barrier film may be positioned over the conductor 260b. The insulator 270 is preferably formed using an insulating material having a function of inhibiting the passage of oxygen and impurities such as water or hydrogen. For example, aluminum oxide or hafnium oxide is preferably used. In that case, oxidization of the conductor 260 due to oxygen from above the insulator 270 can be inhibited. Moreover, entry of impurities such as water or hydrogen from above the insulator 270 into the oxide 230 through the conductor 260 and the insulator 250 can be inhibited.

Furthermore, the insulator 271 functioning as a hard mask is preferably positioned over the insulator 270. By provision of the insulator 271, the conductor 260 can be processed to have the side surface that is substantially perpendicular. Specifically, an angle formed by the side surface of the conductor 260 and a surface of the substrate can be greater than or equal to 75° and less than or equal to 100°, preferably greater than or equal to 80° and less than or equal to 95°. When the conductor 260 is processed into such a shape, the insulator 275 that is subsequently formed can be formed into a desired shape.

The insulator 271 may be formed using an insulating material having a function of inhibiting the passage of oxygen and impurities such as water or hydrogen so that the insulator 271 also functions as a barrier film. In this case, the insulator 270 is not necessarily provided.

The insulator 275 functioning as a buffer layer is provided in contact with the side surface of the oxide 230c, the side surface of the insulator 250, the side surface of the metal oxide 252, the side surface of the conductor 260, the side surface of the insulator 270, and the side surface of the insulator 271.

For example, the insulator 275 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because silicon oxide and silicon oxynitride are thermally stable, and silicon oxide and porous silicon oxide are preferable because an excess-oxygen region can be easily formed in a later step.

The insulator 275 preferably includes an excess-oxygen region. When as the insulator 275, an insulator from which oxygen is released by heating is provided in contact with the oxide 230c and the insulator 250, oxygen can be effectively supplied from the insulator 250 to the region 234 of the oxide 230b. Furthermore, the concentration of impurities such as water and hydrogen in the insulator 275 is preferably lowered.

An insulator with a high dielectric constant is preferably used as the insulator 130, and an insulator that can be used as the insulator 222 or the like may be used. For example, an insulator containing an oxide of one or both of aluminum and hafnium can be used. Aluminum oxide, hafnium oxide, an oxide containing aluminum and hafnium (hafnium aluminate), or the like is preferably used for the insulator containing an oxide of one or both of aluminum and hafnium. The insulator 130 may have a stacked-layer structure of, for example, two or more of silicon oxide, silicon oxynitride, silicon nitride oxide, silicon nitride, aluminum oxide, hafnium oxide, an oxide containing aluminum and hafnium (hafnium aluminate), and the like. For example, hafnium oxide, aluminum oxide, and hafnium oxide are preferably stacked in this order by an ALD method. The thickness of each of the hafnium oxide and the aluminum oxide is greater than or equal to 0.5 nm and less than or equal to 5 nm. With such a stacked-layer structure, the capacitor 100 can have a large capacitance value and a low leakage current.

Although the side surface of the insulator 130 is aligned with the side surfaces of the conductors 110 and 120 in the top view of FIG. 21A, one embodiment of the present invention is not limited thereto. For example, the insulator 130 may be formed without patterning so that the insulator 130 covers the transistors 200 and 500.

The conductor 120 is preferably formed using a conductive material containing tungsten, copper, or aluminum as its main component. Although not illustrated, the conductor 120 may have a stacked-layer structure, for example, a stacked layer of any of the above conductive materials and titanium or titanium nitride.

The insulator 273 is provided over at least the layers 242, the insulator 275, the layers 542, the insulator 575, and the conductor 120. When the insulator 273 is formed by a sputtering method, each of the insulators 275 and 575 can include an excess-oxygen region. Therefore, oxygen can be supplied from the excess-oxygen regions to the oxides 230 and 530. When the insulator 273 is provided over the layers 242 of the oxide 230 and the layers 542 of the oxide 530, hydrogen in the oxides 230 and 530 can be extracted to the insulator 273.

For example, a metal oxide containing one or more of hafnium, aluminum, gallium, yttrium, zirconium, tungsten, titanium, tantalum, nickel, germanium, magnesium, and the like can be used as the insulator 273.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen.

The insulator 274 is provided over the insulator 273. As the insulator 274, a film having a barrier property and a low hydrogen concentration is preferably used. For example, silicon nitride oxide, silicon nitride, or silicon oxide to which fluorine is added is used as the insulator 274. By provision of the insulators 273 and 274 each having a barrier property, diffusion of impurities from other components such as an interlayer film into the transistor 200 can be inhibited.

The insulator 280 functioning as an interlayer film is preferably provided over the insulator 274. As in the insulator 224 or the like, the concentration of impurities such as water or hydrogen in the insulator 280 is preferably lowered. Note that an insulator similar to the insulator 210 may be provided over the insulator 280. When the insulator is formed by a sputtering method, impurities in the insulator 280 can be reduced.

The conductors 240a, 240b, 540a, and 540b are provided in the openings formed in the insulators 280, 274, and 273. The conductors 240a and 240b are positioned to face each other with the conductor 260 positioned therebetween. The conductors 540a and 540b are provided to face each other with the conductor 560 positioned therebetween. Note that top surfaces of the conductors 240a, 240b, 540a, and 540b may be at the same level as the top surface of the insulator 280.

The conductor 240a is formed in contact with the inner wall of the opening in the insulators 280, 274, and 273. At least part of the bottom of the opening is positioned at the region 231a of the oxide 230, and thus the conductor 240a is in contact with the region 231a. The same applies to the conductors 540a and 540b.

As illustrated in FIG. 23, the conductor 240a preferably overlaps with the side surface of the oxide 230. It is particularly preferable that the conductor 240a overlap with one or both of the side surface of the oxide 230 on the A7 side and the side surface of the oxide 230 on the A8 side, which intersect with the channel width direction of the oxide 230. The conductor 240a may overlap with the side surface of the oxide 230 on the A1 side (the A2 side), which intersects with the channel length direction of the oxide 230. Thus, with the structure in which the conductor 240a overlaps with the region 231 to be the source region or the drain region and the side surface of the oxide 230, the contact area of a contact portion between the conductor 240a and the transistor 200 can be increased without increasing the projected area of the contact portion, so that the contact resistance between the conductor 240a and the transistor 200 can be reduced. Accordingly, miniaturization of the source electrode and the drain electrode of the transistor can be achieved and, in addition, the on-state current can be increased. Furthermore, the conductor 110 in contact with the region 231 to be the source region or the drain region of the oxide 230 is also preferably in contact with the oxide 230 and the layer 242. The same applies to the conductors 540a and 540b.

The conductors 240a, 240b, 540a, and 540b are each preferably formed using a conductive material containing tungsten, copper, or aluminum as its main component. The conductors 240a, 240b, 540a, and 540b may each have a stacked structure.

Here, when an opening is formed in the insulators 280, 274, and 273, for example, the low-resistance region in the region 231 of the oxide 230 is removed and the other region with the resistance maintained in the oxide 230 is exposed in some cases. In this case, a conductor used for a conductor of the conductor 240 in contact with the oxide 230 (hereinafter also referred to as first conductor of the conductor 240) may be formed using a metal film, a nitride film containing a metal element, or an oxide film containing a metal element. When the region with the resistance maintained in the oxide 230 and the first conductor of the conductor 240 are in contact with each other, a metal compound is formed or an oxygen vacancy is formed in the oxide 230, whereby the resistance of the region 231 of the oxide 230 is reduced. The reduction in the resistance of the oxide 230 that is in contact with the first conductor of the conductor 240 can reduce contact resistance between the oxide 230 and the conductor 240. Therefore, the first conductor of the conductor 240 preferably contains a metal element such as aluminum, ruthenium, titanium, tantalum, or tungsten. The conductor 540 may have a structure similar to that of the conductor 240.

In the case where the conductors 240 and 540 each have a stacked-layer structure, a conductive material having a function of inhibiting the passage of impurities such as water or hydrogen is preferably used for a conductor in contact with the insulators 280, 274, and 273, like the first conductor of the conductor 205, for example. For example, tantalum, tantalum nitride, titanium, titanium nitride, ruthenium, ruthenium oxide, or the like is preferably used. The conductive material having a function of inhibiting the passage of impurities such as water or hydrogen may have a single-layer structure or a stacked-layer structure. With the use of the conductive material, impurities such as water or hydrogen can be inhibited from entering the oxides 230 and 530 through the conductors 240 and 540 from a layer above the insulator 280.

Although not illustrated, conductors functioning as wirings may be positioned in contact with the top surfaces of the conductors 240 and 540. The conductor functioning as a wiring is preferably formed using a conductive material containing tungsten, copper, or aluminum as its main component. The conductor may have a stacked-layer structure, for example, a stacked layer of any of the above conductive materials and titanium or titanium nitride. Note that like the conductor 203 or the like, the conductor may be formed to be embedded in an opening provided in an insulator.

<Material for Semiconductor Device>

Materials that can be used for a semiconductor device are described below. In the following description, unless otherwise specified, materials that can be used for the transistor 200 can be used for the transistor 500.

The materials described below can be deposited by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

By using a PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less plasma damage to an object. Thus, a film with few defects can be obtained. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity in some cases.

The processing of the materials can be performed by a lithography method. The processing can be performed by a dry etching method or a wet etching method. A dry etching method is suitable for microfabrication.

In a lithography method, first, a resist is exposed to light through a mask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask for the exposure of the resist to light is unnecessary in the case of using an electron beam or an ion beam because direct writing is performed on the resist. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the material, a resist mask is formed thereover, and then the material of the hard mask is etched. The etching of the material may be performed after or without removal of the resist mask. In the latter case, the resist mask may be removed during the etching. The hard mask may be removed by etching after the etching of the material. The hard mask does not need to be removed in the case where the material of the hard mask does not influence the subsequent process or can be utilized in the subsequent process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, the capacitively coupled plasma etching apparatus may have a structure in which different high-frequency powers are applied to one of the parallel plate type electrodes. Alternatively, the capacitively coupled plasma etching apparatus may have a structure in which high-frequency powers with the same frequency are applied to the parallel plate type electrodes. Alternatively, the capacitively coupled plasma etching apparatus may have a structure in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

<<Substrate>>

As a substrate over which the transistor 200 and the transistor 500 are formed, an insulator substrate, a semiconductor substrate, or a conductor substrate may be used, for example Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Another example is a silicon on insulator (SOI) substrate in which an insulator region is provided in the above semiconductor substrate. Examples of the conductor substrate include a graphite substrate, a metal substrate, an alloy substrate, and a conductive resin substrate. Other examples are a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Thus, an impact applied to the semiconductor device over the substrate due to dropping or the like can be reduced. That is, a durable semiconductor device can be provided.

For the substrate which is a flexible substrate, metal, an alloy, resin, glass, or fiber thereof can be used, for example. As the substrate, a sheet, a film, or a foil containing a fiber may be used. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10-5$/K, or lower than or equal to $1\times10-5$/K. Examples of the resin include polyester, polyolefin, polyamide (e.g., nylon and aramid), polyimide, polycarbonate, and acrylic. In particular, aramid is preferably used for the flexible substrate because of its low coefficient of linear expansion.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for an insulator functioning as the gate insulator, driving voltage of the transistor can be reduced while keeping the physical thickness of the gate insulator. By contrast, when a material with a low dielectric constant is used for the insulator functioning as an interlayer film, the parasitic capacitance between wirings can be reduced. Accordingly, a material is preferably selected depending on the function of an insulator.

As the insulator having a high dielectric constant, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the insulator having a low dielectric constant, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low dielectric constant can be obtained by combining silicon oxide or silicon oxynitride with a resin, for example. Examples of the resin include polyester, polyolefin, polyamide (e.g., nylon or aramid), polyimide, polycarbonate, and acrylic. Furthermore, combination of silicon oxide or silicon oxynitride with an insulator having a high dielectric constant allows the stacked-layer structure to be thermally stable and have a high dielectric constant, for example Note that when the transistor including an oxide semiconductor is surrounded by an insulator that has a function of inhibiting the passage of oxygen and impurities such as hydrogen, the electrical characteristics of the transistor can be stabilized.

The insulator that has a function of inhibiting the passage of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more of hafnium, aluminum, gallium, yttrium, zirconium, tungsten, titanium, tantalum, nickel, germanium, magnesium, and the like can be used as the insulator 273.

In particular, aluminum oxide has high barrier property, so that even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have high barrier property. Therefore, the appropriate addition amount of hydrogen and nitrogen can be adjusted by adjustment of the thickness of hafnium oxide.

For example, the insulator 224 and the insulator 250 functioning as part of the gate insulator are each preferably an insulator including an excess-oxygen region. When a structure in which silicon oxide or silicon oxynitride including an excess-oxygen region is in contact with the oxide 230 is employed, oxygen vacancies in the oxide 230 can be compensated.

An insulator containing an oxide of one or more of aluminum, hafnium, and gallium can be used for the insulator 222 functioning as part of the gate insulator, for example In particular, it is preferable to use aluminum oxide, hafnium oxide, an oxide containing aluminum and hafnium (hafnium aluminate), or the like as an insulator containing an oxide of one or both of aluminum and hafnium.

The insulator 220 is preferably formed using silicon oxide or silicon oxynitride, which is thermally stable, for example. When the gate insulator has a stacked-layer structure of a thermally stable film and a film with a high dielectric constant, an equivalent oxide thickness (EOT) of the gate insulator can be reduced while keeping the physical thickness of the gate insulator.

With the above stacked-layer structure, on-state current can be increased without a reduction in the influence of the electric field applied from the gate electrode. Since the distance between the gate electrode and the channel formation region is kept by the physical thickness of the gate insulator, leakage current between the gate electrode and the channel formation region can be suppressed.

The insulators 212, 216, 271, 275, and 280 preferably include an insulator with a low dielectric constant. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

As the insulators 210, 214, 270, and 273, an insulator having a function of inhibiting the passage of oxygen and impurities such as hydrogen may be used. For the insulators 270 and 273, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example <<Conductor>>

The conductors can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electric conductivity, typified by polycrystalline silicon including an impurity element such as phosphorus, or silicide such as nickel silicide may be used.

A stack of a plurality of conductive layers formed using the above materials may be used. For example, a layered structure using a combination of a material containing any of the above metal elements and a conductive material containing oxygen may be used. Alternatively, a layered structure using a combination of a material containing any of the above metal elements and a conductive material containing nitrogen may be used. Alternatively, a layered structure using a combination of a material containing any of the above metal elements, a conductive material containing oxygen, and a conductive material containing nitrogen may be used.

When oxide is used for the channel formation region of the transistor, a stacked-layer structure formed using a material containing any of the above metal elements and a conductive material containing oxygen is preferably used for the conductor functioning as the gate electrode. In this case, the conductive material containing oxygen is preferably formed on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. A conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which a channel is formed can be captured in some cases. Alternatively, hydrogen entering from an external insulator or the like can be captured in some cases.

The conductors 260, 203, 205, and 240 can be each formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electric conductivity, typified by polycrystalline silicon including an impurity element such as phosphorus, or silicide such as nickel silicide may be used.

<<Metal Oxide>>

The oxide 230 is preferably formed using a metal oxide functioning as an oxide semiconductor. A metal oxide that can be used for the oxide 230 of one embodiment of the present invention will be described below.

The metal oxide preferably contains at least indium or zinc, and particularly preferably contains both indium and zinc. In addition, the metal oxide preferably contains aluminum, gallium, yttrium, tin, or the like. Furthermore, one or more elements selected from boron, titanium, iron, nickel, germanium, zirconium, molybdenum, lanthanum, cerium, neodymium, hafnium, tantalum, tungsten, magnesium, or the like may be contained.

Here, the case where the metal oxide is an In-M-Zn oxide containing indium, an element M, and zinc is considered. The element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as metal oxide in some cases. Moreover, a metal oxide containing nitrogen may be referred to as metal oxynitride.

[Composition of Metal Oxide]

Described below is the composition of a cloud-aligned composite oxide semiconductor (CAC-OS) that can be used in a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) functioning as carriers to flow, and the insulating function is to not allow electrons functioning as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be referred to as matrix composite or a metal matrix composite.

[Structure of Metal Oxide]

An oxide semiconductor (metal oxide) is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected.

The shape of the nanocrystal is basically hexagon but is not always a regular hexagon and is a non-regular hexagon in some cases. A pentagonal lattice arrangement, a heptagonal lattice arrangement, and the like are sometimes included in the distortion. Note that it is difficult to observe a clear crystal grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as (In, M, Zn) layer. When indium of the In layer is replaced by the element M, the layer can also be referred to as (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the metal oxide is used for a channel formation region of a transistor will be described.

When the metal oxide is used for a channel formation region of a transistor, the transistor can have high field-effect mobility. In addition, the transistor can have high reliability.

Moreover, a metal oxide with low carrier density is preferably used for the transistor. In order to reduce the carrier density of the metal oxide film, the concentration of impurities in the metal oxide film is reduced so that the density of defect states can be reduced. In this specification and the like, a state with a low impurity concentration and a low density of defect states is referred to as highly purified intrinsic or substantially highly purified intrinsic state. The metal oxide has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

A highly purified intrinsic or substantially highly purified intrinsic metal oxide film has a low density of defect states and accordingly has a low density of trap states in some cases.

Charges trapped by the trap states in the metal oxide take a long time to be released and may behave like fixed charges. Thus, a transistor that contains the metal oxide having a high density of trap states in the channel formation region has unstable electrical characteristics in some cases.

In order to obtain stable electrical characteristics of the transistor, reducing the concentration of impurities in the metal oxide is effective. In addition, in order to reduce the concentration of impurities in the metal oxide, the concentration of impurities in a film that is adjacent to the metal oxide is preferably reduced. As examples of the impurities, hydrogen, nitrogen, alkali metal, alkaline earth metal, iron, nickel, silicon, and the like are given.

[Impurity]

Here, the influence of impurities in the metal oxide is described.

When silicon or carbon that is one of Group 14 elements is contained in the metal oxide, defect states are formed in the metal oxide. Thus, the concentration of silicon or carbon (measured by secondary ion mass spectrometry (SIMS)) is set to be lower than or equal to $2\times10^{18}$ atoms/$cm^3$, preferably lower than or equal to $2\times10^{17}$ atoms/cm3 in the metal oxide or the vicinity of an interface with the metal oxide.

When the metal oxide contains an alkali metal or an alkaline earth metal, defect states are formed and carriers are generated, in some cases. Thus, a transistor including a metal oxide that contains an alkali metal or an alkaline earth metal in a channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide, which is measured by SIMS, is lower than or equal to $1\times10^{18}$ atoms/cm3, preferably lower than or equal to $2\times10^{16}$ atoms/cm3.

When the metal oxide contains nitrogen, the metal oxide easily becomes n-type by generation of electrons functioning as carriers and an increase of carrier density. Thus, a transistor whose channel formation region includes a metal oxide containing nitrogen is likely to have normally-on characteristics. For that reason, nitrogen in the channel formation region of the metal oxide is preferably reduced as much as possible; for example, the concentration of nitrogen in the metal oxide measured by SIMS is set to lower than $5\times10^{19}$ atoms/cm3, preferably lower than or equal to $5\times10^{18}$ atoms/cm3, further preferably lower than or equal to $1\times10^{18}$ atoms/cm3, and still further preferably lower than or equal to $5\times10^{17}$ atoms/cm3.

Hydrogen contained in a metal oxide reacts with oxygen bonded to a metal atom to be water, and thus causes an oxygen vacancy, in some cases. Entry of hydrogen into the oxygen vacancy generates an electron functioning as a carrier in some cases. Furthermore, in some cases, bonding of part of hydrogen to oxygen bonded to a metal atom causes generation of an electron functioning as a carrier. Thus, a transistor including a metal oxide that contains hydrogen for a channel formation region is likely to have normally-on characteristics. For this reason, hydrogen in the metal oxide is preferably reduced as much as possible. Specifically, the hydrogen concentration of the metal oxide measured by SIMS is lower than $1\times10^{20}$ atoms/cm3, preferably lower than $1\times10^{19}$ atoms/cm3, further preferably lower than $5\times10^{18}$ atoms/cm3, and still further preferably lower than $1\times10^{18}$ atoms/cm3.

When a metal oxide with sufficiently reduced impurity concentration is used for a channel formation region in a transistor, the transistor can have stable electrical characteristics.

According to one embodiment of the present invention, a semiconductor device having favorable electrical characteristics can be provided. Alternatively, according to one embodiment of the present invention, a semiconductor device with low off-state current can be provided. Alternatively, according to one embodiment of the present invention, a semiconductor device with high on-state current can be provided. Alternatively, according to one embodiment of the present invention, a semiconductor device with high reliability can be provided. Alternatively, according to one embodiment of the present invention, a semiconductor device that can be miniaturized or highly integrated can be provided. Alternatively, according to one embodiment of the present invention, a semiconductor device with low power consumption can be provided. Alternatively, according to one embodiment of the present invention, a semiconductor device with high productivity can be provided.

Note that at least part of the composition, structure, method, and the like described in this embodiment can be implemented in combination with any of those in the other embodiments described in this specification as appropriate.

Embodiment 3

In this embodiment, examples of an electronic component and an electronic device including the semiconductor device 10 of one embodiment of the present invention will be described.

<Electronic Component>

Examples of an electronic component including the semiconductor device 10 will be described with reference to FIGS. 25A and 25B.

Figure 25A:
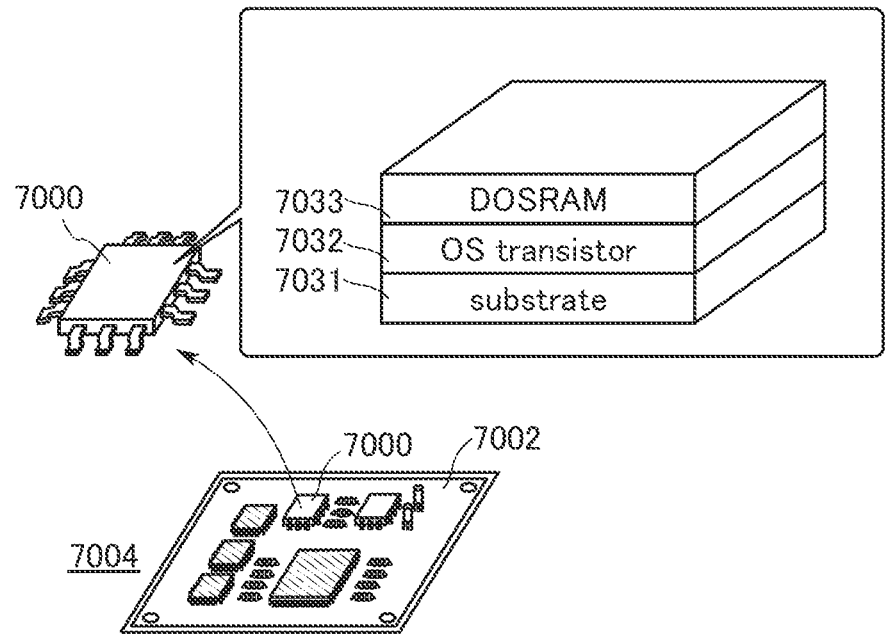
FIGS. 25A and 25B are schematic views each illustrating an example of an electronic component.

An electronic component 7000 illustrated in FIG. 25A is an IC chip including a lead and a circuit portion. The electronic component 7000 is mounted on a printed circuit board 7002, for example. A plurality of such IC chips are combined and electrically connected to each other on the printed circuit board 7002; thus, a circuit board on which electronic components are mounted (a circuit board 7004) is formed.

The circuit portion of the electronic component 7000 has a stacked-layer structure of, for example, a substrate 7031, a layer 7032, and a layer 7033.

In the case where a semiconductor substrate such as silicon is used as the substrate 7031, an integrated circuit such as a central processing unit (CPU) may be formed on the substrate 7031 and the layer 7032 including an OS transistor may be formed thereover.

The layer 7032 includes the OS transistor described in the above embodiments. For example, the sense amplifier circuit 60, the driver circuit 80, the main amplifier 81, and the input/output circuit 82 may be included in the layer 7032.

The layer 7033 includes a plurality of memory cells MC. As the memory cell MC, for example, a memory cell using an OS transistor such as DOSRAM (registered trademark), hereinafter referred to as OS memory, can be used.

An OS memory can be stacked over other semiconductor elements, and thus the electronic component 7000 can be reduced in size. In addition, the OS transistor has an extremely low leakage current in an off state (off-state current), and thus enables a memory to have low power consumption and long intervals between refresh operations. Therefore, the power consumption of the electronic component 7000 can be reduced.

The OS memory can be provided not in the layer 7033 but in the layer 7032. In that case, the manufacturing process of the IC chip can be shortened.

Besides the OS memory, the layer 7033 can be provided with other memories such as a resistive random access memory (ReRAM), a magnetoresistive random access memory (MRAM), a phase change RAM (PRAM), or a ferroelectric RAM (FeRAM).

Although a Quad Flat Package (QFP) is used as the package of the electronic component 7000 in FIG. 25A, the mode of the package is not limited thereto.

Figure 25B:
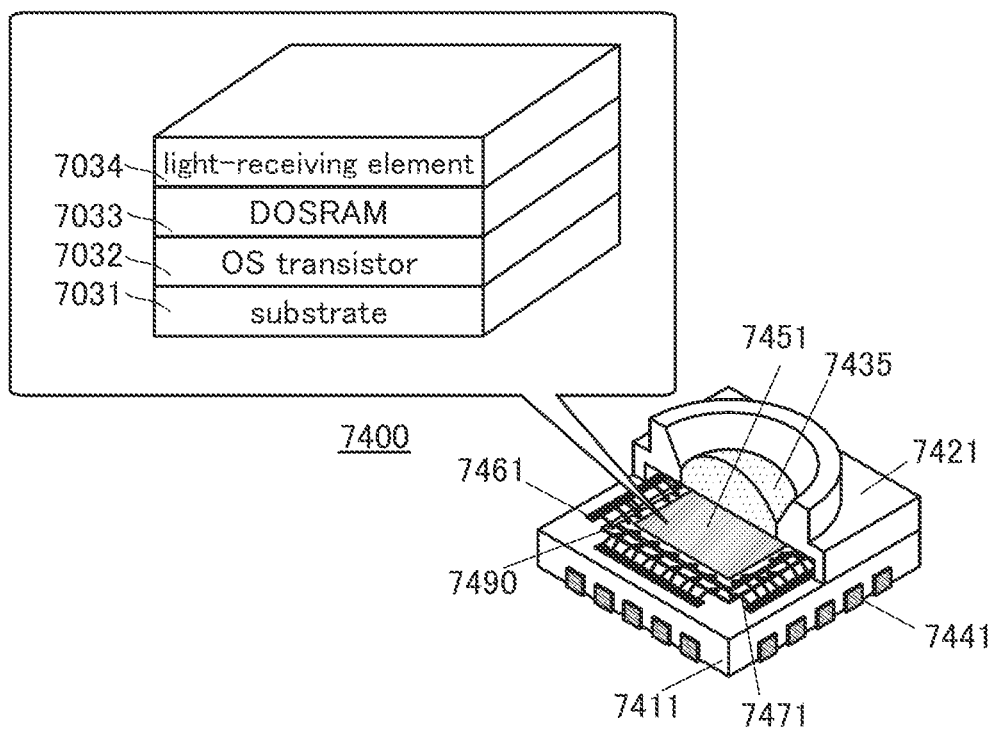

An electronic component 7400 illustrated in FIG. 25B is a camera module including an image sensor chip 7451.

The electronic component 7400 includes a package substrate 7411 to which the image sensor chip 7451 is fixed, a lens cover 7421, a lens 7435, and the like. Furthermore, an IC chip 7490 having functions of a driver circuit, a signal conversion circuit, and the like of an imaging device is provided between the package substrate 7411 and the image sensor chip 7451. Thus, a system in package (SiP) is formed.

Lands 7441 are electrically connected to electrode pads 7461. The electrode pads 7461 are electrically connected to the image sensor chip 7451 or an IC chip 7490 through wires 7471. Note that parts of the lens cover 7421 and the lens 7435 are not illustrated in FIG. 25B to illustrate the inside of the electronic component 7400.

The circuit portion of the image sensor chip 7451 has a stacked-layer structure of, for example, the substrate 7031, the layer 7032, the layer 7033, and a layer 7034.

For the details of the substrate 7031, the layer 7032, and the layer 7033, the description of the electronic component 7000 is referred to.

The layer 7034 includes a light-receiving element. As the light-receiving element, for example, a pn-junction photodiode including a selenium-based material in a photoelectric conversion layer can be used. A photoelectric conversion element including a selenium-based material has high external quantum efficiency for visible light, and thus can achieve a highly sensitive optical sensor.

A selenium-based material can be used as a p-type semiconductor. As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor in the pn-junction photodiode is preferably formed using a material with a wide band gap and a light-transmitting property with respect to visible light. For example, zinc oxide, gallium oxide, indium oxide, tin oxide, or mixed oxide thereof can be used.

As the light-receiving element in the layer 7034, a pn-junction photodiode including a p-type silicon semiconductor and an n-type silicon semiconductor may be used. Alternatively, a pin-junction photodiode in which an i-type silicon semiconductor layer is provided between a p-type silicon semiconductor and an n-type silicon semiconductor may be used.

The photodiode using any of the above silicon can be formed using single-crystal silicon. In that case, the layer 7033 is preferably electrically connected to the layer 7034 through a bonding step. The photodiode using any of the above silicon can be formed using a thin film of amorphous silicon, microcrystalline silicon, and polycrystalline silicon.

<Electronic Device>

Next, examples of an electronic device including the above electronic components will be described with reference to FIGS. 26A and 26B and FIG. 27.

Figure 26A:
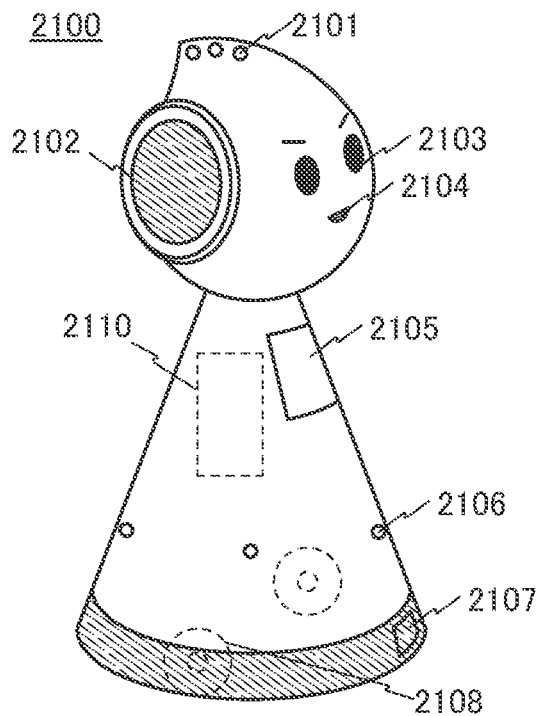
FIGS. 26A and 26B are schematic views each illustrating an example of an electronic device.

A robot 2100 illustrated in FIG. 26A includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The above electronic components can be used for the arithmetic device 2110, the illuminance sensor 2101, the upper camera 2103, the display 2105, the lower camera 2106, the obstacle sensor 2107, and the like of the robot 2100.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

Figure 26B:
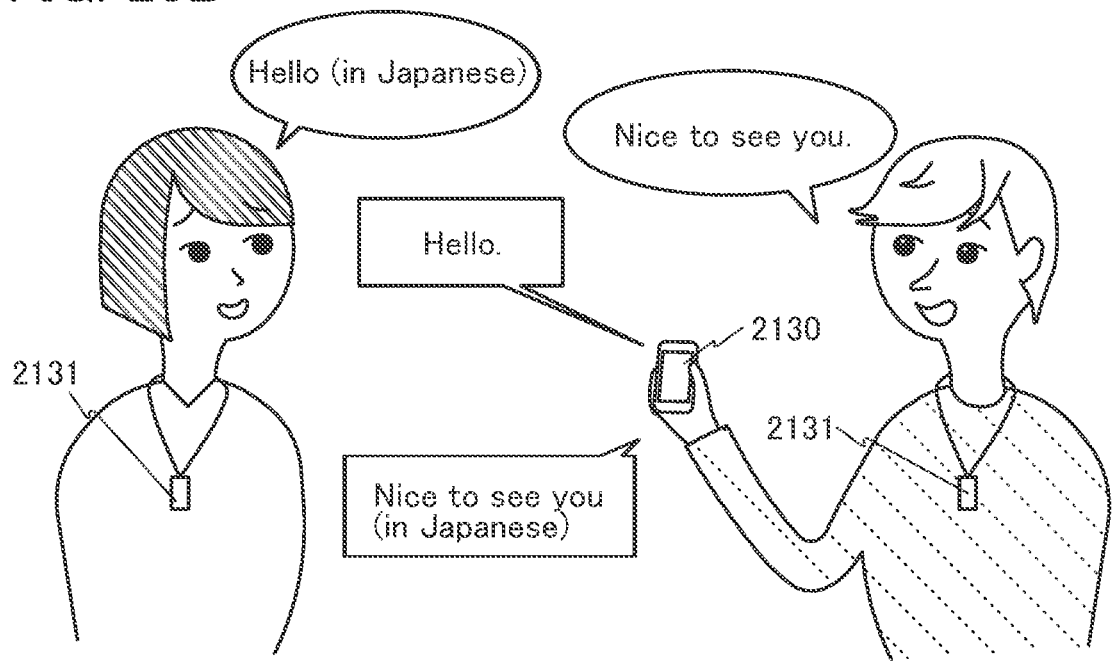

FIG. 26B illustrates a situation where a portable information terminal 2130 performs simultaneous interpretation in communication between people who speak different languages.

The portable information terminal 2130 includes a microphone, a speaker, and the like and has a function of recognizing user's speaking voice and translating it into a language spoken by the conversation partner. The above electronic components can be used for an arithmetic device of the portable information terminal 2130.

The user has a portable microphone 2131 in FIG. 26B. The portable microphone 2131 has a radio communication function and a function of transmitting a detected voice to the portable information terminal 2130.

Figure 27:
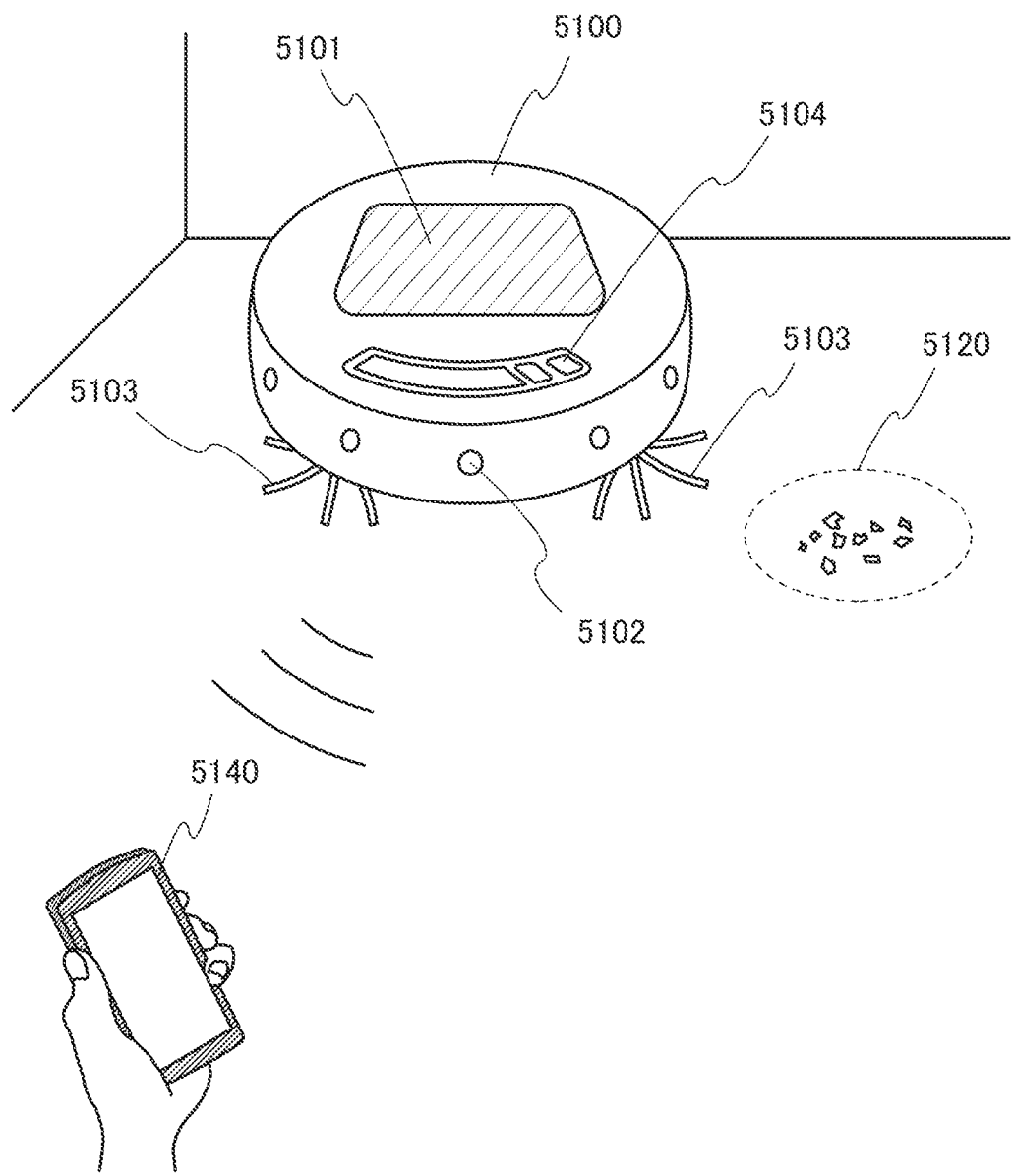
FIG. 27 is a schematic view illustrating an example of an electronic device.

FIG. 27 is a schematic view illustrating an example of a cleaning robot.

A cleaning robot 5100 includes a display 5101 on its top surface, a plurality of cameras 5102 on its side surface, a brush 5103, operation buttons 5104, and the like. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a radio communication means.

The above electronic components can be used for the cameras 5102.

The cleaning robot 5100 is self-propelled, detects dust 5120, and vacuums the dust from the inlet provided on the bottom surface.

The cleaning robot 5100 can judge whether or not there is an obstacle such as a wall, furniture, or a step by analyzing an image taken by the cameras 5102. In the case where the cleaning robot 5100 detects an object that is likely to be caught in the brush 5103, such as a wiring, by analyzing an image, the rotation of the brush 5103 can be stopped.

The display 5101 can display the remaining capacity of a battery, the amount of vacuumed dust, and the like. The display 5101 may display a path in which the cleaning robot 5100 has run. The display 5101 may include a touch panel and the operation buttons 5104 may be displayed on the display 5101.

The cleaning robot 5100 can communicate with a portable information terminal 5140 such as a smartphone. The portable information terminal 5140 can display an image taken by the cameras 5102. Therefore, an owner of the cleaning robot 5100 can monitor his/her room even when the owner is not at home.

This embodiment can be implemented in combination with any of the other embodiments described in this specification as appropriate.

REFERENCE NUMERALS

ASW1: analog switch, ASW4: analog switch, BL_1: wiring, BL_2: wiring, C0: capacitor, C11: capacitor, C12: capacitor, $E_0$: potential, $E_1$: potential, $E_2$: potential, $E_2-E_0$: potential difference, $E_2-E_1$: potential difference, GBL_1: wiring, GBL_2: wiring, IN1: input terminal, IN2: input terminal, OUT1: output terminal, OUT2: output terminal, MC_1: memory cell, MC_2: memory cell, N11: node, N12: node, OS1: transistor, OS2: transistor, PL1: wiring, PL2: wiring, PL3: wiring, R11: resistor, R12: resistor, SA1: sense amplifier, SA2: sense amplifier, SW1: switch, SW4: switch, T1: period, T2: period, T3: period, T4: period, Vbl1: potential, Vbl2: potential, Vn11: potential, Vn12: potential, WL_1: wiring, WL_2: wiring, 10: semiconductor device, 21: transistor, 22: transistor, 23: transistor, 24: transistor, 25: transistor, 26: transistor, 27: transistor, 28: transistor, 29: transistor, 31: transistor, 32: transistor, 33: transistor, 34: transistor, 35: transistor, 38: transistor, 41: transistor, 42: transistor, 43: transistor, 44: transistor, 45: transistor, 46: transistor, 60: sense amplifier circuit, 62: amplifier circuit, 63: switch circuit, 64: precharge circuit, 65: amplifier circuit, 66: amplifier circuit, 70: cell array, 80: driver circuit, 81: main amplifier, 82: input/output circuit, 100: capacitor, 110: conductor, 120: conductor, 130: insulator, 200: transistor, 203: conductor, 205: conductor, 210: insulator, 212: insulator, 214: insulator, 216: insulator, 220: insulator, 222: insulator, 224: insulator, 230: oxide, 230a: oxide, 230b: oxide, 230c: oxide, 231: region, 231a: region, 231b: region, 232: region, 232a: region, 232b: region, 234: region, 239: region, 240: conductor, 240a: conductor, 240b: conductor, 242: layer, 250: insulator, 252: metal oxide, 260: conductor, 260a: conductor, 260b: conductor, 270: insulator, 271: insulator, 273: insulator, 274: insulator, 275: insulator, 280: insulator, 500: transistor, 503: conductor, 505: conductor, 524: insulator, 530: oxide, 530a: oxide, 530b: oxide, 530c: oxide, 540: conductor, 540a: conductor, 540b: conductor, 542: layer, 550: insulator, 552: metal oxide, 560: conductor, 560a: conductor, 560b: conductor, 570: insulator, 571: insulator, 575: insulator, 600: semiconductor device, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 2130: portable information terminal, 2131: portable microphone, 5100: cleaning robot, 5101: display, 5102: camera, 5103: brush, 5104: operation button, 5120: dust, 5140: portable information terminal, 7000: electronic component, 7002: printed circuit board, 7004: circuit board, 7031: substrate, 7032: layer, 7033: layer, 7034: layer, 7400: electronic component, 7411: package substrate, 7421: lens cover, 7435: lens, 7441: land, 7451: image sensor chip, 7461: electrode pad, 7471: wire, and 7490: IC chip.

This application is based on Japanese Patent Application Serial No. 2017-161320 filed with Japan Patent Office on Aug. 24, 2017, the entire contents of which are hereby incorporated by reference.

The invention claimed is:

1. A semiconductor device comprising:
a sense amplifier comprising a first circuit and a second circuit, and
a memory cell,
wherein the sense amplifier is positioned in a first layer,
wherein the memory cell is positioned in a second layer over the first layer,
wherein the semiconductor device is electrically connected to a first control line and a second control line,
wherein the first circuit comprises a first transistor, a second transistor, and a first inverter,
wherein the second circuit comprises a third transistor, a fourth transistor, and a second inverter,
wherein the first transistor is configured to switch conduction and non-conduction between an input terminal and an output terminal of the first inverter,
wherein the second transistor is configured to switch conduction and non-conduction between the output terminal of the first inverter and a second wiring,
wherein a gate of the first transistor is electrically connected to the first control line,
wherein a gate of the second transistor is electrically connected to the second control line,
wherein the third transistor is configured to switch conduction and non-conduction between an input terminal and an output terminal of the second inverter,
wherein the fourth transistor is configured to switch conduction and non-conduction between an output terminal of the second inverter and a first wiring,
wherein a gate of the third transistor is electrically connected to the first control line,
wherein a gate of the fourth transistor is electrically connected to the second control line, and
wherein the first transistor comprises a metal oxide in a channel formation region.

2. The semiconductor device according to claim 1,
wherein the semiconductor device is configured to perform an initializing operation, and
wherein the initializing operation comprises establishing conduction between the input terminal and the output terminal of the first inverter using the first transistor.

3. A semiconductor device comprising:
a sense amplifier comprising a first circuit and a second circuit, and
a memory cell,
wherein the sense amplifier is positioned in a first layer,
wherein the memory cell is positioned in a second layer over the first layer,
wherein the semiconductor device is electrically connected to a first control line and a second control line,
wherein the first circuit comprises a first transistor, a second transistor, and a first inverter,
wherein the second circuit comprises a third transistor, a fourth transistor, and a second inverter,
wherein the first transistor is configured to switch conduction and non-conduction between an input terminal and an output terminal of the first inverter,
wherein the second transistor is configured to switch conduction and non-conduction between the output terminal of the first inverter and an output portion,
wherein a gate of the first transistor is electrically connected to the first control line,
wherein a gate of the second transistor is electrically connected to the second control line
wherein the third transistor is configured to switch conduction and non-conduction between an input terminal and an output terminal of the second inverter,
wherein the fourth transistor is configured to switch conduction and non-conduction between an output terminal of the second inverter and an input portion,
wherein a gate of the third transistor is electrically connected to the first control line,
wherein a gate of the fourth transistor is electrically connected to the second control line, and
wherein the first transistor comprises a metal oxide in a channel formation region.

4. The semiconductor device according to claim 3,
wherein the semiconductor device is configured to perform an initializing operation, and
wherein the initializing operation comprises establishing conduction between the input terminal and the output terminal of the first inverter using the first transistor.

5. A semiconductor device comprising:
an amplifier circuit comprising a sense amplifier;
a precharge circuit; and
a memory cell, wherein the sense amplifier is positioned in a first layer,
wherein the memory cell is positioned in a second layer over the first layer,
wherein the sense amplifier is electrically connected to a first wiring and a second wiring,
wherein the precharge circuit is configured to set potentials of the first wiring and the second wiring to a first potential,
wherein the amplifier circuit comprises a first circuit and a second circuit,
wherein the first circuit comprises a first inverter, a first transistor, and a second transistor,
wherein the second circuit comprises a second inverter, a third transistor, and a fourth transistor,
wherein an input terminal of the first inverter is electrically connected to the first wiring,
wherein the first transistor is configured to switch conduction and non-conduction between the input terminal and an output terminal of the first inverter,
wherein the second transistor is configured to switch conduction and non-conduction between the output terminal of the first inverter and the second wiring,
wherein an input terminal of the second inverter is electrically connected to the second wiring,
wherein the third transistor is configured to switch conduction and non-conduction between the input terminal and an output terminal of the second inverter,
wherein the fourth transistor is configured to switch conduction and non-conduction between the output terminal of the second inverter and the first wiring, and
wherein the first transistor comprises a metal oxide in a channel formation region.

6. The sense amplifier according to claim 5,
wherein the sense amplifier is configured to perform an initializing operation comprising first to fourth operations,
wherein the first operation is establishing conduction between the input terminal and the output terminal of the first inverter using the first transistor,
wherein the second operation is establishing conduction between the input terminal and the output terminal of the second inverter using the third transistor,
wherein the third operation is establishing conduction between the input terminal and the output terminal of the first inverter using the second transistor, and
wherein the fourth operation is establishing conduction between the input terminal and the output terminal of the second inverter using the fourth transistor.

7. The sense amplifier according to claim 5,
wherein the sense amplifier is configured to perform an initializing operation, and
wherein the initializing operation comprises establishing conduction between the input terminal and the output terminal of the first inverter using the first transistor and establishing conduction between the input terminal and the output terminal of the second inverter using the third transistor.

* * * * *